(12) United States Patent
Lee et al.

(10) Patent No.: US 12,176,328 B2
(45) Date of Patent: Dec. 24, 2024

(54) SEMICONDUCTOR PACKAGE AND STACKED PACKAGE MODULE INCLUDING THE SAME

(71) Applicant: Samsung Electronics Co., Ltd., Suwon-si (KR)

(72) Inventors: Daeho Lee, Hwaseong-si (KR); Kilsoo Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 18/447,535

(22) Filed: Aug. 10, 2023

(65) Prior Publication Data

US 2023/0387090 A1 Nov. 30, 2023

Related U.S. Application Data

(63) Continuation of application No. 17/160,878, filed on Jan. 28, 2021, now Pat. No. 11,769,762.

(30) Foreign Application Priority Data

Jun. 26, 2020 (KR) .................. 10-2020-0078801

(51) Int. Cl.
*H01L 25/10* (2006.01)
*H01L 23/538* (2006.01)
(52) U.S. Cl.
CPC ........ *H01L 25/105* (2013.01); *H01L 23/5383* (2013.01); *H01L 23/5386* (2013.01); *H01L 23/5389* (2013.01); *H01L 2225/1047* (2013.01)

(58) Field of Classification Search
CPC .............. H01L 25/105; H01L 23/5383; H01L 23/5386; H01L 23/5389; H01L 2225/1047;

(Continued)

(56) References Cited

U.S. PATENT DOCUMENTS 7,807,512 B2 10/2010 Lee et al.
9,343,434 B2 5/2016 Chen
(Continued)

FOREIGN PATENT DOCUMENTS

KR 20120036407 A 4/2012
KR 101362715 B1 2/2014
(Continued)

*Primary Examiner* — Kyoung Lee
*Assistant Examiner* — Christina A Sylvia
(74) *Attorney, Agent, or Firm* — Harness, Dickey & Pierce, P.L.C.

(57) ABSTRACT

A semiconductor package includes a lower redistribution layer having a plurality of lower ball pads forming a plurality of lower ball pad groups, a semiconductor chip on the lower redistribution layer, an expanded layer surrounding the semiconductor chip on the lower redistribution layer, and an upper redistribution layer on the semiconductor chip and the expanded layer and having a plurality of upper ball pads forming a plurality of upper ball pad groups. The number of the plurality of upper ball pad groups may be the same as the number of the of the plurality lower ball pad groups. Each of the upper ball pads in one of the plurality of upper ball pad groups, from among the plurality of upper ball pads, may be a dummy ball pad.

20 Claims, 38 Drawing Sheets

(58) Field of Classification Search
CPC ......... H01L 24/16; H01L 24/32; H01L 24/73;
H01L 24/92; H01L 2224/04105; H01L
2224/12105; H01L 24/20; H01L
2224/16225; H01L 2224/32225; H01L
2224/73204; H01L 2224/92125; H01L
2224/97; H01L 2225/1023; H01L
2225/1035; H01L 2225/1041; H01L
24/10; H01L 2924/15331; H01L
2924/181; H01L 23/49816; H01L 25/071;
H01L 25/50; H01L 23/481; H01L
23/49838; H01L 23/495; H01L 23/49811;
H01L 23/525
See application file for complete search history.

(56) References Cited

U.S. PATENT DOCUMENTS

| | | | |
|---|---|---|---|
| 10,050,004 B2 | 8/2018 | Scanlan et al. | |
| 10,707,181 B2 | 7/2020 | Kim et al. | |
| 10,985,138 B2 | 4/2021 | Kang et al. | |
| 2015/0282367 A1 | 10/2015 | Barth et al. | |
| 2016/0093572 A1* | 3/2016 | Chen | H01L 23/5389 |
| | | | 438/126 |
| 2017/0148755 A1 | 5/2017 | Scanlan et al. | |
| 2018/0102313 A1* | 4/2018 | Shih | H01L 25/0655 |
| 2018/0261557 A1* | 9/2018 | Yu | H01L 23/562 |
| 2019/0295944 A1 | 9/2019 | Kwon et al. | |
| 2019/0333899 A1 | 10/2019 | Eom et al. | |
| 2021/0305223 A1 | 9/2021 | Shih | |
| 2021/0407924 A1 | 12/2021 | Lee et al. | |
| 2022/0068784 A1 | 3/2022 | Kang et al. | |

FOREIGN PATENT DOCUMENTS

| | | |
|---|---|---|
| KR | 10-1538573 B1 | 7/2015 |
| KR | 10-2016-0053883 A | 5/2016 |
| KR | 101870164 B1 | 7/2018 |
| KR | 10-2018-0133989 A | 12/2018 |

* cited by examiner

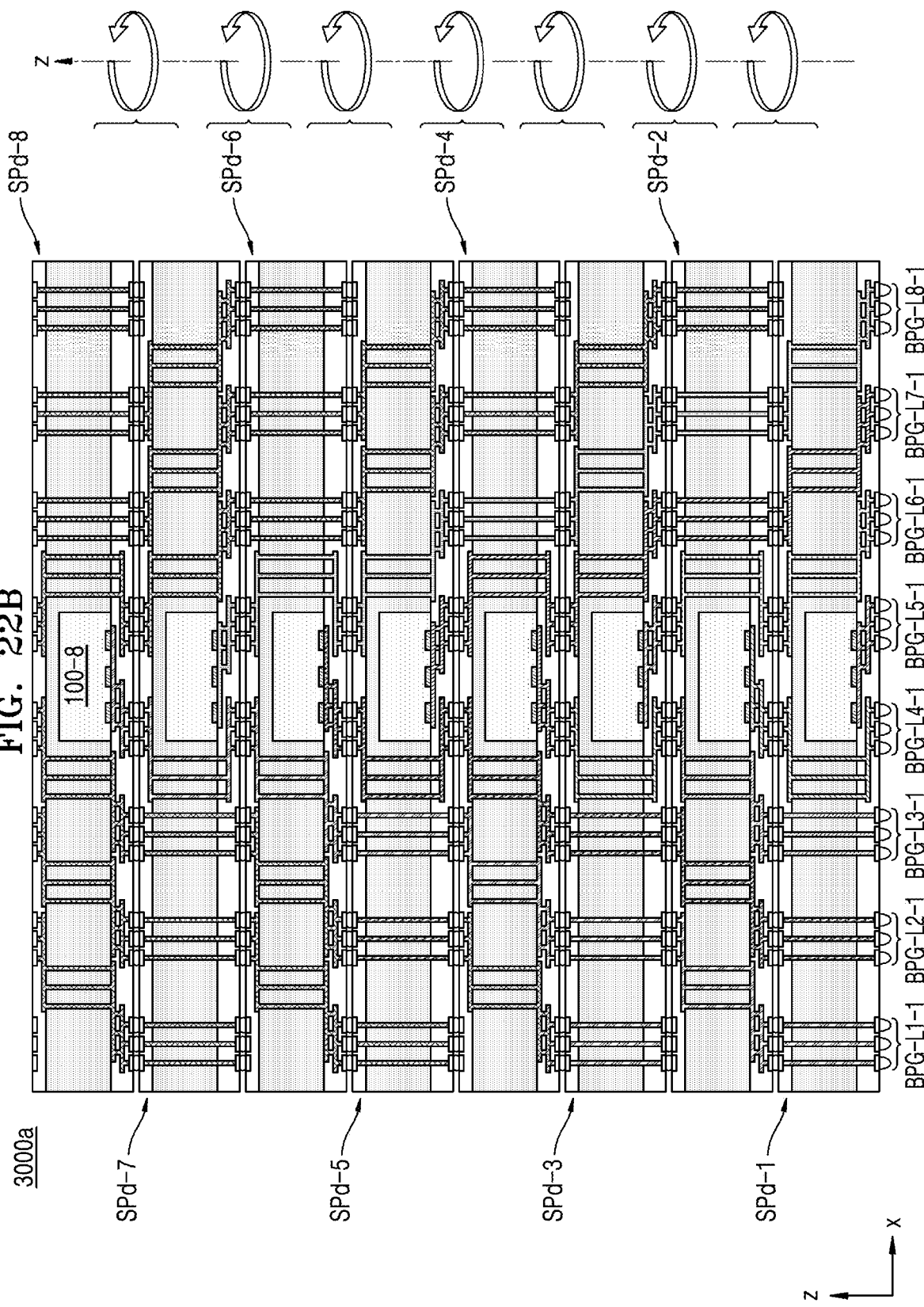

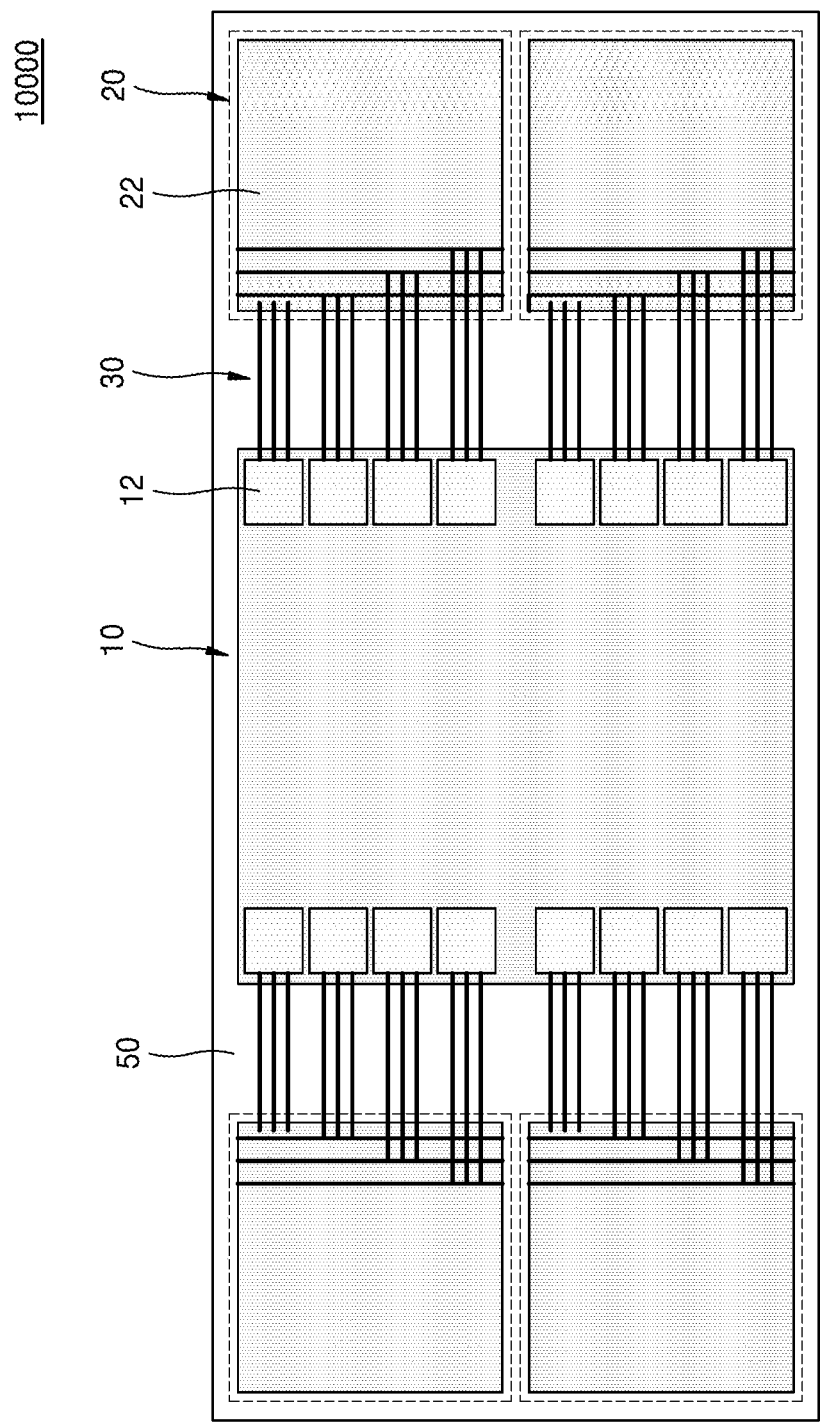

SEMICONDUCTOR PACKAGE AND STACKED PACKAGE MODULE INCLUDING THE SAME

CROSS-REFERENCE TO RELATED APPLICATION

This application is a continuation of U.S. application Ser. No. 17/160,878, filed on Jan. 28, 2021, which is based on and claims priority under 35 U.S.C. § 119 to Korean Patent Application No. 10-2020-0078801, filed on Jun. 26, 2020, in the Korean Intellectual Property Office, the disclosures of each of which are incorporated by reference herein in their entirety.

BACKGROUND

Inventive concepts relate to a semiconductor package and/or a stacked package module having the same, and more particularly, to a semiconductor package and/or a stacked package module in which a plurality of semiconductor packages are stacked.

According to the development of the electronic industry and user demand, electronic devices have become smaller and more multifunctional.

As a result, a semiconductor package with an increased number of input/output (I/O) connection terminals (I/O terminals) has been designed, and for example, a fan-out semiconductor package has been developed to limit and/or prevent interference between connection terminals.

SUMMARY

Inventive concepts provide a semiconductor package suitable for miniaturization, multifunctionality, and/or large capacity increase of electronic devices, and/or a stacked package module having the same.

Inventive concepts provide a semiconductor package and/or a stacked package module having the same as follows.

According to an embodiment, semiconductor package may include a lower redistribution layer, a semiconductor chip on the lower redistribution layer, an expanded layer surrounding the semiconductor chip on the lower redistribution layer, and an upper redistribution layer on the semiconductor chip and the expanded layer, a chip-lower portion electrical connection path, and an upper portion-lower portion electrical connection path. The lower redistribution layer may include a plurality of lower ball pads forming N lower ball pad groups. N may be an integer greater than or equal to two. The upper redistribution layer may include a plurality of upper ball pads forming M upper ball pad groups and M may be an integer equal to N. The M upper ball pad groups may include a dummy upper ball pad group and remaining upper ball pad groups. The dummy ball pad group may be defined by each of the plurality of upper ball pads in one of the M upper ball pad groups. The chip-lower portion electrical connection path may electrically connect one of the N lower ball pad groups to the semiconductor chip. The upper portion-lower portion electrical connection path may connect remaining lower ball pad groups to the remaining upper ball pad groups. The N lower ball pad groups may include the one of the N lower ball pad groups and the remaining lower ball pad groups.

According to another embodiment, a stacked package module may include a plurality of semiconductor packages including a first semiconductor package and a second semiconductor package stacked on the first semiconductor package. Each of the plurality of semiconductor packages may include a lower redistribution layer, a semiconductor chip on the lower redistribution layer, an expanded layer surrounding the semiconductor chip on the lower redistribution layer, an upper redistribution layer on the semiconductor chip and the expanded layer, and a first upper portion-lower portion electrical connection path. The lower redistribution layer may include a plurality of lower ball pads forming a plurality of lower ball pad groups. The plurality of lower ball pad groups may include a first lower ball pad group and a second lower ball pad group. The upper redistribution layer may include a plurality of upper ball pads forming a plurality of upper ball pad groups. The plurality of upper ball pad groups may include a first upper ball pad group and a second upper ball pad group. The first lower ball pad group and the first upper ball pad group may be electrically connected through the first upper portion-lower portion electrical connection path. Each of the upper ball pads in the second upper ball pad group, from among the plurality of upper ball pads, may be a dummy ball pad.

According to another embodiment, a stacked package module may include a first semiconductor package, a second semiconductor package, a third semiconductor package, and a fourth semiconductor package, which are stacked sequentially. Each of the first semiconductor package, the second semiconductor package, the third semiconductor package, and the fourth semiconductor package may include a lower redistribution layer, a semiconductor chip on the lower redistribution layer, an expanded layer surrounding the semiconductor chip on the lower redistribution layer, an upper redistribution layer on the semiconductor chip and the expanded layer, a first upper portion-lower portion electrical connection path, a second upper portion-lower portion electrical connection path, a chip-lower portion electrical connection path, and a third upper portion-lower portion electrical connection path. The lower redistribution layer may include a plurality lower ball pads forming a plurality of lower ball pad groups. The plurality of lower ball pad groups may include a first lower ball pad group, a second lower ball pad group, a third lower ball pad group, and a fourth lower ball pad group. The upper redistribution layer may include a plurality of upper ball pads forming a plurality of upper ball pad groups. The plurality of upper ball pad groups may include a first upper ball pad group, a second upper ball pad group, a third upper ball pad group, and a fourth upper ball pad group. The first lower ball pad group and the first upper ball pad group may be electrically connected through the first upper portion-lower portion electrical connection path. The second lower ball pad group and the second upper ball pad group may be electrically connected through the second upper portion-lower portion electrical connection path. The third lower ball pad group and the semiconductor chip may be electrically connected through the chip-lower portion electrical connection path. The fourth lower ball pad group and the third upper ball pad group may be electrically connected through the third upper portion-lower portion electrical connection path. Each of the upper ball pads forming the fourth upper ball pad group, from among the plurality of upper ball pads, may be a dummy ball pad.

BRIEF DESCRIPTION OF THE DRAWINGS

Embodiments of inventive concepts will be more clearly understood from the following detailed description taken in conjunction with the accompanying drawings in which:

FIGS. 22A and 22B are cross-sectional views each illustrating a method of manufacturing a stacked package module having a semiconductor package and an electrical connection path in the stacked package module, according to an embodiment;

FIG. 31 is a plane layout diagram illustrating a system having a stacked package module according to an embodiment.

DETAILED DESCRIPTION

Figure 1:
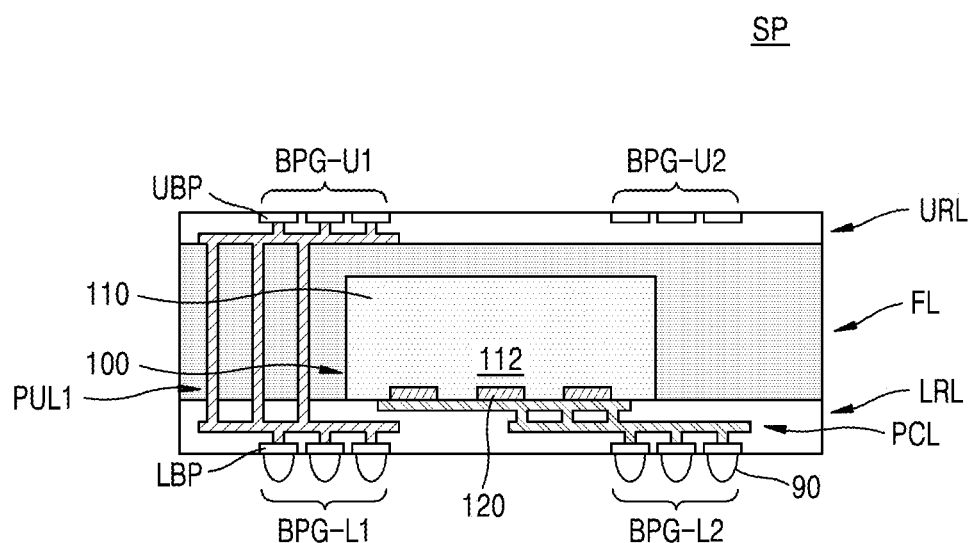
FIG. 1 is a cross-sectional view illustrating an electrical connection path in a semiconductor package according to an embodiment.
Figure 2A:
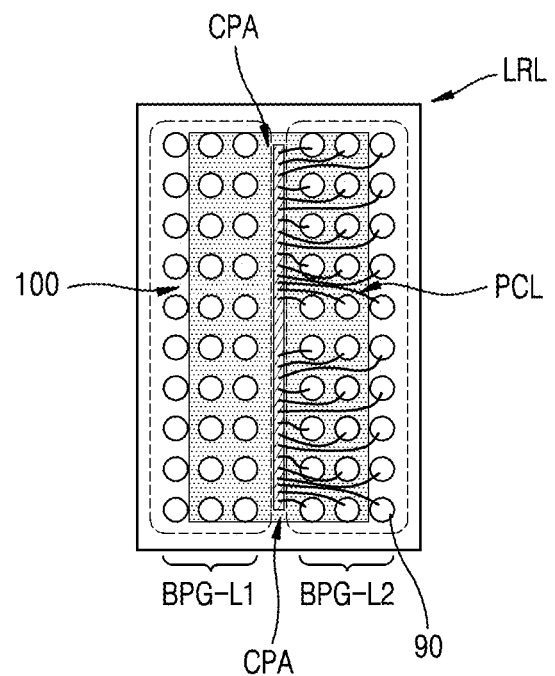
FIGS. 2A and 2B are plane views each illustrating an electrical connection path between a semiconductor chip (sub-semiconductor chips) and a lower redistribution layer of a semiconductor package according to embodiments.
Figure 2B:
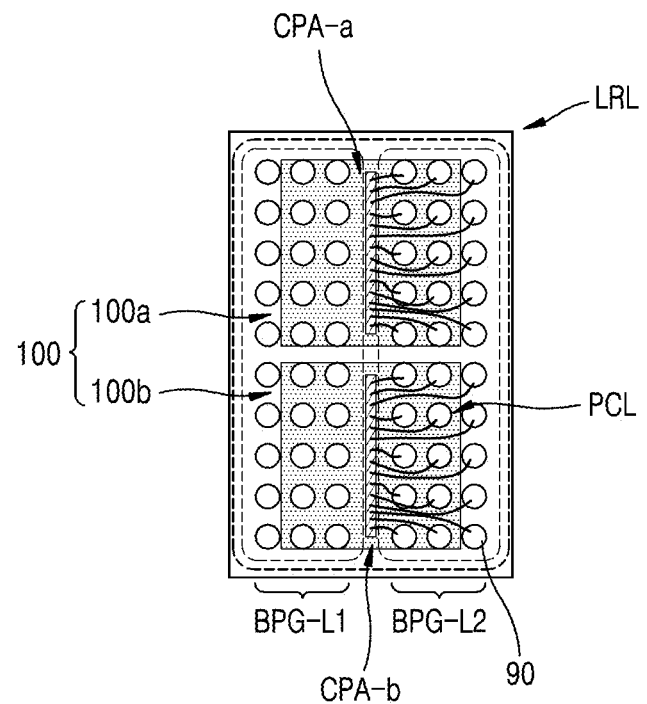
Figure 3:
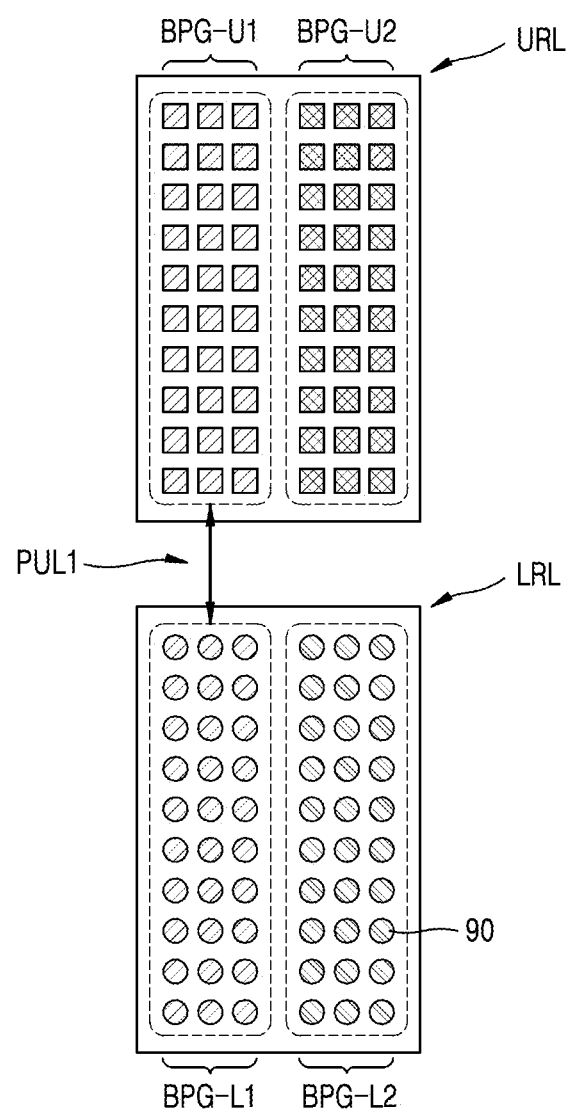
FIG. 3 is a plane view illustrating an electrical connection path between an upper redistribution layer and a lower redistribution layer of a semiconductor package according to an embodiment.

FIG. 1 is a cross-sectional view illustrating an electrical connection path in a semiconductor package SP according to an embodiment, FIGS. 2A and 2B are plane views each illustrating an electrical connection path between a semiconductor chip 100 (sub-semiconductor chips) and a lower redistribution layer LRL of a semiconductor package according to embodiments, and FIG. 3 is a plane view illustrating an electrical connection path between an upper redistribution layer URL and a lower redistribution layer LRL of a semiconductor package according to an embodiment.

Referring to FIG. 1, the semiconductor package SP may include the lower redistribution layer LRL, an expanded layer FL on the lower redistribution layer LRL, the semiconductor chip 100 in the expanded layer FL, and the upper redistribution layer URL on the expanded layer FL and the semiconductor chip 100. The expanded layer FL may surround the semiconductor chip 100.

A configuration of each of the lower redistribution layer LRL, the upper redistribution layer URL, and the expanded layer FL will be described in detail below with reference to FIGS. 4A to 4D.

The semiconductor package SP may be a fan-out semiconductor package having a greater horizontal width and horizontal area of each of the lower redistribution layer LRL and the upper redistribution layer URL than a horizontal width and horizontal area of a footprint formed by the semiconductor chip 100. In some embodiments, the horizontal widths and horizontal areas of the lower redistribution layer LRL, the expanded layer FL, and the upper redistribution layer URL may have the same value.

The lower redistribution layer LRL may include a plurality of lower ball pads LBP. Some of the plurality of lower ball pads LBP may form a first lower ball pad group BPG-L1, and some other of the plurality of lower ball pads LBP may form a second lower ball pad group BPG-L2. The first lower ball pad group BPG-L1 means that some of the plurality of lower ball pads LBP are arranged in a rectangular shape in a plane view, and the second lower ball pad group BPG-L2 means that some other of the plurality of lower ball pads LBP are arranged in a rectangular shape in the plane view. The upper redistribution layer URL may include a plurality of upper ball pads UBP. Some of the plurality of upper ball pads UBP may form a first upper ball pad group BPG-U1, and some other of the plurality of upper ball pads UBP may form a second upper ball pad group BPG-U2. The first upper ball pad group BPG-U1 means that some of the plurality of upper ball pads UBP are arranged in a rectangular shape in a plane view, and the second upper ball pad group BPG-U2 means that some other of the plurality of upper ball pads UBP are arranged in a rectangular shape in a plane view.

Herein, the lower ball pads LPB forming the first lower ball pad group BPG-L1 refer to some of the plurality of lower ball pads LBP which form the first lower ball pad group BPG-L1, the lower ball pads LPB forming the second lower ball pad group BPG-L2 refer to some other of the plurality of lower ball pads LBP which form the second lower ball pad group BPG-L2, the upper ball pads UPB forming the first upper ball pad group BPG-U1 refer to some of the plurality of upper ball pads UBP which form the first upper ball pad group BPG-U1, and the upper ball pads UPB forming the second upper ball pad group BPG-U2 refer to some other of the plurality of upper ball pads UBP which form the second upper ball pad group BPG-U2.

In some embodiments, the first lower ball pad group BPG-L1 and the first upper ball pad group BPG-U1 may overlap each other in a vertical direction, and the second lower ball pad group BPG-L2 and the second upper ball pad group BPG-U2 may overlap each other in a vertical direction. For example, each of the lower ball pads LPB forming the first lower ball pad group BPG-L1 and each of the upper ball pads UPB forming the first upper ball pad group BPG-U1 may overlap each other in the vertical direction to correspond to each other, and each of the lower ball pads LPB forming the second lower ball pad group BPG-L2 and each of the upper ball pads UPB forming the second upper ball pad group BPG-U2 may correspond to each other in the vertical direction to correspond to each other.

For example, when other semiconductor package having the same configuration as the semiconductor package SP is stacked on the semiconductor package SP, each of the upper ball pads UPB forming the first upper ball pad group BPG-U1 of the semiconductor package SP and each of the lower ball pads forming a first lower ball pad group of the other semiconductor package may face each other, and each of the upper ball pads UPB forming the second upper ball pad group BPG-U2 of the semiconductor package SP and each of the lower ball pads forming a second lower ball pad group of the other semiconductor package may face each other.

In some embodiments, when the semiconductor package SP is rotated 180 degrees in a horizontal direction, the first lower ball pad group BPG-L1 of the semiconductor package SP rotated 180 degrees and the second upper ball pad group BPG-U2 of the semiconductor package SP before rotation may overlap each other in the vertical direction, and the second lower ball pad group BPG-L2 of the semiconductor package SP rotated 180 degrees and the first upper ball pad group BPG-U1 of the semiconductor package SP before rotation may overlap each other in the vertical direction.

For example, when other semiconductor package having the same configuration as the semiconductor package SP is stacked on the semiconductor package SP, each of the upper ball pads UPB forming the first upper ball pad group BPG-U1 of the semiconductor package SP and each of the lower ball pads forming a second lower ball pad group of the other semiconductor package may face each other, and each of the upper ball pads UPB forming the second upper ball pad group BPG-U2 of the semiconductor package SP and each of the lower ball pads forming a first lower ball pad group of the other semiconductor package may face each other.

Herein, a lower ball pad group and an upper ball pad group of a semiconductor package, the lower ball pad group and the upper ball pad group having the same order (e.g., first, second, third, fourth, or the like), may overlap each other in a vertical direction, unless otherwise noted.

The semiconductor chip 100 may include a semiconductor substrate 110 on which a semiconductor device 112 is formed on an active surface, and a plurality of chip connection pads 120 on the active surface of the semiconductor substrate 110.

For example, the semiconductor substrate 110 may include a semiconductor material such as silicon (Si) or germanium (Ge). Alternatively, the semiconductor substrate 110 may include a compound semiconductor material such as silicon carbide (SiC), gallium arsenide (GaAs), indium arsenide (InAs), or indium phosphide (InP). The semiconductor substrate 110 may include a conductive area, for example, a well doped with impurities. The semiconductor device 112 including a plurality of individual devices of various types may be formed on the active surface of the semiconductor substrate 110.

In some embodiments, the semiconductor chip 100 may include a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip. For example, the semiconductor chip 100 may include a graphics double data rate synchronous dynamic random access memory (GDDR SDRAM) chip.

The upper ball pads UBP of the first upper ball pad group BPG-U1 and the lower ball pads LBP of the first lower ball pad group BPG-L1 may be electrically connected to each other through a first upper portion-lower portion electrical connection path PULL The plurality of chip connection pads 120 of the semiconductor chip 100 and the lower ball pads LBP of the second lower ball pad group BPG-L2 may be electrically connected to each other through a chip-lower portion electrical connection path PCL.

The first upper portion-lower portion electrical connection path PUL1 of the semiconductor package SP may electrically connect the first upper ball pad group BPG-U1 to the first lower ball pad group BPG-L1 which overlap to each other in the vertical direction.

Herein, an upper portion-lower portion electrical connection path which electrically connects an upper ball pad group to a lower ball pad group overlapping each other in a vertical direction in a semiconductor package may be referred to as a vertical electrical connection path.

A plurality of package connection terminals 90 may be attached to the plurality of lower ball pads LBP. The plurality of package connection terminals 90 may electrically connect the semiconductor package SP to an external system or other semiconductor package.

The upper ball pads UBP of the second upper ball pad group BPG-U2 may not be electrically connected to the lower ball pads LBP and/or the plurality of chip connection pads 120. For example, each of the upper ball pads UBP of the second upper ball pad group BPG-U2 may be a dummy ball pad which is not electrically connected to other configurations. Each of the upper ball pads of the first upper ball pad group BPG-U1 and each of the plurality of lower ball pads LBP may be a real ball pad which is electrically connected to other configurations.

The first upper portion-lower portion electrical connection path PUL1 may be formed by an upper redistribution conductive structure of the upper redistribution layer URL, a plurality of conductive connection structures of the expanded layer FL, and a lower redistribution conductive structure of the lower redistribution layer LRL. The chip-lower portion electrical connection path PCL may be formed by a lower redistribution conductive structure of the lower redistribution layer LRL, or may be formed by a plurality of chip connection bumps and a lower redistribution conductive structure of the lower redistribution layer LRL.

The upper redistribution conduction structure, the plurality of conductive connection structures, and the lower redistribution conduction structure will be described in detail below with reference to FIGS. 4A to 4D, and the plurality of chip connection bumps will be described in detail below with reference to FIGS. 4A to 4C.

The lower ball pads LBP of the second lower ball pad group BPG-L2 may function as an input/output (I/O) terminal of the semiconductor chip 100 of the semiconductor package SP, and the upper ball pads UBP of the first upper ball pad group BPG-U1 and the lower ball pads LBP of the first lower ball pad group BPG-L1 which are connected to the upper ball pads UBP of the first upper ball pad group BPG-U1 may function as an I/O terminal of a semiconductor chip of other semiconductor package stacked on the semiconductor package SP.

In some embodiments, some of the lower ball pads LBP of the second lower ball pad group BPG-L2 may function as a power terminal and a ground terminal of the semiconductor chip 100. Some of the upper ball pads UBP of the first upper ball pad group BPG-U1 and some of the lower ball pads LBP of the first lower ball pad group BPG-L1 may function as a power terminal and a ground terminal of a semiconductor chip of other semiconductor package stacked on the semiconductor package SP.

In some embodiments, some other of the plurality of lower ball pads LBP which do not form the first lower ball pad group BPG-L1 and the second lower ball pad group BPG-L2 may function as a power terminal and a ground terminal of the semiconductor package SP and a power terminal and a ground terminal of a semiconductor chip of other semiconductor package stacked on the semiconductor package SP.

Referring to FIGS. 1 and 2A, the semiconductor package SP may include one semiconductor chip 100. The plurality of chip connection pads 120 may form a chip pad array CPA. The chip pad array CPA may be electrically connected to the second lower ball pad group BPG-L2. In some embodiments, the plurality of chip connection pads 120 may be center pads in which the chip pad array CPA is arranged along the center of the semiconductor substrate 110 in a plane view, but are not limited thereto. In some other embodiments, the plurality of chip connection pads 120 may be edge pads in which the chip pad array CPA is arranged along an edge of the semiconductor substrate 110 in a plane view.

Referring to FIGS. 1 and 2B, the semiconductor chip 100 included in the semiconductor package SP may include a first sub-semiconductor chip 100a and a second sub-semiconductor chip 100b. The plurality of chip connection pads 120 of the first sub-semiconductor chip 100a may form a first chip pad array CPA-a, and the plurality of chip connection pads 120 of the second sub-semiconductor chip 100b may form a second chip pad array CPA-b.

In some embodiments, in the semiconductor package SP, each of the first sub-semiconductor chip 100a and the second sub-semiconductor chip 100b may have an independent I/O terminal. For example, the plurality of chip connection pads 120 of the first sub-semiconductor chip 100a which form the first chip pad array CPA-a may be electrically connected to some of the plurality of lower ball pads LBP of the second lower ball pad group BPG-L2, the plurality of chip connection pads 120 of the second sub-semiconductor chip 100b which form the second chip pad array CPA-b may be electrically connected to some other of the plurality of lower ball pads LBP of the second lower ball pad group BPG-L2.

Accordingly, a case where the semiconductor package SP includes the first sub-semiconductor chip 100a and the second sub-semiconductor chip 100b may be substantially the same as a case where the semiconductor package SP includes one semiconductor chip twice the number of I/O terminals, and the bandwidth by the semiconductor package SP may increase by the number of a sub-semiconductor chip included in the semiconductor package SP.

Referring to FIGS. 1 to 3, the upper ball pads UBP of the first upper ball pad group BPG-U1 and the lower ball pads LNP of the first lower ball pad group BPG-L1 may be electrically connected through the first upper portion-lower portion electrical connection path PULL The upper ball pads UBP of the second upper ball pad group BPG-U2 and the lower ball pads LBP of the second lower ball pad group BPG-L2 may not be electrically connected. The lower ball pads LBP of the second lower ball pad group BPG-L2 may be electrically connected to the plurality of chip connection pads 120 of the semiconductor chip 100 through the chip-lower portion electrical connection path PCL. Each of the upper ball pads UBP of the second upper ball pad group BPG-U2 may be a dummy ball pad.

FIGS. 4A to 4D are cross-sectional views of a semiconductor package 1 according to embodiments.

Figure 4A:
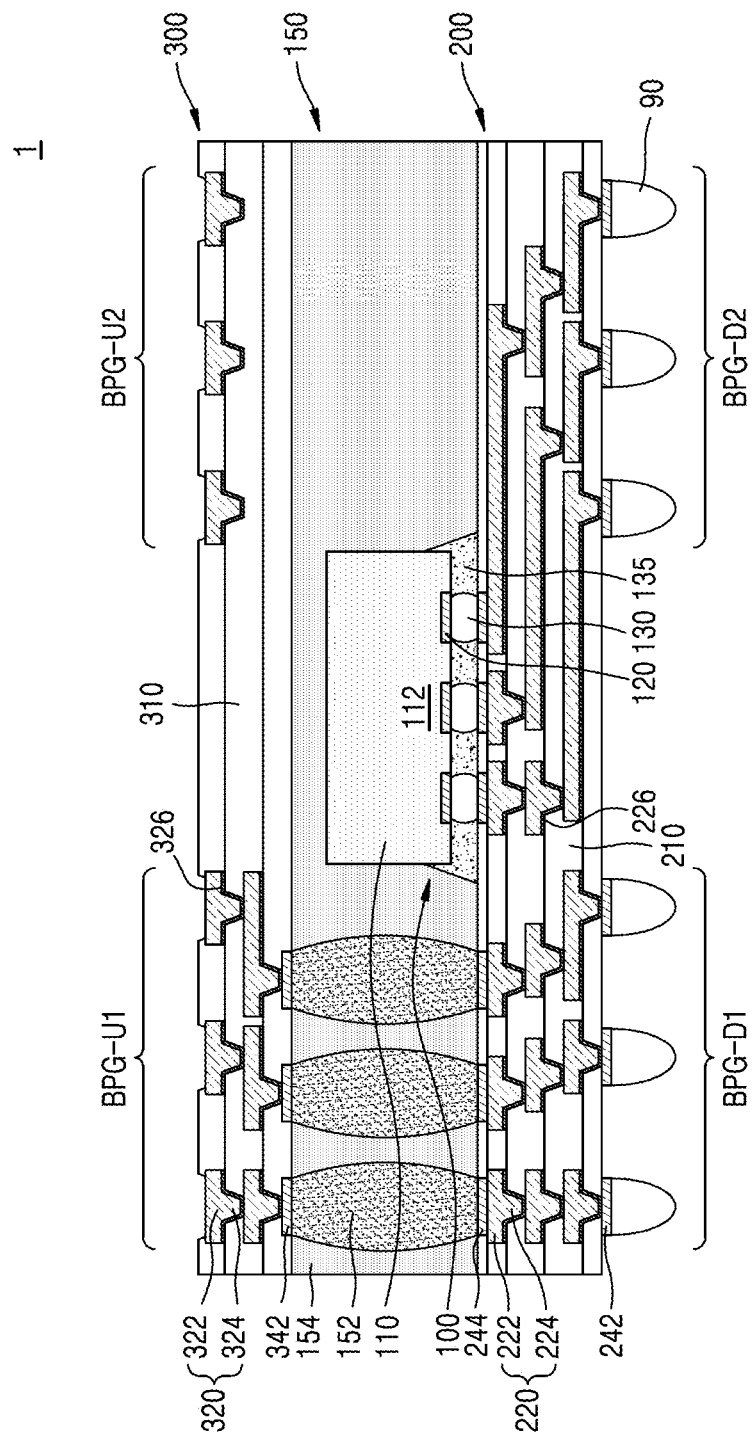
FIGS. 4A to 4D are cross-sectional views of a semiconductor package according to embodiments.

Referring to FIG. 4A, the semiconductor package 1 may include a lower redistribution layer 200, an expanded layer 150 on the lower redistribution layer 200, the semiconductor chip 100 in the expanded layer 150, and an upper redistribution layer 300 on the expanded layer 150 and the semiconductor chip 100. The lower redistribution layer 200, the expanded layer 150, and the upper redistribution layer 300 may be the lower redistribution layer LRL, the expanded layer FL, and the upper redistribution layer URL illustrated in FIG. 1.

The lower redistribution layer 200 may include a plurality of lower redistribution insulating layers 210 and a lower redistribution conductive structure 220. The lower redistribution conductive structure 220 may include a plurality of lower redistribution line patterns 222 and a plurality of lower redistribution vias 224, wherein the plurality of lower redistribution line patterns 222 are arranged on at least one of an upper surface and a lower surface of each of the plurality of lower redistribution insulating layers 210, and the plurality of lower redistribution vias 224 pass through at least one lower redistribution insulating layer 210 of the plurality of lower redistribution insulating layers 210 and respectively contact and are connected to some of the plurality of lower redistribution line patterns 222. The plurality of lower redistribution line patterns 222 and the plurality of lower redistribution vias 224 may include a metal or an alloy thereof.

At least some of the plurality of lower redistribution line patterns 222 may be formed together with some of the plurality of lower redistribution vias 224 to form a single body. In some embodiments, some of the plurality of lower redistribution line patterns 222 may be formed together with some of the plurality of lower redistribution vias 224 which are in contact with a lower side of some of the plurality of lower redistribution line patterns 222 to form a single body. In some other embodiments, some of the plurality of lower redistribution line patterns 222 may be formed together with some of the plurality of lower redistribution vias 224 which are in contact with an upper side of some of the plurality of lower redistribution line patterns 222 to form a single body.

In some embodiments, the plurality of lower redistribution vias 224 may have a tapered shape extending from an upper side to a lower side with a horizontal width narrowing. That is, the plurality of lower redistribution vias 224 may have a horizontal width narrowing as being far away from the semiconductor chip 100. For example, the semiconductor package 1 may be a chip last fan-out package in which the semiconductor chip 100 is mounted on the lower redistribution layer 200 after firstly forming the lower redistribution layer 200.

A lower redistribution seed layer 226 may be between the plurality of lower redistribution line patterns 222 and the plurality of lower redistribution insulating layers 210 and between the plurality of lower redistribution vias 224 and the plurality of lower redistribution insulating layers 210. In some embodiments, the lower redistribution seed layer 226 may be between a lower surface of each of the plurality of lower redistribution line patterns 222 and the plurality of lower redistribution vias 224 and one of the plurality of lower redistribution insulating layers 210, and may be between a side surface of the plurality of lower redistribution vias 224 and one of the plurality of lower redistribution insulating layers 210.

For example, the lower redistribution seed layer 226 may be formed by performing physical vapor deposition, and the plurality of lower redistribution line patterns 222 and the plurality of lower redistribution vias 224 may be formed by performing electroless plating using the lower redistribution seed layer 226 as a seed.

For example, the lower redistribution seed layer 226 may be selected form a group including copper (Cu), titanium (Ti), titanium-tungsten (TiW), titanium nitride (TiN), tantalum (Ta), tantalum nitride (TaN), chromium (Cr), aluminum (Al), or the like.

Each of the plurality of lower redistribution insulating layers 210 may be formed from, for example, a material film including an organic compound. According to some embodiments, the plurality of lower redistribution insulating layers 210 may be formed from a material film including an organic polymer material. For example, each of the plurality of lower redistribution insulating layers 210 may be formed from photo imageable dielectric (PID), an ajinomoto build-up film (ABF), or photosensitivepolyimide (PSPI).

The plurality of package connection terminals 90 electrically connected to the lower redistribution conductive structure 220 may be attached on a lower surface of the lower redistribution layer 200.

A plurality of chip connection terminals 130 may be between the lower redistribution conductive structure 220 and the plurality of chip connection pads 120 and electrically connect at least one semiconductor chip 100 to the lower redistribution conductive structure 220 of the lower redistribution layer 200. An underfill layer 135 surrounding the plurality of chip connection terminals 130 may be between the semiconductor chip 100 and the lower redistribution layer 200. The underfill layer 135 may include, for example, an epoxy resin formed by a capillary under-fill method. In some embodiments, the underfill layer 135 may include a non-conductive film (NCF).

The expanded layer 150 may include a plurality of conductive connection structures 152 and a filler 154 surrounding the plurality of conductive connection structures 152 and the semiconductor chip 100. The plurality of conductive connection structures 152 may penetrate the filler 154 to be electrically connected to the lower redistribution conductive structure 220 of the lower redistribution layer 200 and an upper redistribution conductive structure 320 of the upper redistribution layer 300.

Each of the plurality of conductive connection structures 152 may include a through mold via (TMV), a conductive solder, a conductive pillar, or at least one conductive bump. In some embodiments, each of the plurality of conductive connection structures 152 may soldered and formed such that a lower side portion thereof formed to be attached on an upper surface of the lower redistribution layer 200 and an upper side portion thereof formed to be attached to a lower surface of the upper redistribution layer 300 are reflowed by heat to form a single body.

The filler 154 may include, for example, an epoxy mold compound (EMC). The filler 154 may surround the semiconductor chip 100. In some embodiments, the filler 154 may cover side surfaces and an active surface of the semiconductor chip 100. In some other embodiments, the filler 154 may cover the side surfaces of the semiconductor chip 100, but may not cover the active surface of the semiconductor chip 100.

The upper redistribution layer 300 may include at least one upper redistribution insulating layer 310 and the upper redistribution conductive structure 320. The upper redistribution conductive structure 320 may include a plurality of upper redistribution line patterns 322 and a plurality of upper redistribution vias 324, wherein the plurality of upper line patterns 322 are arranged on at least one surface of an upper surface and a lower surface of each of the at least one upper distribution insulating layer 310, and the plurality of upper redistribution vias 324 pass through the at least one upper redistribution insulating layer 310 and respectively contact and are connected to some of the plurality of upper redistribution line patterns 322. At least some of the plurality of upper redistribution line patterns 322 may be formed together with some of the plurality of upper redistribution vias 324 to form a single body.

In some embodiments, the plurality of upper redistribution vias 324 may have a tapered shape extending from an upper side to a lower side with a horizontal width narrowing. That is, the plurality of upper redistribution vias 324 may have a horizontal width narrowing as being far away from the semiconductor chip 100.

An upper redistribution seed layer 326 may be between the plurality of upper redistribution line patterns and the at least one upper redistribution insulating layer 310 and between the plurality of upper redistribution vias 324 and the least one upper redistribution insulating layer 310.

The upper redistribution insulating layer 310, the upper redistribution line pattern 322, the upper redistribution via 324, and the upper redistribution seed layer 326 may respectively have a material same as or similar to that of the lower redistribution insulating layer 210, the lower redistribution line pattern 222, the lower redistribution via 224, and the lower redistribution seed layer 226, and may respectively have a substantially similar shape to that of the lower redistribution insulating layer 210, the lower redistribution line pattern 222, the lower redistribution via 224, and the lower redistribution seed layer 226. Therefore, detailed descriptions thereof are omitted.

In some embodiments, the number in which the upper redistribution insulating layers 310 of the upper redistribution layer 300 are stacked is less that the number in which the lower redistribution insulating layers 210 of the lower redistribution layer 200 are stacked, but is not limited thereto.

In some embodiments, a plurality of external connection pads 242 may be between the lower redistribution conductive structure 220 and the plurality of package connection terminals a plurality of lower connection pads 244 may be between the lower redistribution conductive structure 220 and the plurality of conductive connection structures 152, and a plurality of upper connection pads 342 may be between the upper redistribution conductive structure 320 and the plurality of conductive connection structures 152. In some embodiments, the plurality of external connection pads 242 and the plurality of lower connection pads 244 may include a material same as or similar to that of the plurality of lower redistribution line patterns 222 and the plurality of upper connection pads 342 may have a material same as or similar to that of the plurality of upper redistribution line patterns 322.

In some other embodiments, the plurality of external connection pads 242, the plurality of lower connection pads 244, and the plurality of upper connection pads 342 may be omitted.

Referring to FIGS. 1 and 4A, the plurality of upper ball pads UBP may be portions of the upper redistribution conductive structure 320, and the plurality of lower ball pads LBP may be portions of the lower redistribution conductive structure 220 or the plurality of external connection pads 242. The first upper portion-lower portion electrical connection path PUL1 may be formed by portions of the upper redistribution conductive structure 320, at least some of the plurality of conductive connection structures 152, and portions of the lower redistribution conductive structure 220. The chip-lower portion electrical connection path PCL may be formed by at least some of the plurality of chip connection terminals 130 and other portions of the lower redistribution conductive structure 220.

Figure 4B:
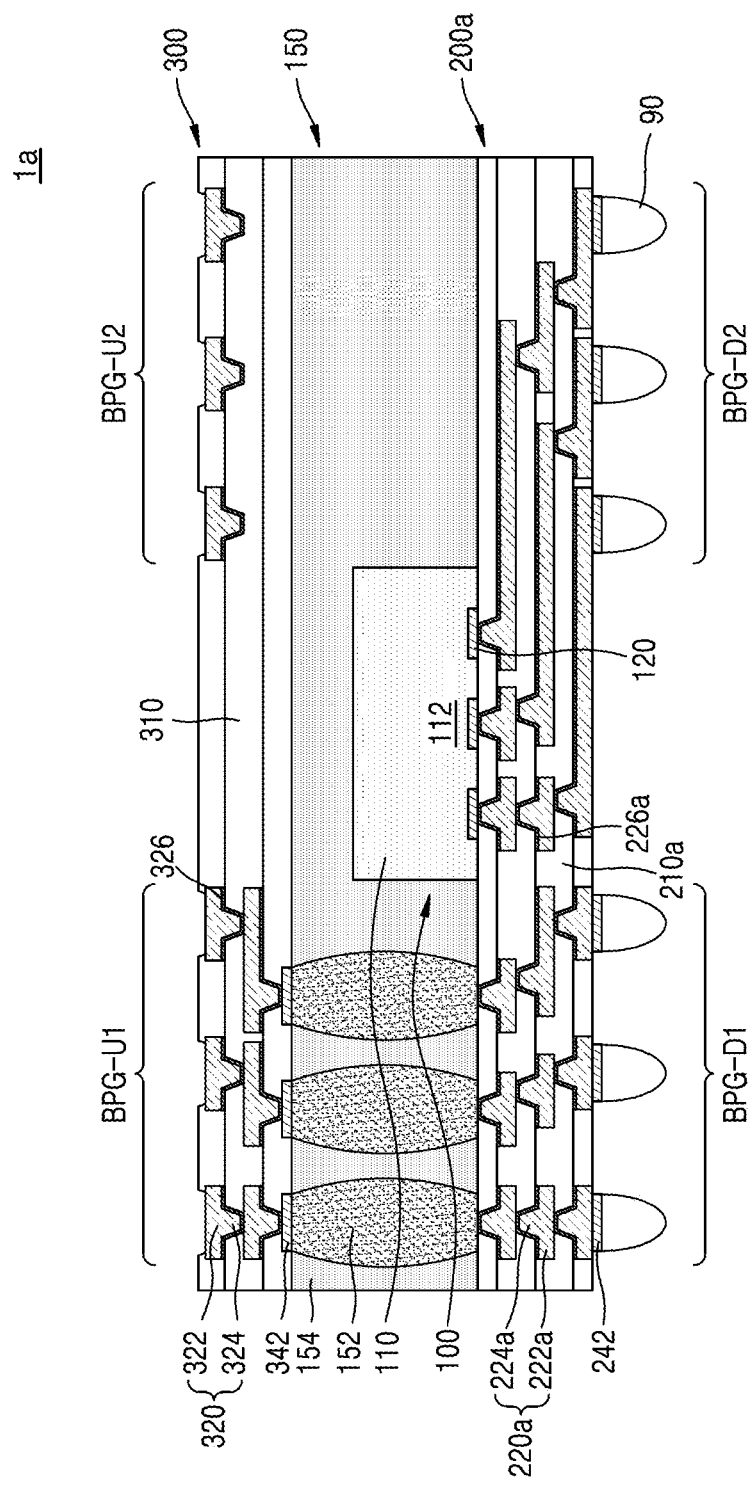

Referring to FIG. 4B, a semiconductor package 1a may include a lower redistribution layer 200a, the expanded layer 150 on the lower redistribution layer 200a, the semiconductor chip 100 in the expanded layer 150, and the upper redistribution layer 300 on the expanded layer 150 and the semiconductor chip 100. The lower redistribution layer 200a, the expanded layer 150, and the upper redistribution layer 300 may be the lower redistribution layer LRL, the expanded layer FL, and the upper redistribution layer URL illustrated in FIG. 1. Because the lower redistribution layer 200a is substantially similar to the lower redistribution layer 200 shown in FIG. 4A, a redundant description thereof will be omitted.

The lower redistribution layer 200a may include a plurality of lower redistribution insulating layers 210a and a lower redistribution conductive structure 220a. The lower redistribution conductive structure 220a may include a plurality of lower redistribution line patterns 222a and a plurality of lower redistribution vias 224a.

In some embodiments, the plurality of lower redistribution vias 224a may have a tapered shape extending from a lower side to an upper side with a horizontal width narrowing. That is, the plurality of lower redistribution vias 224a may have a horizontal width narrowing as being far away from the semiconductor chip 100.

For example, the semiconductor package 1a may be a chip first fan-out package in which the lower redistribution layer 200a is formed after firstly forming the semiconductor chip 100 and the expanded layer 150 surrounding the semiconductor chip 100.

A lower redistribution seed layer 226a may be between the plurality of lower redistribution line patterns 222a and the plurality of lower redistribution insulating layers 210a and between the plurality of lower redistribution vias 224a and the plurality of lower redistribution insulating layers 210a.

Figure 4C:
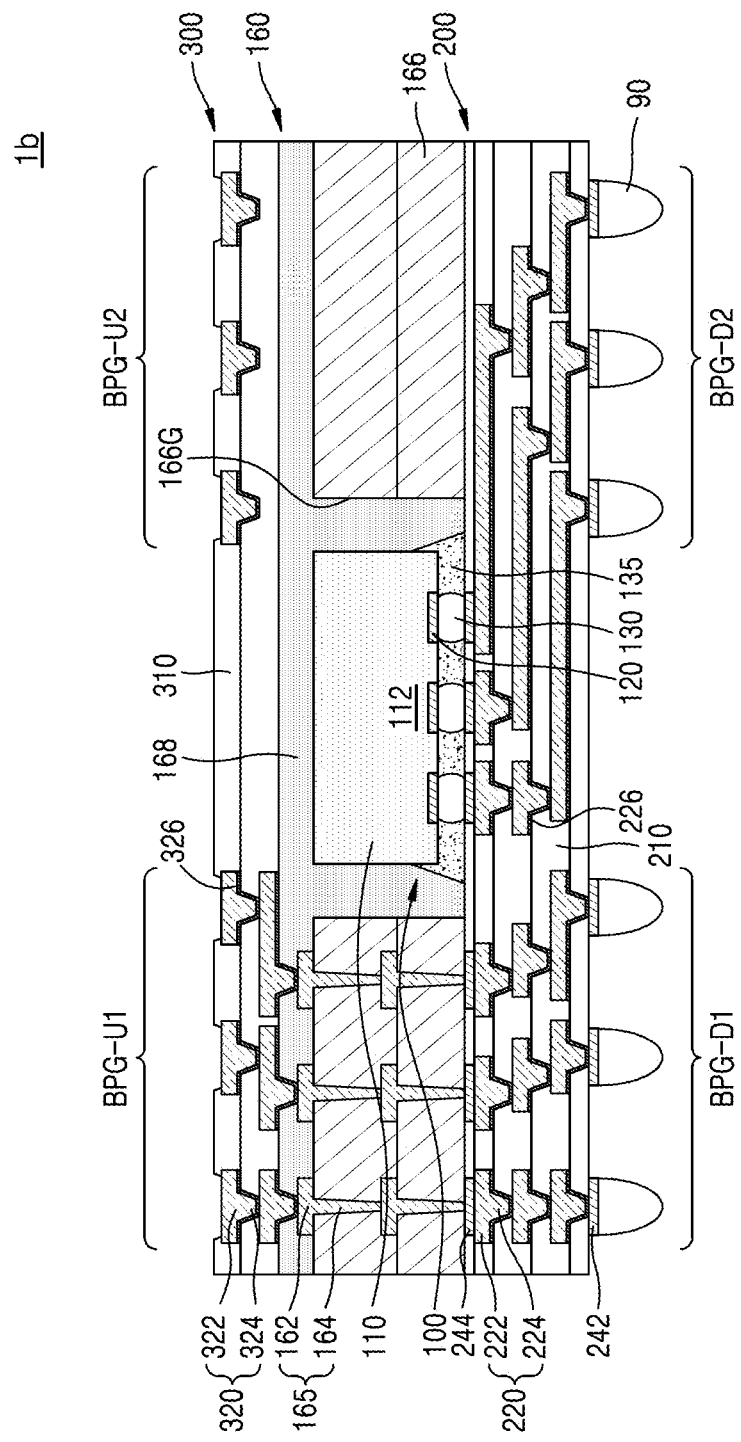

Referring to FIG. 4C, a semiconductor package 1b may include the lower redistribution layer 200, an expanded layer 160 on the lower redistribution layer 200, the semiconductor chip 100 in the expanded layer 160, and the upper redistribution layer 300 on the expanded layer 160 and the semiconductor chip 100. The lower redistribution layer 200, the expanded layer 160, and the upper redistribution layer 300 may be the lower redistribution layer LRL, the expanded layer FL, and the upper redistribution layer URL illustrated in FIG. 1.

The expanded layer 160 may be, for example, a printed circuit board (PCB), a ceramic substrate, a package manufacturing wafer, or an interposer. In some embodiments, the expanded layer 160 may be a multi-layer PCB. A mounting space 166G may be formed as an opening portion or a cavity in the expanded layer 160. The mounting space 166G may be formed in a partial area of the expanded layer 160, for example, in a center area. The mounting space 166G may be recessed from an upper surface of the expanded layer 160 to a certain depth or may be formed to extend from the upper surface to a lower surface of the expanded layer 160. A dry etching, wet etching, screen printing, drill bit, or laser drilling operation may be used to form the mounting space 166G by recessing or opening the expanded layer 160.

The expanded layer 160 may include a conductive connection structure 165 and at least one substrate base 166. The conductive connection structure 165 may include a plurality of connection line patterns 162 and a plurality of connection conductive vias 164, wherein the plurality of connection line patterns 162 are arranged on at least one of an upper surface and a lower surface of each of the at least one substrate base 166, and the plurality of connection conductive vias 164 pass through the at least one substrate base 166 and respectively contact and are connected to some of the plurality of connection line patterns 162. The conductive connection structure 165 may include copper, nickel, stainless steel, or beryllium copper. The substrate base 166 may include at least one material selected from a phenol resin, an epoxy resin, or polyimide.

In some embodiments, a solder resist layer exposing a portion of the plurality of connection line patterns 162 may be formed on each of the upper surface and the lower surface of the expanded layer 160. In some other embodiments, the solder resist layer may not be formed on at least one of the upper surface and the lower surface of the expanded layer 160.

The semiconductor package 1b may further include a filling insulating layer 168 filling a space between the semiconductor chip 100 and the expanded layer 160 in the mounting space 166G and between the semiconductor chip 100 and the expanded layer 160 and the upper redistribution layer 300. For example, the filling insulating layer 168 may include a thermosetting resin such as an epoxy resin, a thermoplastic resin such as polyimide, or a resin in which a reinforcing material such as an inorganic filler is included in the thermosetting resin and the thermoplastic resin, and particularly, may include the ABF, FT-4, BT, or the like. Alternatively, the filling insulating layer 168 may include a molding material such as an epoxy molding compound (EMC) or a photosensitive material such as a photoimageable encapsulant (PIE), such as a polyimide.

For example, the semiconductor package 1b may be a chip last fan-out panel level in which the semiconductor chip 100 and the expanded layer 160 are mounted on the lower redistribution layer 200 after firstly forming the lower redistribution layer 200.

Figure 4D:
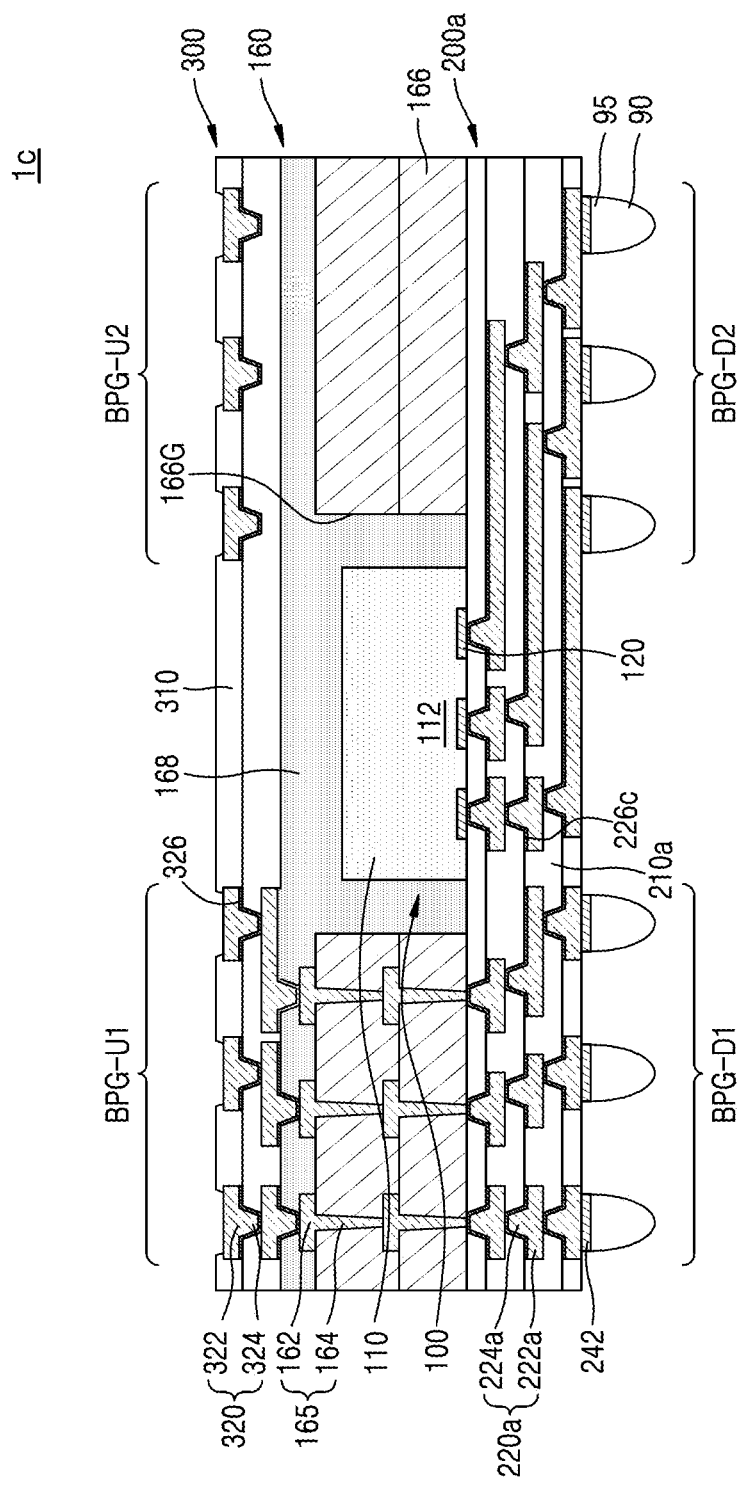

Referring to FIG. 4D, a semiconductor package 1c may include the lower redistribution layer 200a, the expanded layer 160 on the lower redistribution layer 200a, the semiconductor chip 100 in the expanded layer 160, and the upper redistribution layer 300 on the expanded layer 160 and the semiconductor chip 100. The lower redistribution layer 200a, the expanded layer 160, and the upper redistribution layer 300 may be the lower redistribution layer LRL, the expanded layer FL, and the upper redistribution layer URL illustrated in FIG. 1.

For example, the semiconductor package 1c may be a chip first fan-out panel level package in which the lower redistribution layer 200a is formed after firstly arranging the semiconductor chip 100 in the mounting area 166G of the expanded layer 160.

Figure 5:
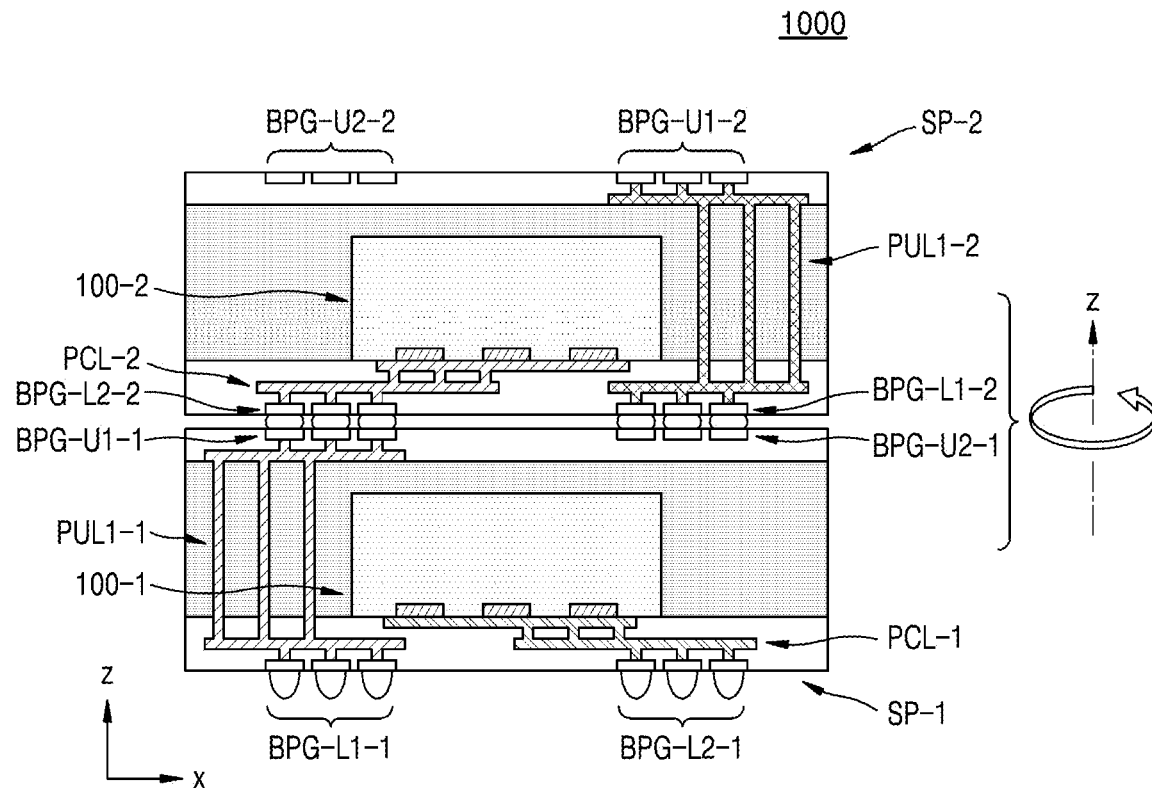
FIG. 5 is a cross-sectional view illustrating a method of manufacturing a stacked package module having a semiconductor package and an electrical connection path in the stacked package module, according to an embodiment.

FIG. 5 is a cross-sectional view illustrating a method of manufacturing a stacked package module 1000 having a semiconductor package and an electrical connection path in the stacked package module 1000, according to an embodiment. In detail, FIG. 5 is a cross-sectional view illustrating the stacked package module 1000 having the semiconductor package SP shown in FIG. 1.

Referring FIGS. 1 and 5 together, the stacked package module 1000 may be formed by stacking a second semiconductor package SP-2 on a first semiconductor package SP-1. Each of the first semiconductor package SP-1 and the second semiconductor package SP-2 may be the semiconductor package SP shown in FIG. 1. Accordingly, when the first semiconductor package SP-1 and the second semiconductor package SP-2 are described separately, names and reference numerals of components included in each of the first semiconductor package SP-1 and the second semiconductor package SP-2 described with reference to FIG. 5 and shown in FIG. 5 may be cited, and when a characteristic of the first semiconductor package SP-1 and the second semiconductor package SP-2 are described together, components included in the semiconductor package SP described with reference to FIG. 1 and shown in FIG. 1 may be cited.

The second semiconductor package SP-2 may be stacked on the first semiconductor package SP-1 by being rotated 180 degrees in a horizontal direction based on the first semiconductor package SP-1. For example, the second semiconductor package SP-2 may be the same as the first semiconductor package SP-1 rotated 180 degrees in a vertical direction (Z-direction) as a rotation axis. That is, in the stacked package module 1000, left and right sides of the first semiconductor package SP-1 may be opposite to that of the second semiconductor package SP-2.

The plurality of package connection terminals 90 of the second semiconductor package SP-2 may be attached to the upper ball pads UBP of a first upper ball pad group BPG-U1-1 and a second upper ball pad group BPG-U2-1 of the first semiconductor package SP-1. In detail, the plurality of package connection terminals 90 attached to a first lower ball pad group BPG-L1-2 of the second semiconductor package SP-2 may be attached to the upper ball pads UBO of the second upper ball pad group BPG-U2-1 of the first semiconductor package SP-1, and the plurality of package connection terminals 90 attached to a second lower ball pad group BPG-L2-2 of the second semiconductor package SP-2 may be attached to the upper ball pads UBP of the first upper ball pad group BPG-U1-1 of the first semiconductor package SP-1.

A semiconductor chip of the first semiconductor package SP-1, that is, a first semiconductor chip 100-1, may be electrically connected a second lower ball pad group BPG-L2-1 of the first semiconductor package SP-1 through a chip-lower portion electrical connection path PCL-1 of the first semiconductor package SP-1.

A semiconductor chip of the second semiconductor package SP-2, that is, a second semiconductor chip 100-2, may be electrically connected to a first upper portion-lower portion electrical connection path PUL1-1 of the first semiconductor package SP-1 through a chip-lower portion electrical connection path PCL-2 of the second semiconductor package SP-2, the second lower ball pad group BPG-L2-2, the plurality of package connection terminals 90 attached to the second lower ball pad group BPG-L2-2 of the second semiconductor package SP-2, and the first upper ball pad group BPG-U1-1 of the first semiconductor package SP-1. Accordingly, the second semiconductor chip 100-2 may be electrically connected to a first lower ball pad group BPG-L1-1 of the first semiconductor package SP-1.

The lower ball pads LBP of the first lower ball pad group BPG-L1-1 of the first semiconductor package SP-1 may function as an I/O terminal of the second semiconductor chip 100-2, and the lower ball pads LBP of a second lower ball pad group BPG-L2-1 of the first semiconductor package SP-1 may function as an I/O terminal of the first semiconductor chip 100-1.

Accordingly, because the stacked package module 1000 separately includes the lower ball pads LBP functioning as the I/O terminal of the first semiconductor chip 100-1, that is, the lower ball pads LBP of the second lower ball pad group BPG-L1-2 and the lower ball pads LBP functioning as the I/O terminal of the second semiconductor chip 100-2, that is, the lower ball pads LBP of the first lower ball pad group BPG-L1-1, the stacked package module 1000 may have an bandwidth increased in proportion to the number of semiconductor chips included in the stacked package module 1000.

Each of the upper ball pads UBP of the second upper ball pad group BPG-U2-2 of the second semiconductor package SP-2 may be a dummy ball pad. Although the upper ball pads UBP of a first upper ball pad BPG-U1-2 of the second semiconductor package SP-2 may be electrically connected to the upper ball pads UBP of the second upper ball pad group BPG-U2-1 of the first semiconductor package SP-1 through a first upper portion-lower portion electrical connection path PUL1-2 of the second semiconductor package SP-2, the first lower ball pad group BPG-L1-2, the plurality of package connection terminals 90 attached to the first lower ball pad group BPG-L1-2 of the second semiconductor package SP-2, because each of the upper ball pads UBP of the second upper ball pad group BPG-U2-1 of the first semiconductor package SP-1 is a dummy ball pad, each of the upper ball pads UBP of the first upper ball pad BPG-U1-2 of the second semiconductor package SP-2 may be a dummy ball pad in the stacked package module 1000.

Hereinafter, an electrical connection between a plurality of chip connection pads of a semiconductor chip and ball pads forming a ball pad group may be simply expressed as an electrical connection between the semiconductor chip and the ball pad group, and an electrical connection between ball pads forming each of the different ball pad groups may be simply expressed as an electrical connection between different ball pad groups.

In the stacked package module 1000 according to inventive concepts, the second semiconductor package SP-2 may be stacked and formed on the first semiconductor package SP-1 by being rotated 180 degrees in a horizontal direction based of the first semiconductor package SP-1, such that the left side and the right side of the first semiconductor package SP-1 are opposite to that of the second semiconductor package SP-2.

In the first semiconductor package SP-1 and the second semiconductor package SP-2 included in the stacked package module 1000, that is, each of the two semiconductor packages SP, one upper ball pad group of the plurality of upper ball pads UBP, that is, the second upper ball pad group BPG-U2, may include only dummy ball pads, and all of the remaining upper ball pad groups of the plurality of upper ball pads UBP, that is, the first upper ball pad group BPG-U1, and the lower ball pad groups of the plurality of lower ball pads LBP, that is, the first lower ball pad group BPG-L1 and the second lower ball pad group BPG-L2, may include real ball pads.

Accordingly, the stacked package module 1000 according to inventive concepts in which two semiconductor packages SP are stacked may have twice the bandwidth and capacity of the bandwidth and capacity of one semiconductor package SP.

In a case of forming one semiconductor package having a plurality of semiconductor chips to realize a large capacity, the size of the semiconductor package may be relatively largely increased when the plurality of semiconductor chips are arranged on the same level, and the bandwidth may be difficult to increase and a manufacturing cost may be significantly increased when the plurality of semiconductor chips are stacked in a vertical direction.

However, because the stacked package module 1000 according to inventive concepts stacks the semiconductor packages SP having the same function and the same structure, a low manufacturing cost may be easily formed, and the stacked package module 1000 may have a bandwidth increased in proportion to the number of stacked semiconductor packages SP.

Figure 6:
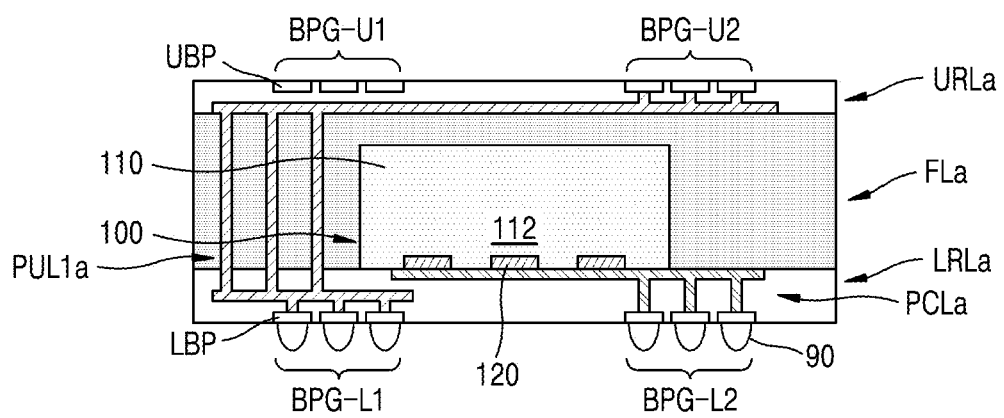
FIG. 6 is a cross-sectional view illustrating an electrical connection path in a semiconductor package according to an embodiment.
Figure 7:
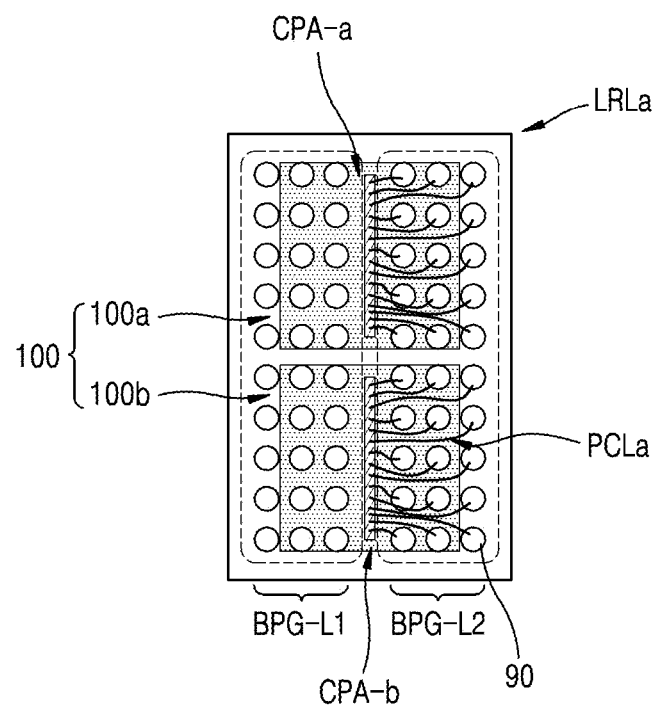
FIG. 7 is a plane view illustrating an electrical connection path between a semiconductor chip and a lower redistribution layer of a semiconductor package according to an embodiment.
Figure 8:
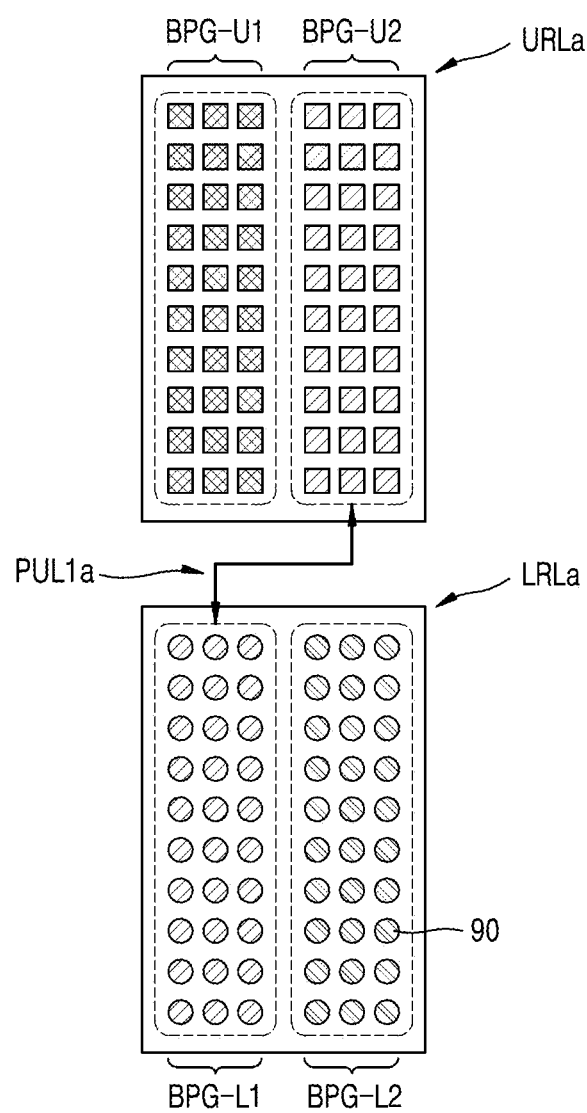
FIG. 8 is a plane view illustrating an electrical connection path between an upper redistribution layer and a lower redistribution layer of a semiconductor package according to an embodiment.

FIG. 6 is a cross-sectional view illustrating an electrical connection path in a semiconductor package SPa according to an embodiment, FIG. 7 is a plane view illustrating an electrical connection path between a semiconductor chip 100 and a lower redistribution layer LRLa of a semiconductor package according to an embodiment, and FIG. 8 is a plane view illustrating an electrical connection path between an upper redistribution layer URLa and the lower redistribution layer LRLa of a semiconductor package SPa according to an embodiment.

Referring to FIG. 6, the semiconductor package SPa may include a lower redistribution layer LRLa, an expanded layer FLa on the lower redistribution layer LRLa, a semiconductor chip 100 in the expanded layer FLa, and an upper redistribution layer URLa on the expanded layer FLa and the semiconductor chip 100. The expanded layer FLa may surround the semiconductor chip 100.

A second upper ball pad group BPG-U2 and a first lower ball pad group BPG-L1 may be electrically connected through a first upper portion-lower portion electrical connection path PUL1a. The semiconductor chip 100 and a second lower ball pad group BPG-L2 may be electrically connected through a chip-lower portion electrical connection path PCLa.

A first upper ball pad group BPG-U1 may be formed by dummy ball pads that are not electrically connected to the semiconductor chip 100, the first lower ball pad group BPG-L1, and the second lower ball pad group BPG-L2.

Although the first upper portion-lower portion electrical connection path PUL1 of the semiconductor package SP shown in FIG. 1 may electrically connect the first upper ball pad group BPG-U1 to the first lower ball pad group BPG-L1 which overlap in a vertical direction, the first upper portion-lower portion electrical connection path PUL1a of the semiconductor package SPa shown in FIG. 6 may electrically connect the second upper ball pad group BPG-U2 to the first lower ball pad group BPG-L1 which do not overlap in the vertical direction.

Herein, an upper portion-lower portion electrical connection path which electrically connects an upper ball pad group to a lower ball pad group which do not overlap in a vertical direction in a semiconductor package may be referred to as a step-type electrical connection path.

Referring to FIGS. 6 and 7 together, the semiconductor chip 100 included in the semiconductor package SPa may include a first sub-semiconductor chip 100a and a second sub-semiconductor chip 100b. For example, a first chip pad array CPA-a and a second chip pad array CPA-b may be electrically connected to the second lower ball pad group BPG-L2. Although not illustrated in drawings, similar to that illustrated in FIG. 2A, the semiconductor package SPa may include one semiconductor chip 100.

Referring to FIGS. 6 to 8 together, the second upper ball pad group BPG-U2 may be electrically connected to the first lower ball pad group BPG-L1 through the first upper portion-lower portion electrical connection path PUL1a. The second upper ball pad group BPG-U2 and the second lower ball pad group BPG-L2 may not be electrically connected.

The second lower ball pad group BPG-L2 may be electrically connected to the semiconductor chip 100 through the chip-lower portion electrical connection path PCLa. The first upper ball pad group BPG-U1 may be formed by dummy ball pads.

Figure 9:
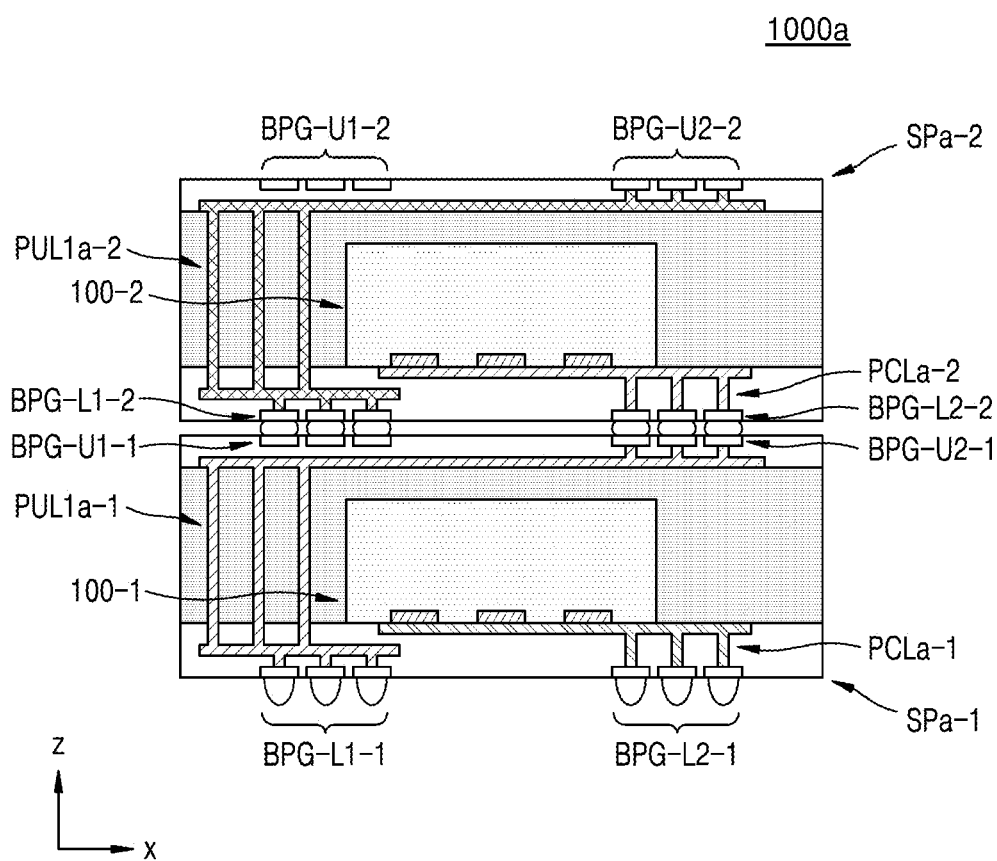
FIG. 9 is a cross-sectional view illustrating a method of manufacturing a stacked package module having a semiconductor package and an electrical connection path in the stacked package module, according to an embodiment.

FIG. 9 is a cross-sectional view illustrating a method of manufacturing a stacked package module 1000a having a semiconductor package and an electrical connection path in the stacked package module 1000a, according to an embodiment. In detail, FIG. 9 is a cross-sectional view illustrating the stacked package module 1000a having the semiconductor package SPa shown in FIG. 6.

Referring to FIGS. 6 and 9 together, the stacked package module 1000a may be formed by stacking a second semiconductor package SPa-2 on a first semiconductor package SPa-1. Each of the first semiconductor package SPa-1 and the second semiconductor package SPa-2 may be the semiconductor package SPa shown in FIG. 6.

The second semiconductor package SPa-2 may be stacked on the first semiconductor package SPa-1 without being rotated in a horizontal direction based on the first semiconductor package SPa-1. That is, in the stacked package module 1000a, left and right sides of the first semiconductor package SPa-1 may be the same as that of the second semiconductor package SPa-2.

The plurality of package connection terminals 90 attached to a first lower ball pad group BPG-L1-2 of the second semiconductor package SPa-2 may be attached to the upper ball pads UBO of a second upper ball pad group BPG-U2-1 of the first semiconductor package SPa-1, and the plurality of package connection terminals 90 attached to a second lower ball pad group BPG-L2-2 of the second semiconductor package SPa-2 may be attached to the upper ball pads UBP of a first upper ball pad group BPG-U1-1 of the first semiconductor package SPa-1.

A semiconductor chip of the first semiconductor package SPa-1, that is, a first semiconductor chip 100-1, may be electrically connected a second lower ball pad group BPG-L2-1 of the first semiconductor package SPa-1 through a chip-lower portion electrical connection path PCL-la of the first semiconductor package SPa-1.

A semiconductor chip of the second semiconductor package SPa-2, that is, a second semiconductor chip 100-2, may be electrically connected to a first upper portion-lower portion electrical connection path PUL1a-1 of the first semiconductor package SPa-1 through a chip-lower portion electrical connection path PCLa-2 of the second semiconductor package SPa-2, the second lower ball pad group BPG-L2-2, the plurality of package connection terminals 90 attached to the second lower ball pad group BPG-L2-2 of the second semiconductor package SPa-2, and the first upper ball pad group BPG-U1-1 of the first semiconductor package SPa-1. Accordingly, the second semiconductor chip 100-2 may be electrically connected to a first lower ball pad group BPG-L1-1 of the first semiconductor package SPa-1.

The lower ball pads LBP of the first lower ball pad group BPG-L1-1 of the first semiconductor package SPa-1 may function as an I/O terminal of the second semiconductor chip 100-2, and the lower ball pads LBP of a second lower ball pad group BPG-L2-1 of the first semiconductor package SPa-1 may function as an I/O terminal of the first semiconductor chip 100-1.

Because in the stacked package module 1000a according to inventive concepts, each of the first semiconductor package SPa-1 and the second semiconductor package SPa-2 has a step-type electrical connection path, the second semiconductor package SPa-2 may be stacked and formed on the first semiconductor package SPa-1 with the same left side and right side as that of the first semiconductor package SPa-1.

Figure 10:
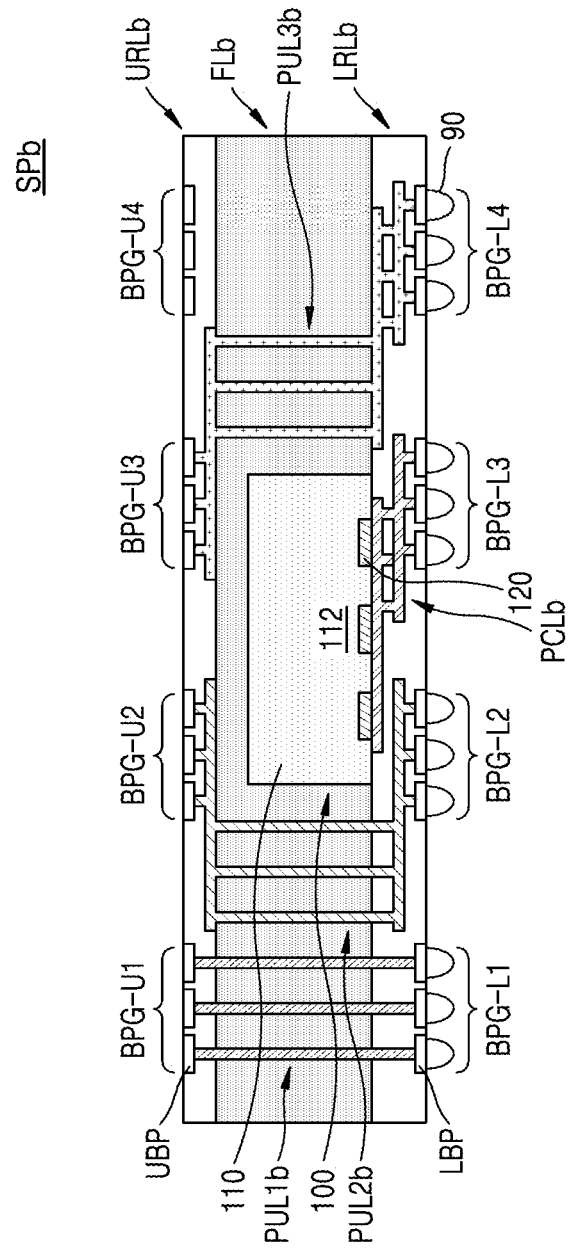
FIG. 10 is a cross-sectional view illustrating an electrical connection path in a semiconductor package according to an embodiment.
Figure 11A:
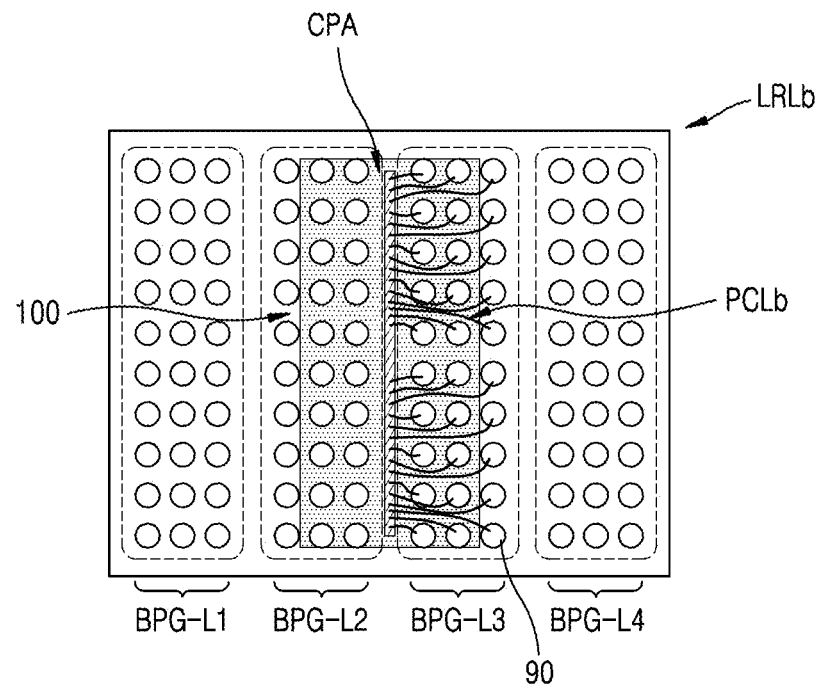
FIGS. 11A and 11B are plane views each illustrating an electrical connection path between a semiconductor chip (sub-semiconductor chips) and a lower redistribution layer of a semiconductor package according to embodiments.
Figure 11B:
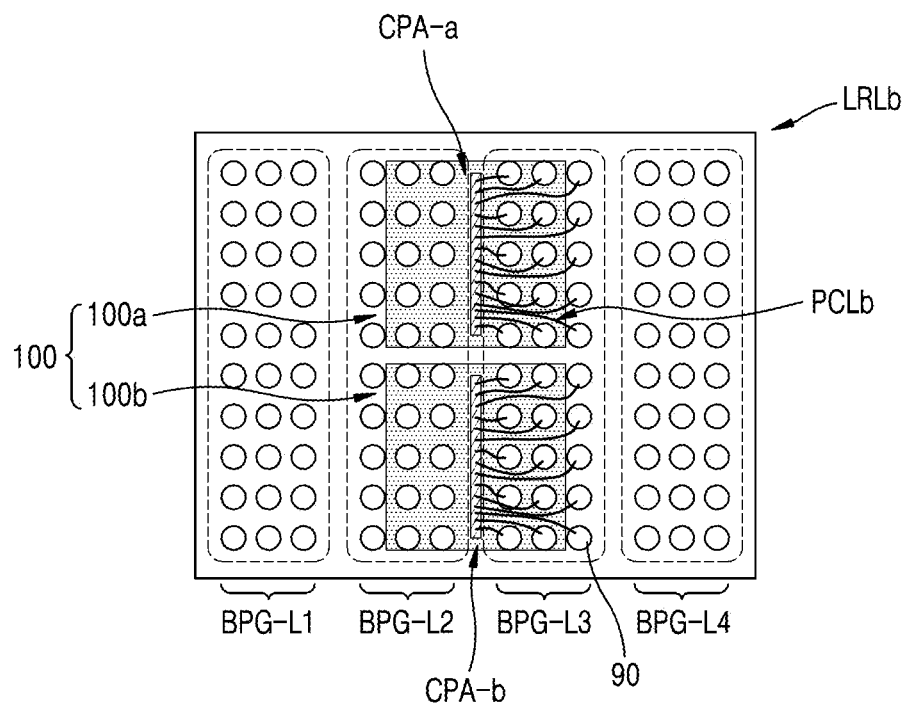
Figure 12:
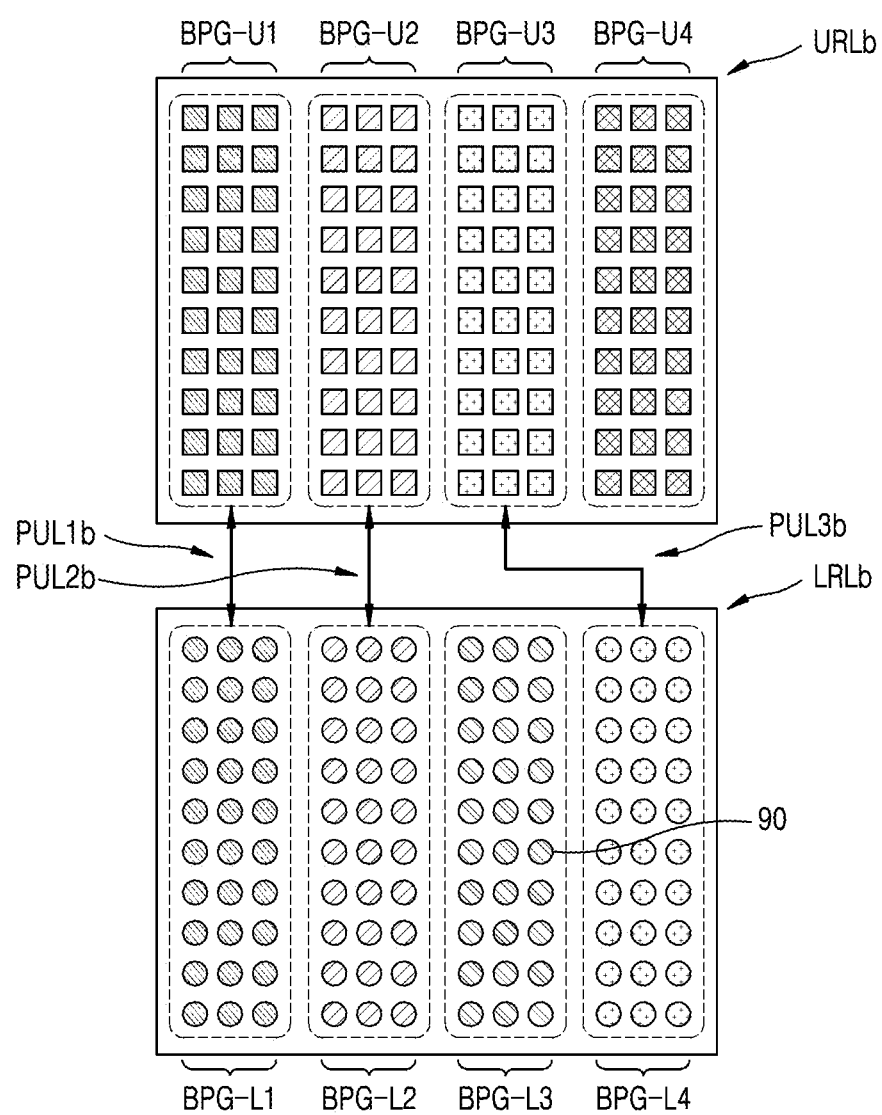
FIG. 12 is a plane view illustrating an electrical connection path between an upper redistribution layer and a lower redistribution layer of a semiconductor package according to an embodiment.

FIG. 10 is a cross-sectional view illustrating an electrical connection path in a semiconductor package SPb according to an embodiment, FIGS. 11A and 11B are plane views each illustrating an electrical connection path between a semiconductor chip 100 (sub-semiconductor chips) and a lower redistribution layer LRLb of a semiconductor package according to embodiments, and FIG. 12 is a plane view illustrating an electrical connection path between an upper redistribution layer URLb and the lower redistribution layer LRLb of a semiconductor package according to an embodiment.

Referring to FIG. 10, the semiconductor package SPb may include a lower redistribution layer LRLb, an expanded layer FLb on the lower redistribution layer LRLb, a semiconductor chip 100 in the expanded layer FLb, and an upper redistribution layer URLb on the expanded layer FLb and the semiconductor chip 100. The expanded layer FLb may surround the semiconductor chip 100.

The lower redistribution layer LRLb may include a first lower ball pad group BPG-L1, a second lower ball pad group BPG-L2, a third lower ball pad group BPG-L3, and a fourth lower ball pad group BPG-L4, and the upper redistribution layer URLb may include a first upper ball pad group BPG-U1, a second upper ball pad group BPG-U2, a third upper ball pad group BPG-U3, and a fourth upper ball pad group BPG-U4. In the lower redistribution layer LRLb, the first lower ball pad group BPG-L1, the second lower ball pad group BPG-L2, the third lower ball pad group BPG-L3, and the fourth lower ball pad group BPG-L4 may be arranged in rows in a horizontal direction. In the upper redistribution layer URLb, the first upper ball pad group BPG-U1, the second upper ball pad group BPG-U2, the third upper ball pad group BPG-U3, and the fourth upper ball pad group BPG-U4 may be arranged in rows in a horizontal direction.

The first upper ball pad group BPG-U1 and the first lower ball pad group BPG-L1 may be electrically connected through a first upper portion-lower portion electrical connection path PUL1b, and the second upper ball pad group BPG-U2 and the second lower ball pad group BPG-L2 may be electrically connected through a second upper portion-lower portion electrical connection path PUL2b. The third upper ball pad group BPG-U3 and the fourth lower ball pad group BPG-L4 may be electrically connected through a third upper portion-lower portion electrical connection path PUL3b. The semiconductor chip 100 and the third lower ball pad group BPG-L3 may be electrically connected through a chip-lower portion electrical connection path PCLb.

The fourth upper ball pad group BPG-U4 may be formed by dummy ball pads that are not electrically connected to the semiconductor chip 100 and the lower redistribution layer LRLb.

The first upper portion-lower portion electrical connection path PUL1b and the second upper portion-lower portion electrical connection path PUL2b may be a vertical electrical connection path, and the third upper portion-lower portion electrical connection path PUL3b may be a step-type electrical connection path.

Referring to FIGS. 10 and 11A together, the semiconductor package SPb may include one semiconductor chip 100. A plurality of chip connection pads 120 may form a chip pad array CPA. The chip pad array CPA may be electrically connected to the third lower ball pad group BPG-L3.

Referring to FIGS. 10 and 11B together, the semiconductor chip 100 included in the semiconductor package SPb may include a first sub-semiconductor chip 100a and a second sub-semiconductor chip 100b. For example, a first chip pad array CPA-a and a second chip pad array CPA-b may be electrically connected to the third lower ball pad group BPG-L3.

Referring to FIGS. 10 to 12 together, the first upper ball pad group BPG-U1 and the first lower ball pad group BPG-L1 may be electrically connected through the first upper portion-lower portion electrical connection path PUL1b. The second upper ball pad group BPG-U2 and the second lower ball pad group BPG-L2 may be electrically connected through the second upper portion-lower portion electrical connection path PUL2b. The third upper ball pad group BPG-U3 and the fourth lower ball pad group BPG-L4 may be electrically connected through a third upper portion-lower portion electrical connection path PUL3b. The third lower ball pad group BPG-L3 may be electrically connected to the semiconductor chip 100 through the chip-lower portion electrical connection path PCLb. The fourth upper ball pad group BPG-U4 may be formed by dummy ball pads.

Figure 13A:
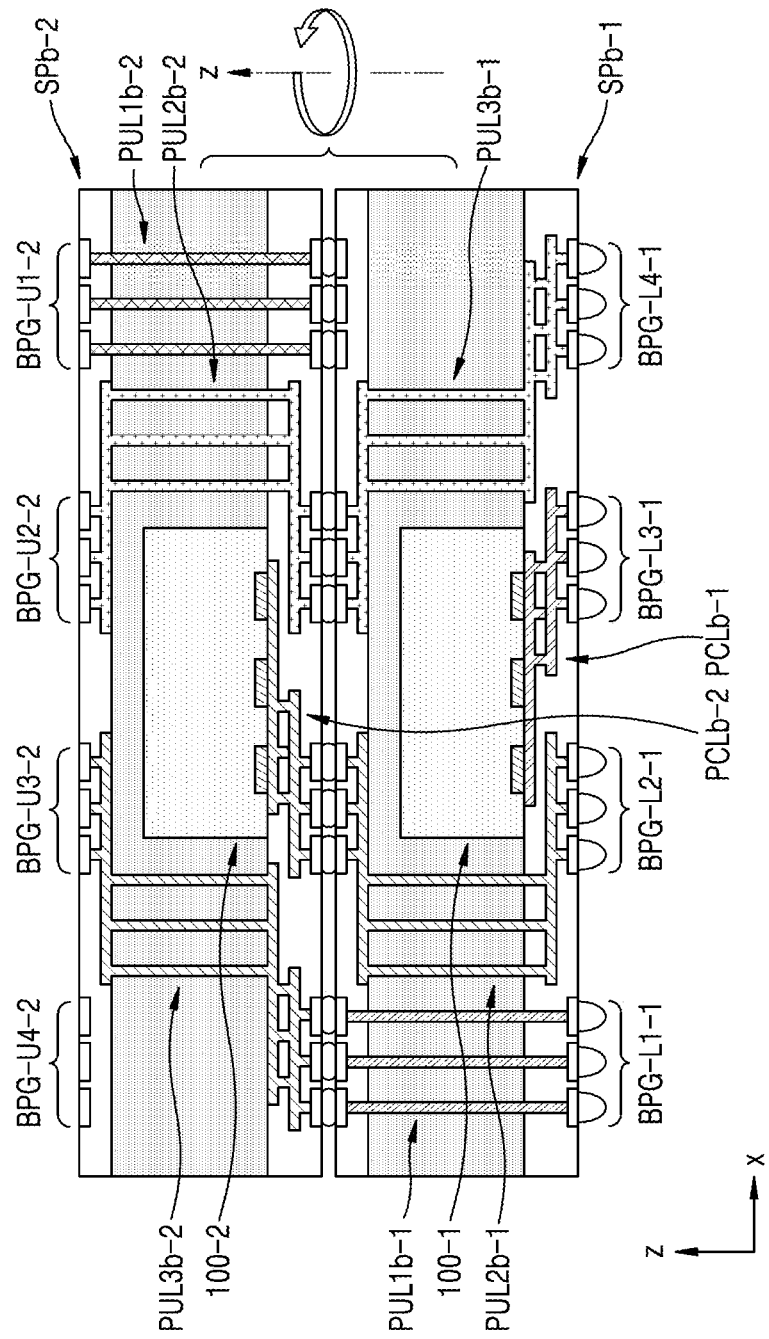
FIGS. 13A and 13B are cross-sectional views each illustrating a method of manufacturing a stacked package module having a semiconductor package and an electrical connection path in the stacked package module, according to an embodiment.
Figure 13B:
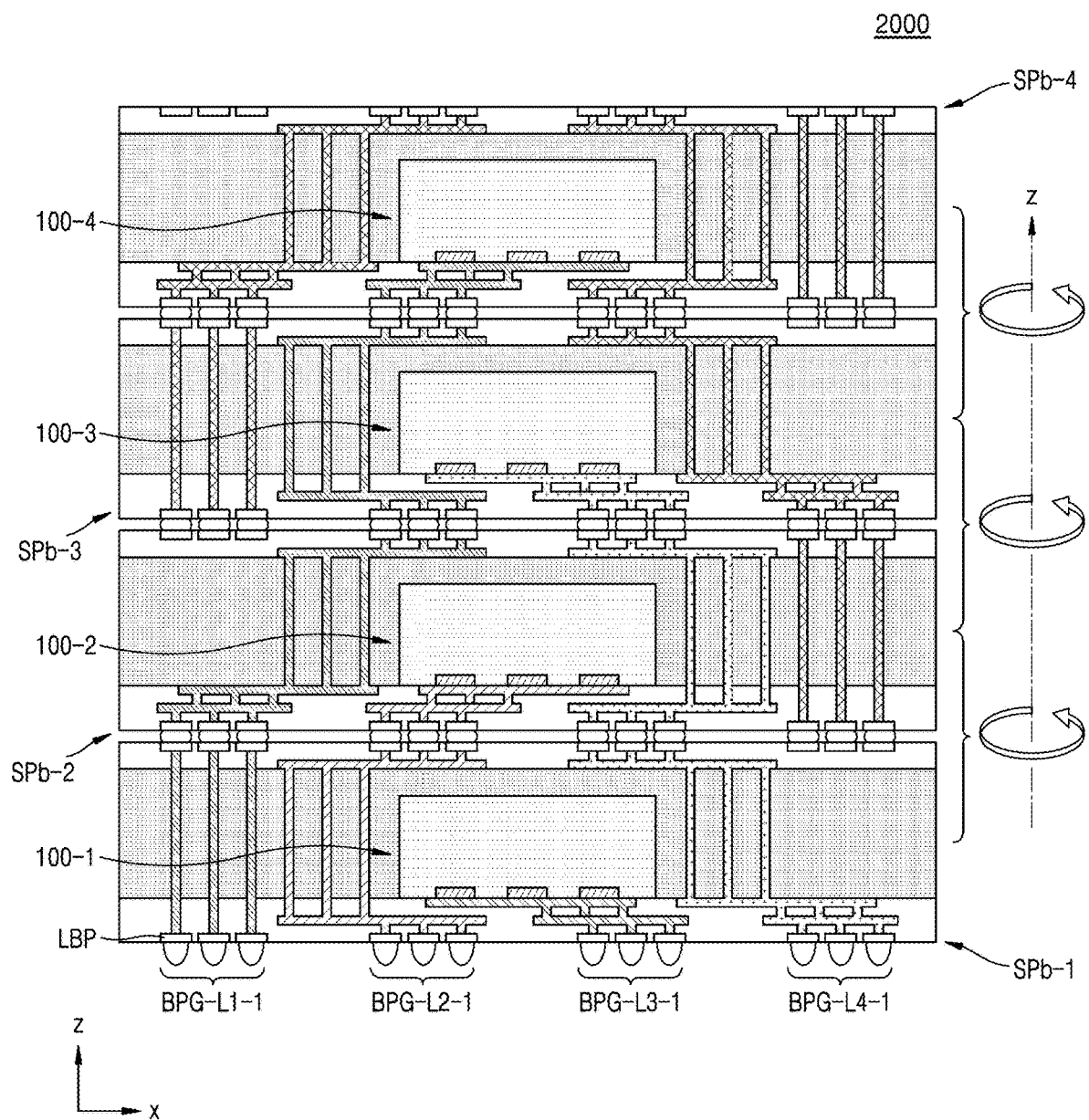

FIGS. 13A and 13B are cross-sectional views each illustrating a method of manufacturing a stacked package module having a semiconductor package and an electrical connection path in the stacked package module, according to an embodiment.

Referring to FIGS. 10 and 13A, a second semiconductor package SPb-2 is stacked on a first semiconductor package SPb-1. Each of the first semiconductor package SPb-1 and the second semiconductor package SPb-2 may be the semiconductor package SPb shown in FIG. 10. The second semiconductor package SPb-2 may be stacked on the first semiconductor package SPb-1 by being rotated 180 degrees in a horizontal direction based on the first semiconductor package SPb-1. That is, right and left sides of the first semiconductor package SPb-1 may be opposite to that of the second semiconductor package SPb-2.

A semiconductor chip of the first semiconductor package SPb-1, that is, a first semiconductor chip 100-1, may be electrically connected to a third lower ball pad group BPG-L3-1 of the first semiconductor package SPb-1 through a chip-lower portion electrical connection path PCLb-1 of the first semiconductor package SPb-1.

A semiconductor chip of the second semiconductor package SPb-2, that is, a second semiconductor chip 100-2, may be electrically connected to a second lower ball pad group BPG-L2-1 of the first semiconductor package SPb-1 through a chip-lower portion electrical connection path PCLb-2 of the second semiconductor package SPb-2 and a second upper portion-lower portion electrical connection path PUL2b-1 of the first semiconductor package SPb-1.

Referring to FIGS. 10 and 13B together, a stacked package module 2000 is formed by sequentially stacking a third semiconductor package SPb-3 and a fourth semiconductor package SPb-4 on the second semiconductor package SPb-2 stacked on the first semiconductor package SPb-1. Each of the third semiconductor package SPb-3 and the fourth semiconductor package SPb-4 may be the semiconductor package SPb shown in FIG. 10. The third semiconductor package SPb-3 may be stacked on the second semiconductor package SPb-2 by being rotated 180 degrees in a horizontal direction based on the second semiconductor package SPb-2, and the fourth semiconductor package SPb-4 may be stacked on the third semiconductor package SPb-3 by being rotated 180 degrees in a horizontal direction based on the third semiconductor package SPb-3. That is, in the stacked package module 2000, left and right sides of the first semiconductor package SPb-1 may be opposite to that of the second semiconductor package SPb-2, left and right sides of the second semiconductor package SPb-2 may be opposite to that of the third semiconductor package SPb-3, and left and right sides of the third semiconductor package SPb-3 may be opposite to that of the fourth semiconductor package SPb-4. Accordingly, the left and right sides of the first semiconductor package SPb-1 may be same as that of the third semiconductor package SPb-3, the left and right sides of the second semiconductor package SPb-2 may be same as that of the fourth semiconductor package SPb-4, and the left and right sides of the first semiconductor package SPb-1 may be opposite to that of each of the second semiconductor package SPb-2 and the fourth semiconductor package SPb-4.

The lower ball pads LBP of a first lower ball pad group BPG-L1-1 of the first semiconductor package SPb-1 may function as an I/O terminal of a fourth semiconductor chip 100-4, the lower ball pads LBP of a second lower ball pad group BPG-L2-1 of the first semiconductor package SPb-1 may function as an I/O terminal of the second semiconductor chip 100-2, the lower ball pads LBP of a third lower ball pad group BPG-L3-1 of the first semiconductor package SPb-1 may function as an I/O terminal of the first semiconductor chip 100-1, and a fourth lower ball pad group BPG-L4-1 of the first semiconductor package SPb-1 may function as an I/O terminal of a third semiconductor chip 100-3.

In the stacked package module 2000 according to inventive concepts, each of the first semiconductor package SPb-1, the second semiconductor package SPb-2, the third semiconductor package SPb-3, and the fourth semiconductor package SPb-4 may have a step-type electrical connection path, the second semiconductor package SPb-2 may be stacked on the first semiconductor package SPb-1 by being rotated 180 degrees in a horizontal direction based on the first semiconductor package SPb-1, the third semiconductor package SPb-3 may be stacked on the second semiconductor package SPb-2 by being rotated 180 degrees in a horizontal direction based on the second semiconductor package SPb-2, and the fourth semiconductor package SPb-4 may be stacked on the third semiconductor package SPb-3 by being rotated 180 degrees in a horizontal direction based on the third semiconductor package SPb-3.

Figure 14:
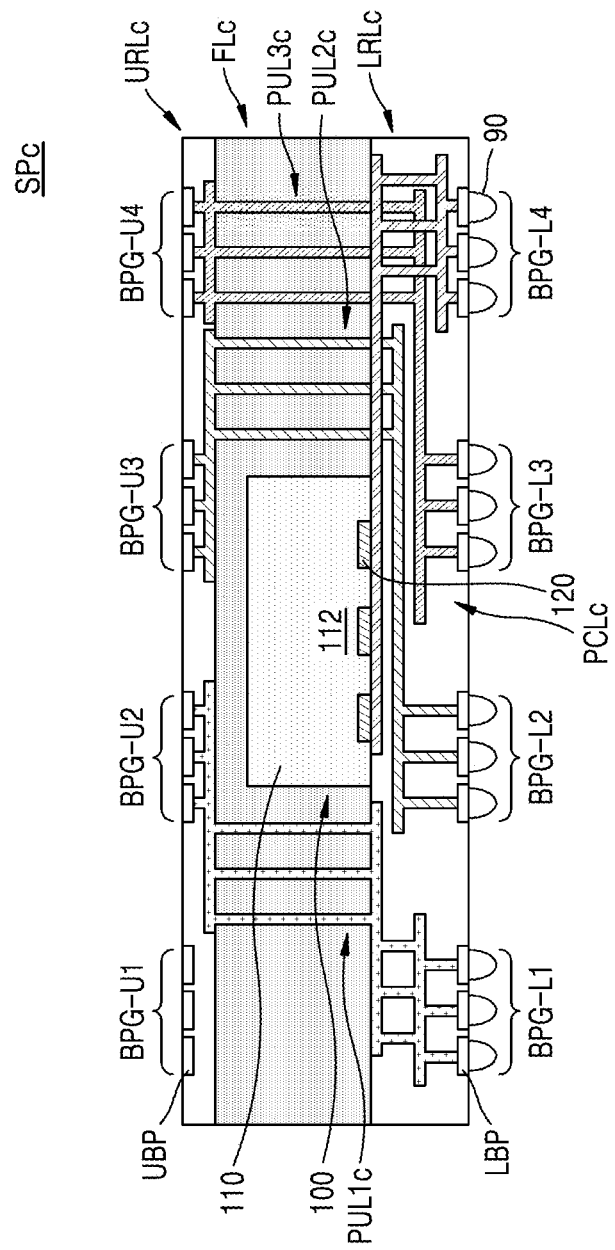
FIG. 14 is a cross-sectional view illustrating an electrical connection path in a semiconductor package according to an embodiment.
Figure 15:
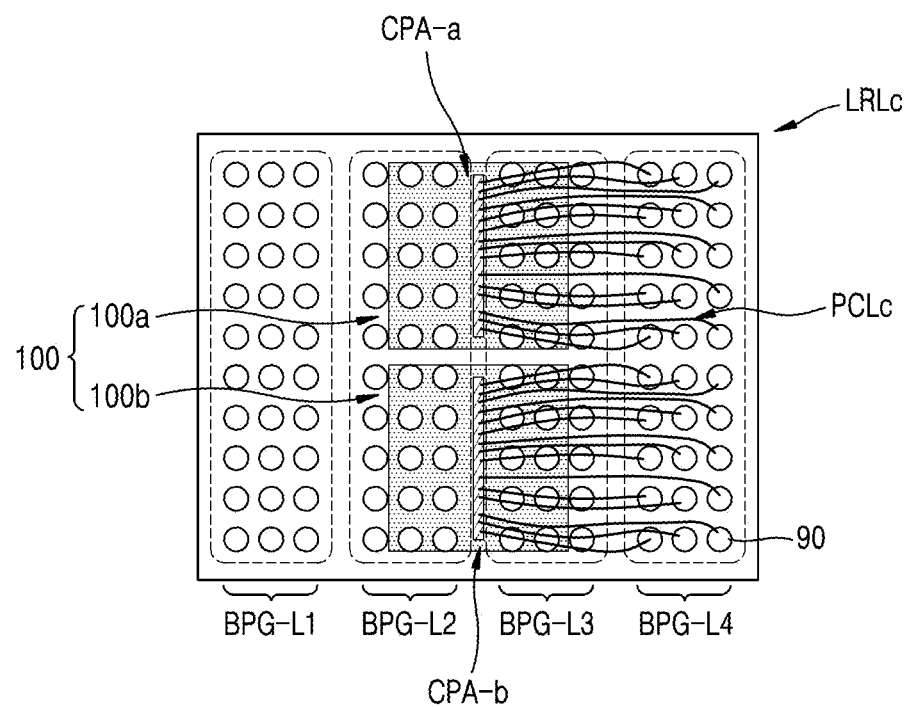
FIG. 15 is a plane view illustrating an electrical connection path between a semiconductor chip and a lower redistribution layer of a semiconductor package according to an embodiment.
Figure 16:
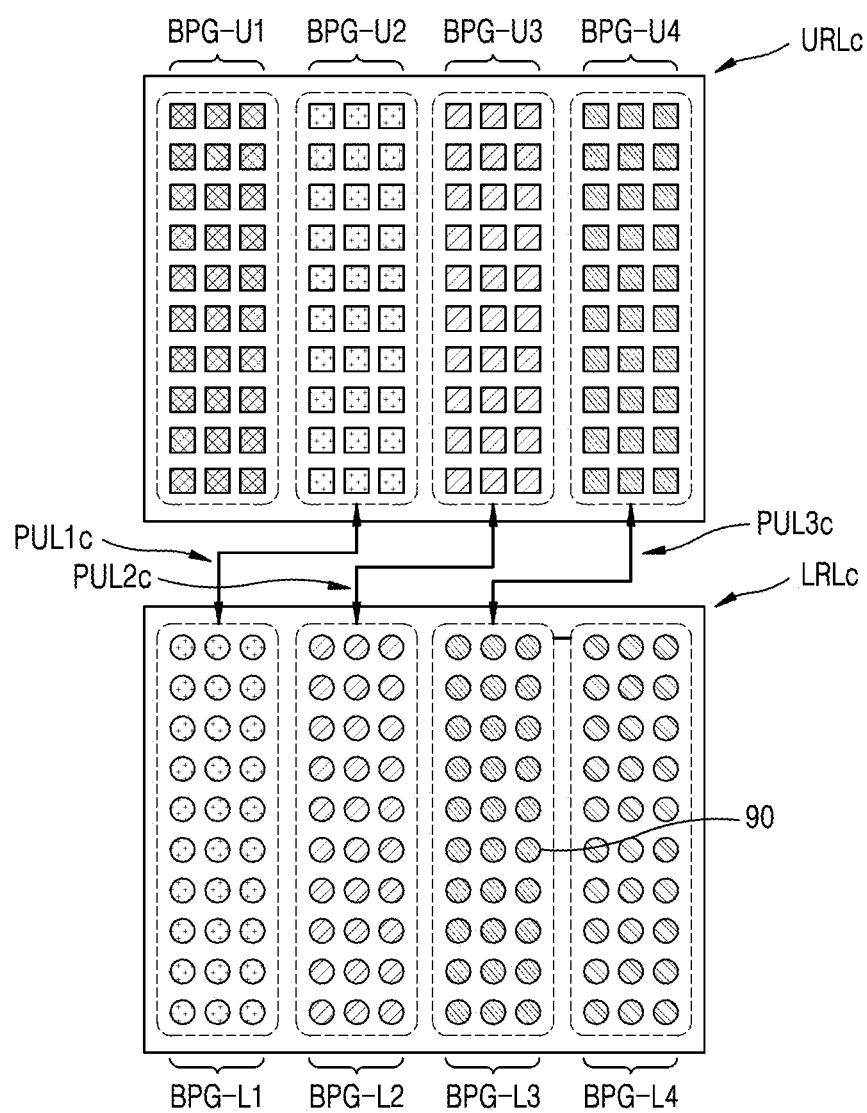
FIG. 16 is a plane view illustrating an electrical connection path between an upper redistribution layer and a lower redistribution layer of a semiconductor package according to an embodiment.

FIG. 14 is a cross-sectional view illustrating an electrical connection path in a semiconductor package SPc according to an embodiment, FIG. 15 is a plane view illustrating an electrical connection path between a semiconductor chip 100 and a lower redistribution layer LRLc of a semiconductor package according to an embodiment, and FIG. 16 is a plane view illustrating an electrical connection path between an upper redistribution layer URLc and the lower redistribution layer LRLc of a semiconductor package according to an embodiment.

Referring to FIG. 14, the semiconductor package SPc may include a lower redistribution layer LRLc, an expanded layer FLc on the lower redistribution layer LRLc, a semiconductor chip 100 in the expanded layer FLc, and an upper redistribution layer URLc on the expanded layer FLc and the semiconductor chip 100. The expanded layer FLc may surround the semiconductor chip 100.

The lower redistribution layer LRLc may include a first lower ball pad group BPG-L1, a second lower ball pad group BPG-L2, a third lower ball pad group BPG-L3, and a fourth lower ball pad group BPG-L4, and the upper redistribution layer URLc may include a first upper ball pad group BPG-U1, a second upper ball pad group BPG-U2, a third upper ball pad group BPG-U3, and a fourth upper ball pad group BPG-U4.

The second upper ball pad group BPG-U2 and the first lower ball pad group BPG-L1 may be electrically connected through a first upper portion-lower portion electrical connection path PUL1c, the third upper ball pad group BPG-U3 and the second lower ball pad group BPG-L2 may be electrically connected through a second upper portion-lower portion electrical connection path PUL2c, and the fourth upper ball pad group BPG-U4 and the third lower ball pad group BPG-L3 may be electrically connected through a third upper portion-lower portion electrical connection path PUL3c. The semiconductor chip 100 and the fourth lower ball pad group BPG-L4 may be electrically connected through a chip-lower portion electrical connection path PCLc.

The first upper ball pad group BPG-U1 may be formed by dummy ball pads that are not electrically connected to the semiconductor chip 100 and the lower redistribution layer LRLc.

The first upper portion-lower portion electrical connection path PUL1c, the second upper portion-lower portion electrical connection path PUL2c, and the third upper portion-lower portion electrical connection path PUL3c may be a step-type electrical connection path.

Referring to FIGS. 14 and 15 together, the semiconductor chip 100 included in the semiconductor package SPc may include a first sub-semiconductor chip 100a and a second sub-semiconductor chip 100b. For example, a first chip pad array CPA-a and a second chip pad array CPA-b may be electrically connected to the fourth lower ball pad group BPG-L4. Although not illustrated in drawings, similar to that illustrated in FIG. 11A, the semiconductor package SPc may include one semiconductor chip 100.

Referring to FIGS. 14 to 16 together, the second upper ball pad group BPG-U2 and the first lower ball pad group BPG-L1 may be electrically connected through the first upper portion-lower portion electrical connection path PUL1c. The third upper ball pad group BPG-U3 and the second lower ball pad group BPG-L2 may be electrically connected through the second upper portion-lower portion electrical connection path PUL2c. The fourth upper ball pad group BPG-U4 and the third lower ball pad group BPG-L3 may be electrically connected through the third upper portion-lower portion electrical connection path PUL3c. The fourth lower ball pad group BPG-L4 may be electrically connected to the semiconductor chip 100 through the chip-lower portion electrical connection path PCLc. The first upper ball pad group BPG-U1 may be formed by dummy ball pads.

Figure 17A:
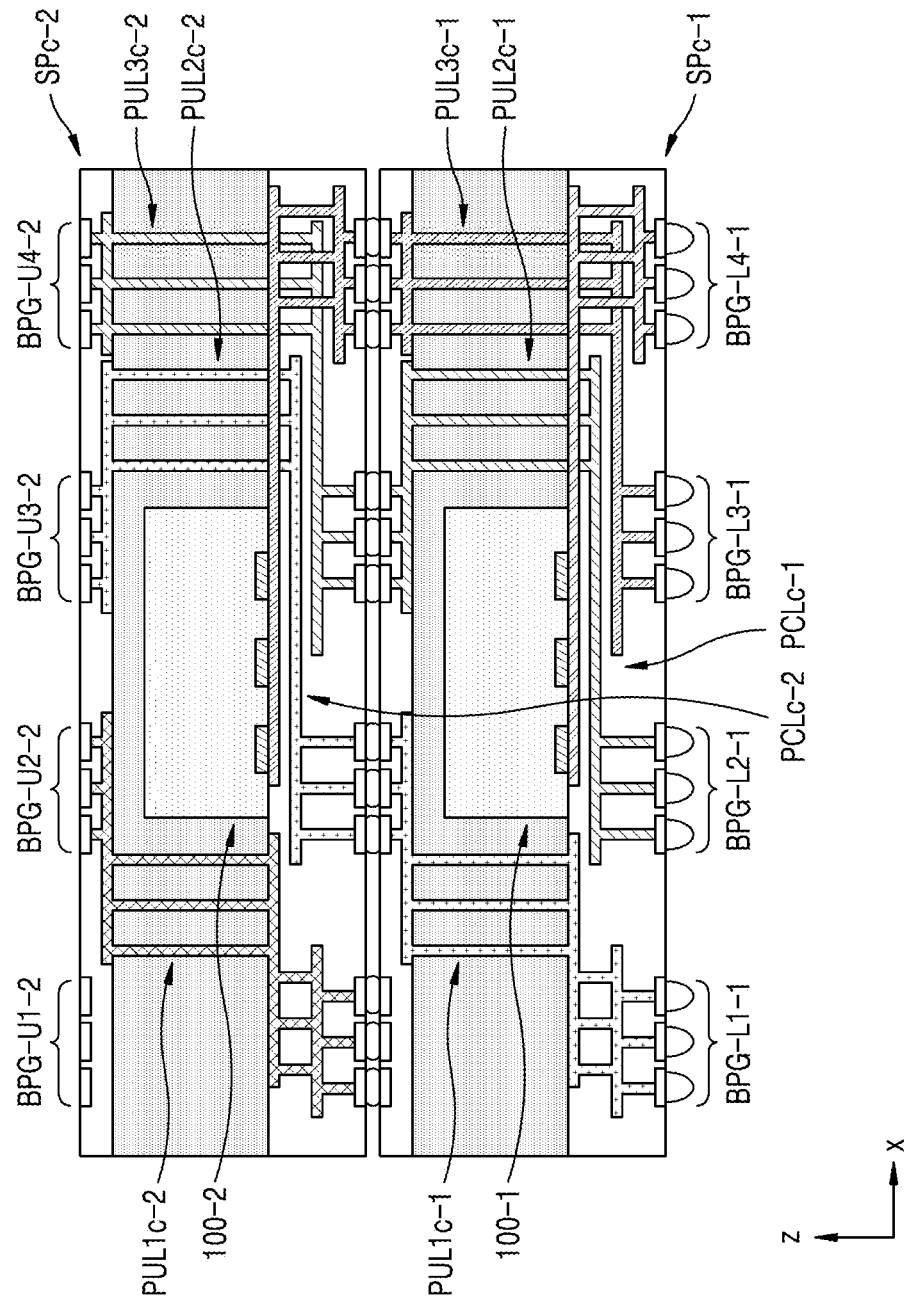
FIGS. 17A and 17B are cross-sectional views each illustrating a method of manufacturing a stacked package module having a semiconductor package and an electrical connection path in the stacked package module, according to an embodiment.
Figure 17B:
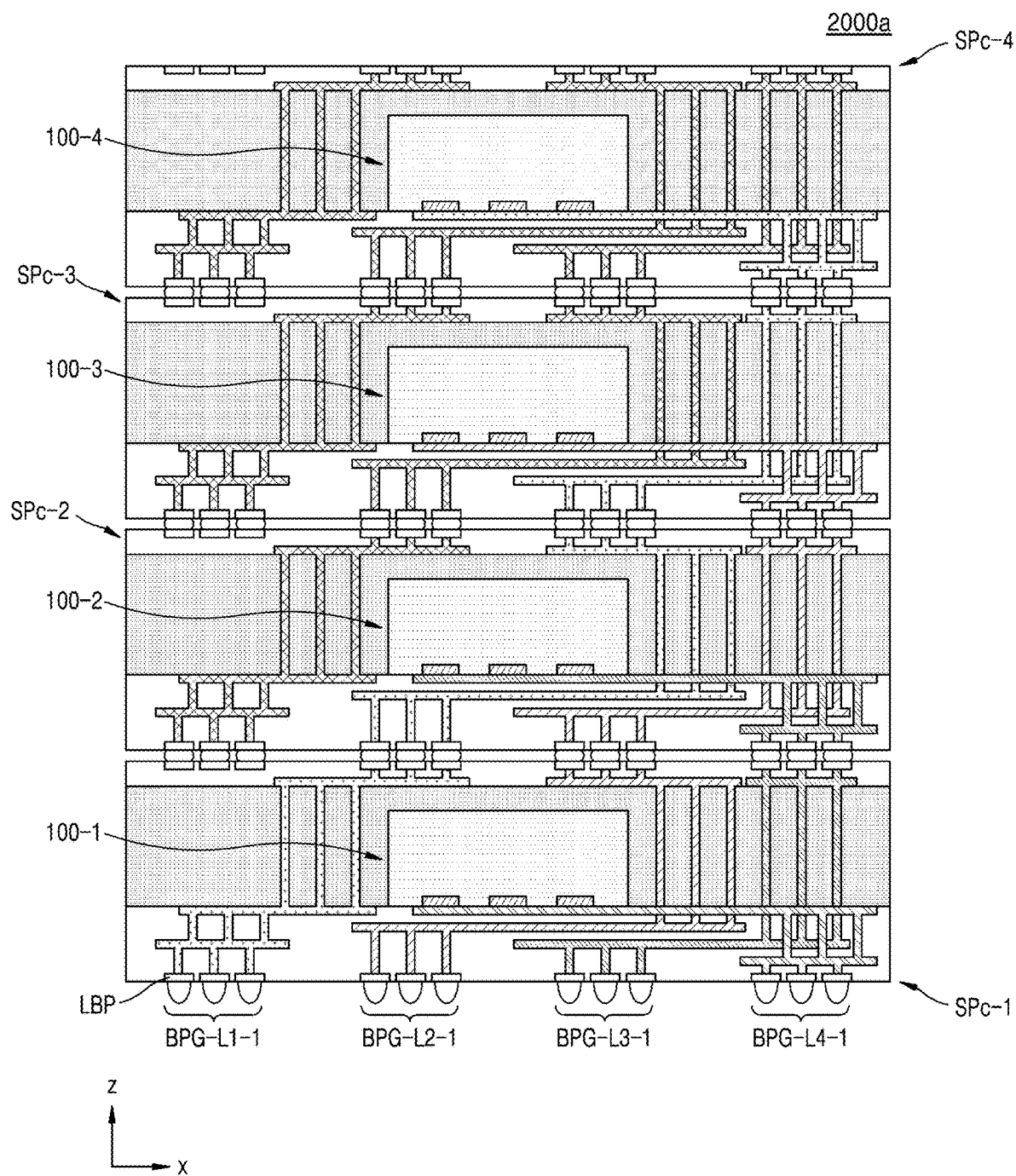

FIGS. 17A and 17B are cross-sectional views each illustrating a method of manufacturing a stacked package module having a semiconductor package and an electrical connection path in the stacked package module, according to an embodiment.

Referring to FIGS. 14 and 17A, a second semiconductor package SPc-2 is stacked on a first semiconductor package SPc-1. Each of the first semiconductor package SPc-1 and the second semiconductor package SPc-2 may be the semiconductor package SPc shown in FIG. 14. The second semiconductor package SPc-2 may be stacked on the first semiconductor package SPc-1 without being rotated in a horizontal direction based on the first semiconductor package SPc-1. That is, the second semiconductor package SPc-2 may be stacked on the first semiconductor package SPc-1 with the same left side and right side as that of the first semiconductor package SPc-1.

A semiconductor chip of the first semiconductor package SPc-1, that is, a first semiconductor chip 100-1, may be electrically connected to a fourth lower ball pad group BPG-L4-1 of the first semiconductor package SPc-1 through a chip-lower portion electrical connection path PCLc-1 of the first semiconductor package SPc-1.

A semiconductor chip of the second semiconductor package SPc-2, that is, a second semiconductor chip 100-2, may be electrically connected to a third lower ball pad group BPG-L3-1 of the first semiconductor package SPc-1 through a chip-lower portion electrical connection path PCLc-2 of the second semiconductor package SPc-2 and a second upper portion-lower portion electrical connection path PUL2c-1 of the first semiconductor package SPc-1.

Referring to FIGS. 14 and 17B, a stacked package module 2000a is formed by sequentially stacking a third semiconductor package SPc-3 and a fourth semiconductor package SPc-4 on the second semiconductor package SPc-2 stacked on the first semiconductor package SPc-1. Each of the third semiconductor package SPc-3 and the fourth semiconductor package SPc-4 may be the semiconductor package SPc shown in FIG. 14. The third semiconductor package SPc-3 may be stacked on the second semiconductor package SPc-2 without being rotated in a horizontal direction based on the second semiconductor package SPc-2, and the fourth semiconductor package SPc-4 may be stacked on the third semiconductor package SPc-3 without being rotated in a horizontal direction based on the third semiconductor package SPc-3. That is, in the stacked package module 2000a, left and right sides of the first semiconductor package SPc-1, the second semiconductor package SPc-2, the third semiconductor package SPc-3, and the fourth semiconductor package SPc-4 may be the same.

The lower ball pads LBP of a first lower ball pad group BPG-L1-1 of the first semiconductor package SPc-1 may function as an I/O terminal of a fourth semiconductor chip 100-4, the lower ball pads LBP of the second lower ball pad group BPG-L2-1 of the first semiconductor package SPc-1 may function as an I/O terminal of a third semiconductor chip 100-3, the lower ball pads LBP of the third lower ball pad group BPG-L3-1 of the first semiconductor package SPc-1 may function as an I/O terminal of the second semiconductor chip 100-2, and the lower ball pads LBP of the fourth lower ball pad group BPG-L4-1 of the first semiconductor package SPc-1 may function as an I/O terminal of the first semiconductor chip 100-1.

In the stacked package module 2000a according to inventive concepts, each of the first semiconductor package SPc-1, the second semiconductor package SPc-2, the third semiconductor package SPc-3, and the fourth semiconductor package SPc-4 may have a step-type electrical connection path, and the first semiconductor package SPc-1, the second semiconductor package SPc-2, the third semiconductor package SPb-3, and the fourth semiconductor package SPc-4 may be sequentially stacked by not being rotated in a horizontal direction.

Figure 18:
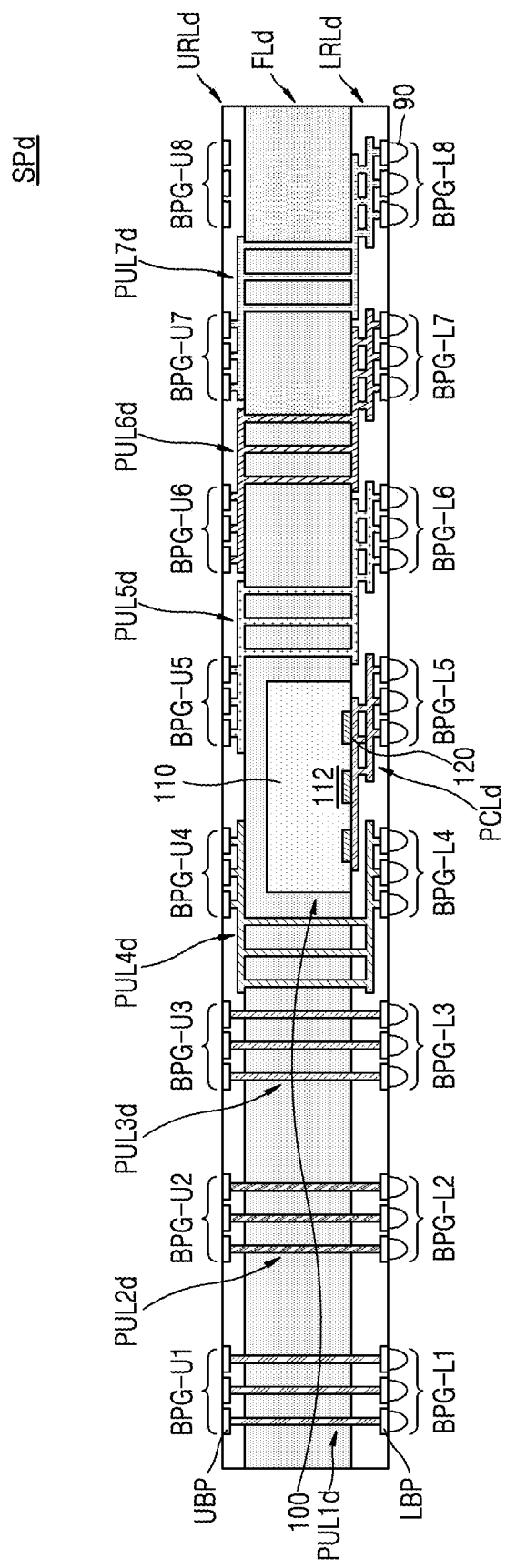
FIG. 18 is a cross-sectional view illustrating an electrical connection path in a semiconductor package according to an embodiment.
Figure 19:
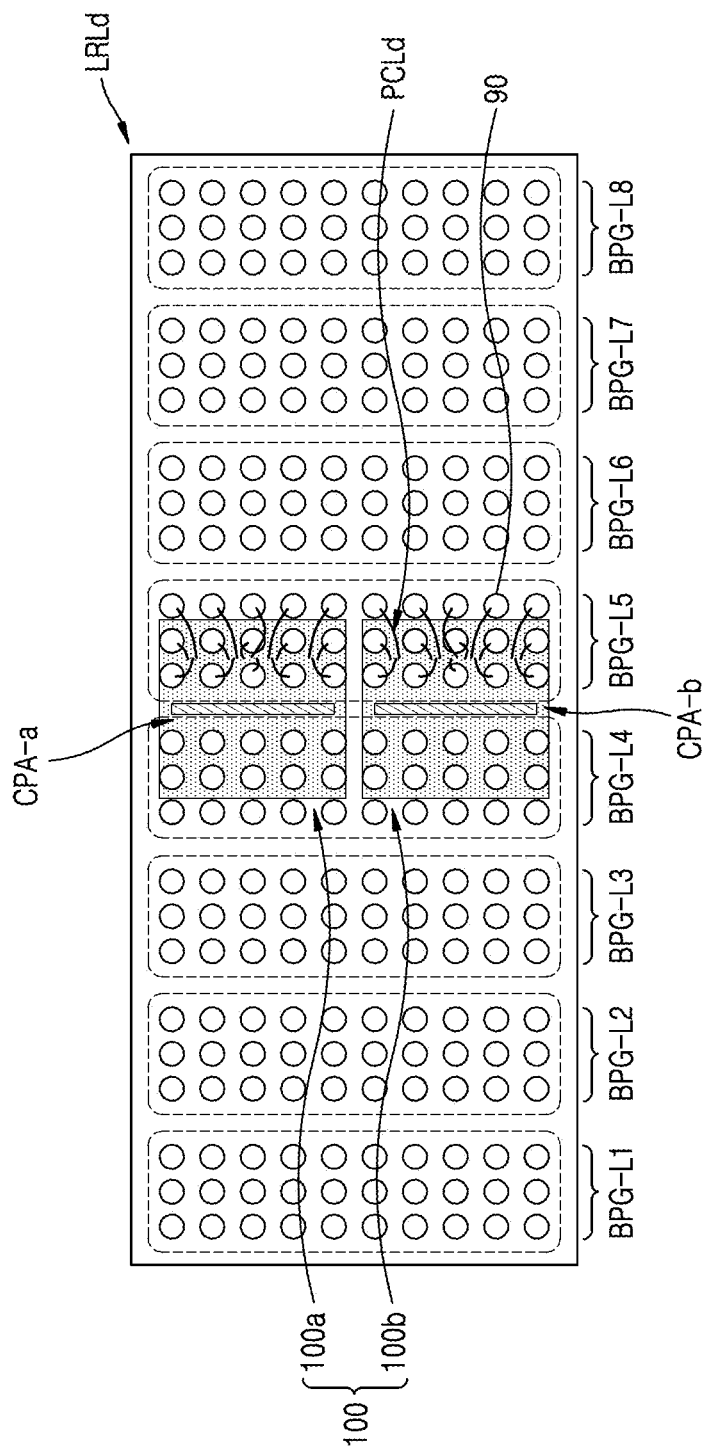
FIG. 19 is a plane view illustrating an electrical connection path between a semiconductor chip and a lower redistribution layer of a semiconductor package according to an embodiment.
Figure 20:
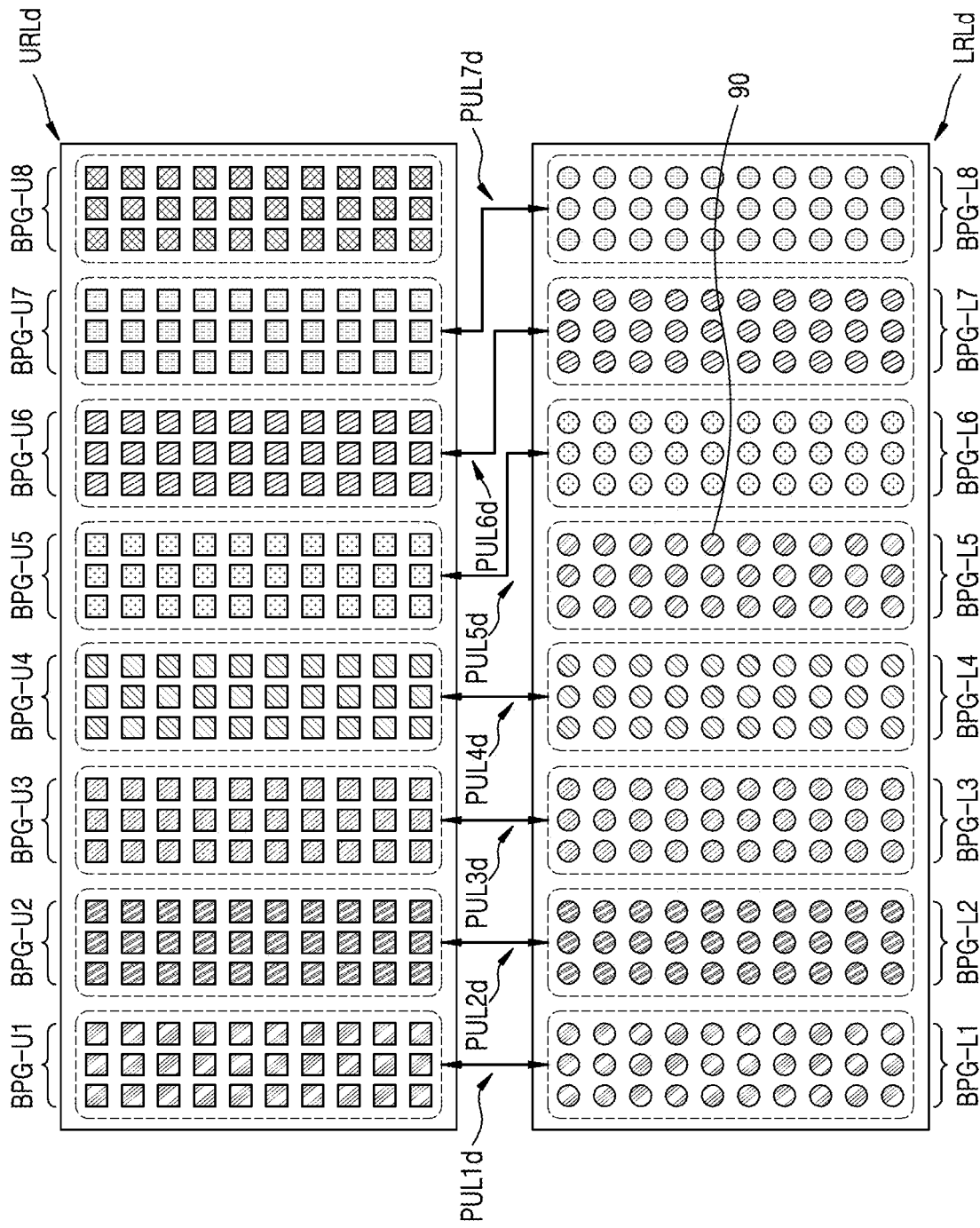
FIG. 20 is a plane view illustrating an electrical connection path between an upper redistribution layer and a lower redistribution layer of a semiconductor package according to an embodiment.

FIG. 18 is a cross-sectional view illustrating an electrical connection path in a semiconductor package SPd according to an embodiment, FIG. 19 is a plane view illustrating an electrical connection path between a semiconductor chip 100 and a lower redistribution layer LRLd of a semiconductor package according to an embodiment, and FIG. 20 is a plane view illustrating an electrical connection path between an upper redistribution layer URLd and the lower redistribution layer LRLd of a semiconductor package according to an embodiment.

Referring to FIG. 18, the semiconductor package SPd may include a lower redistribution layer LRLd, an expanded layer FLd on the lower redistribution layer LRLd, a semiconductor chip 100 in the expanded layer FLd, and an upper redistribution layer URLd on the expanded layer FLd and the semiconductor chip 100. The expanded layer FLd may surround the semiconductor chip 100.

The lower redistribution layer LRLd may include a first lower ball pad group BPG-L1, a second lower ball pad group BPG-L2, a third lower ball pad group BPG-L3, a fourth lower ball pad group BPG-L4, a fifth lower ball pad group BPG-L5, a sixth lower ball pad group BPG-L6, a seventh lower ball pad group BPG-L7, and an eighth lower ball pad group BPG-L8, and the upper redistribution layer URLd may include a first upper ball pad group BPG-U1, a second upper ball pad group BPG-U2, a third upper ball pad group BPG-U3, a fourth upper ball pad group BPG-U4, a fifth upper ball pad group BPG-U5, a sixth upper ball pad group BPG-U6, a seventh upper ball pad group BPG-U7, and an eighth upper ball pad group BPG-U8. In the lower redistribution layer LRLd, the first lower ball pad group BPG-L1, the second lower ball pad group BPG-L2, the third lower ball pad group BPG-L3, the fourth lower ball pad group BPG-L4, the fifth lower ball pad group BPG-L5, the sixth lower ball pad group BPG-L6, the seventh lower ball pad group BPG-L7, and the eighth lower ball pad group BPG-L8 may be arranged in rows in a horizontal direction. In the upper redistribution layer URLd, the first upper ball pad group BPG-U1, the second upper ball pad group BPG-U2, the third upper ball pad group BPG-U3, the fourth upper ball pad group BPG-U4, the fifth upper ball pad group BPG-U5, the sixth upper ball pad group BPG-U6, the seventh upper ball pad group BPG-U7, and the eighth upper ball pad group BPG-U8 may be arranged in rows in a horizontal direction.

The first upper ball pad group BPG-U1 and the first lower ball pad group BPG-L1 may be electrically connected through a first upper portion-lower portion electrical connection path PUL1d, the second upper ball pad group BPG-U2 and the second lower ball pad group BPG-L2 may be electrically connected through a second upper portion-lower portion electrical connection path PUL2d, the third upper ball pad group BPG-U3 and the third lower ball pad group BPG-L3 may be electrically connected through a third upper portion-lower portion electrical connection path PUL3d, the fourth upper ball pad group BPG-U4 and the fourth lower ball pad group BPG-L4 may be electrically connected through a fourth upper portion-lower portion electrical connection path PUL4d. The semiconductor chip 100 and the fifth lower ball pad group BPG-L5 may be electrically connected through a chip-lower portion electrical connection path PCLd. The fifth upper ball pad group BPG-U5 and the sixth lower ball pad group BPG-L6 may be electrically connected through a fifth upper portion-lower portion electrical connection path PUL5d, the sixth upper ball pad group BPG-U6 and the seventh lower ball pad group BPG-L7 may be electrically connected through a sixth upper portion-lower portion electrical connection path PUL6d, and the seventh upper ball pad group BPG-U7 and the eighth lower ball pad group BPG-L8 may be electrically connected through a seventh upper portion-lower portion electrical connection path PUL7d.

The eighth upper ball pad group BPG-U8 may be formed by dummy ball pads that are not electrically connected to the semiconductor chip 100 and the lower redistribution layer LRLd.

The first upper portion-lower portion electrical connection path PUL1d, the second upper portion-lower portion electrical connection path PUL2d, the third upper portion-lower portion electrical connection path PUL3d, and the fourth upper portion-lower portion electrical connection path PUL4d may be a vertical electrical connection path, and the fifth upper portion-lower portion electrical connection path PUL5d, the sixth upper portion-lower portion electrical connection path PUL6d, and the seventh upper portion-lower portion electrical connection path PUL7d may be a step-type electrical connection path.

Referring to FIGS. 18 and 19 together, the semiconductor chip 100 included in the semiconductor package SPd may include a first sub-semiconductor chip 100a and a second sub-semiconductor chip 100b. For example, a first chip pad array CPA-a and a second chip pad array CPA-b may be electrically connected to the fifth lower ball pad group BPG-L5. Although not illustrated in drawings, similar to that illustrated in FIG. 11A, the semiconductor package SPd may include one semiconductor chip 100.

Referring to FIGS. 18 to 20 together, the first upper ball pad group BPG-U1 and the first lower ball pad group BPG-L1 may be electrically connected through the first upper portion-lower portion electrical connection path PUL1d. The second upper ball pad group BPG-U2 and the second lower ball pad group BPG-L2 may be electrically connected through the second upper portion-lower portion electrical connection path PUL2d. The third upper ball pad group BPG-U3 and the third lower ball pad group BPG-L3 may be electrically connected through the third upper portion-lower portion electrical connection path PUL3d. The fourth upper ball pad group BPG-U4 and the fourth lower ball pad group BPG-L4 may be electrically connected through the fourth upper portion-lower portion electrical connection path PUL4d. The fifth lower ball pad group BPG-L5 may be connected to the semiconductor chip 100 through the chip-lower portion electrical connection path PCLd. The fifth upper ball pad group BPG-U5 and the sixth lower ball pad group BPG-L6 may be electrically connected through the fifth upper portion-lower portion electrical connection path PUL5d. The sixth upper ball pad group BPG-U6 and the seventh lower ball pad group BPG-L7 may be electrically connected through the sixth upper portion-lower portion electrical connection path PUL6d. The seventh upper ball pad group BPG-U7 and the eighth lower ball pad group BPG-L8 may be electrically connected through the seventh upper portion-lower portion electrical connection path PUL7d. The eighth upper ball pad group BPG-U8 may be formed by dummy ball pads.

Figure 21A:
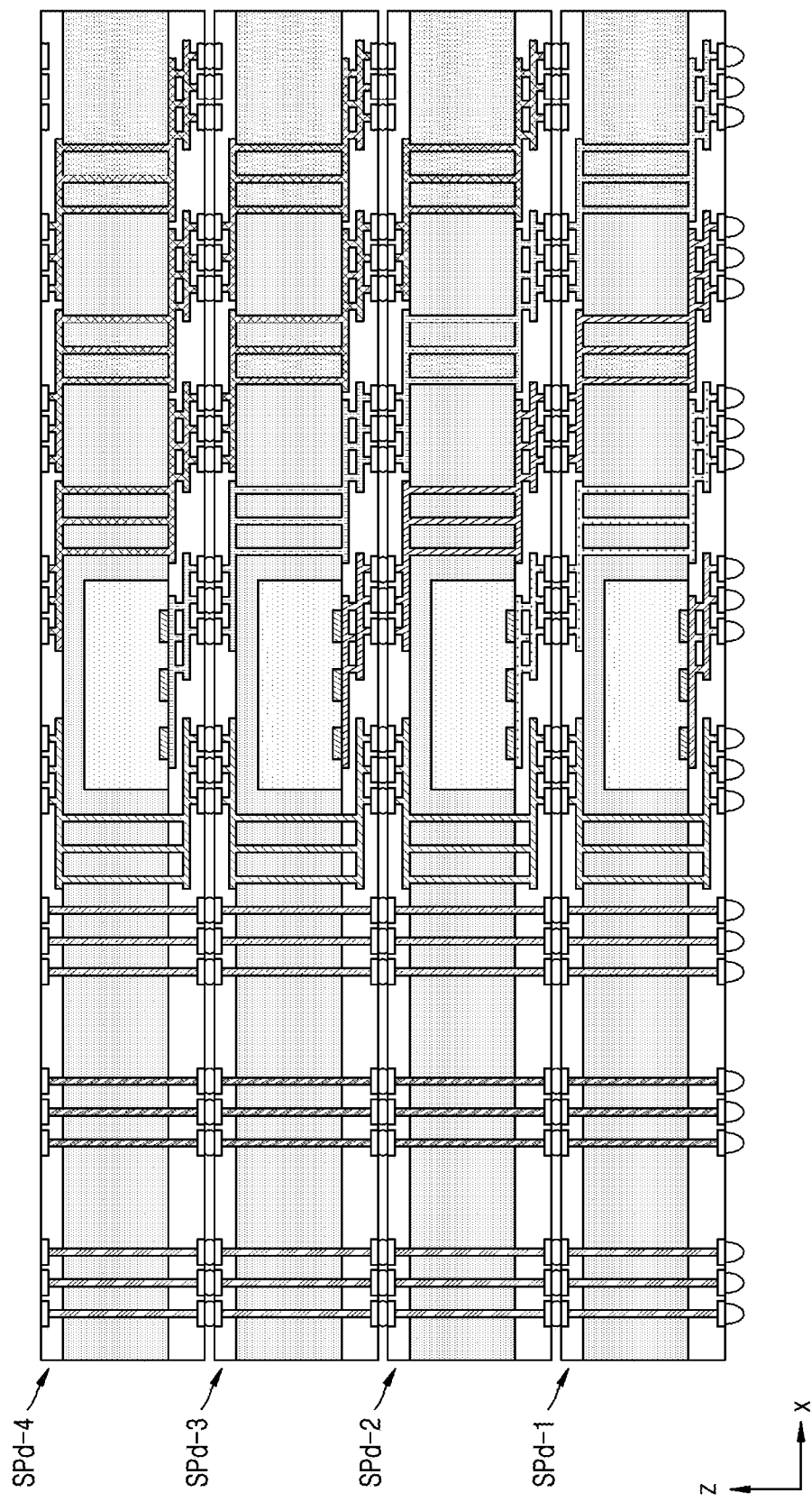
FIGS. 21A to 21C are cross-sectional views each illustrating a method of manufacturing a stacked package module having a semiconductor package and an electrical connection path in the stacked package module, according to an embodiment.
Figure 21B:
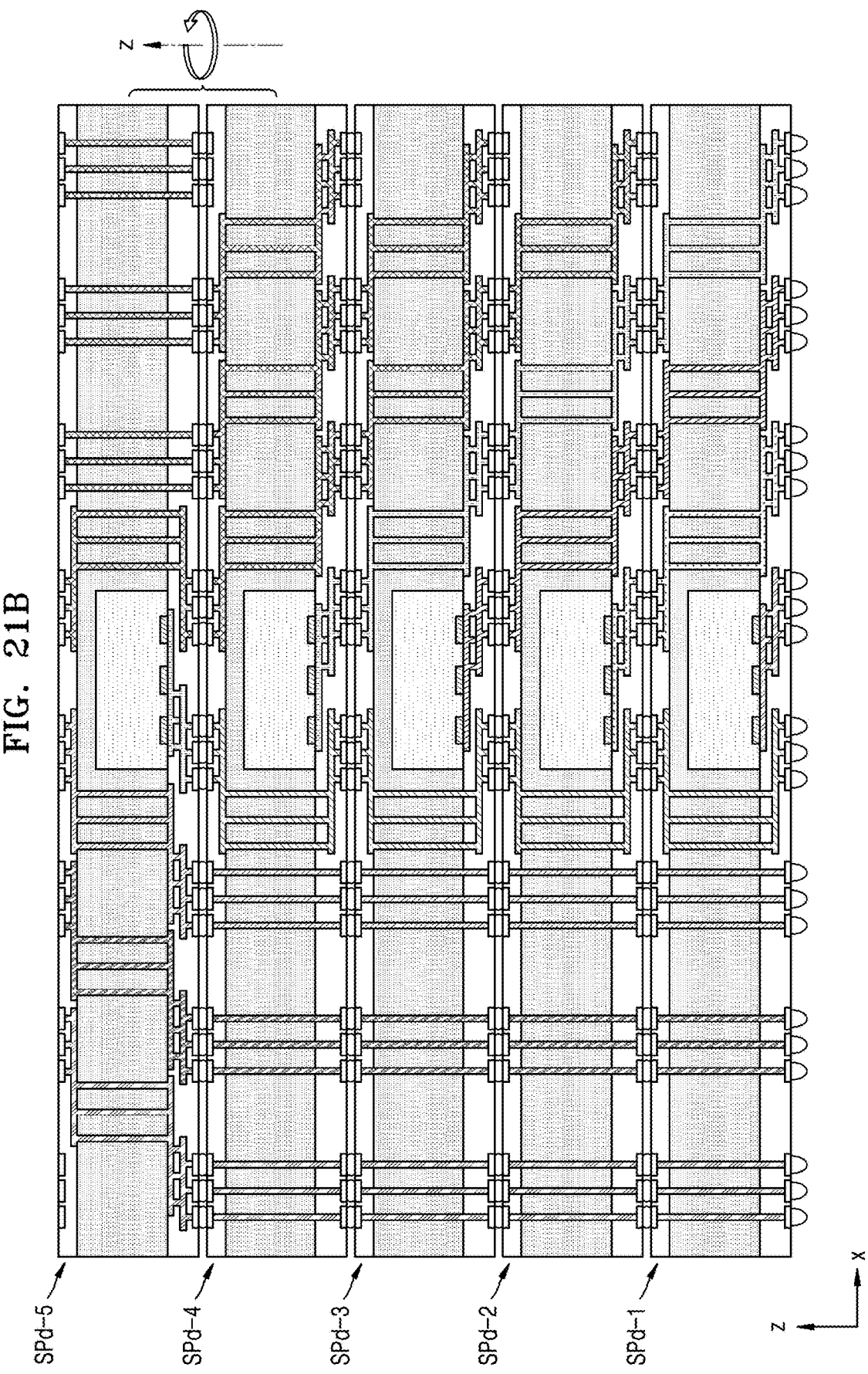
Figure 21C:
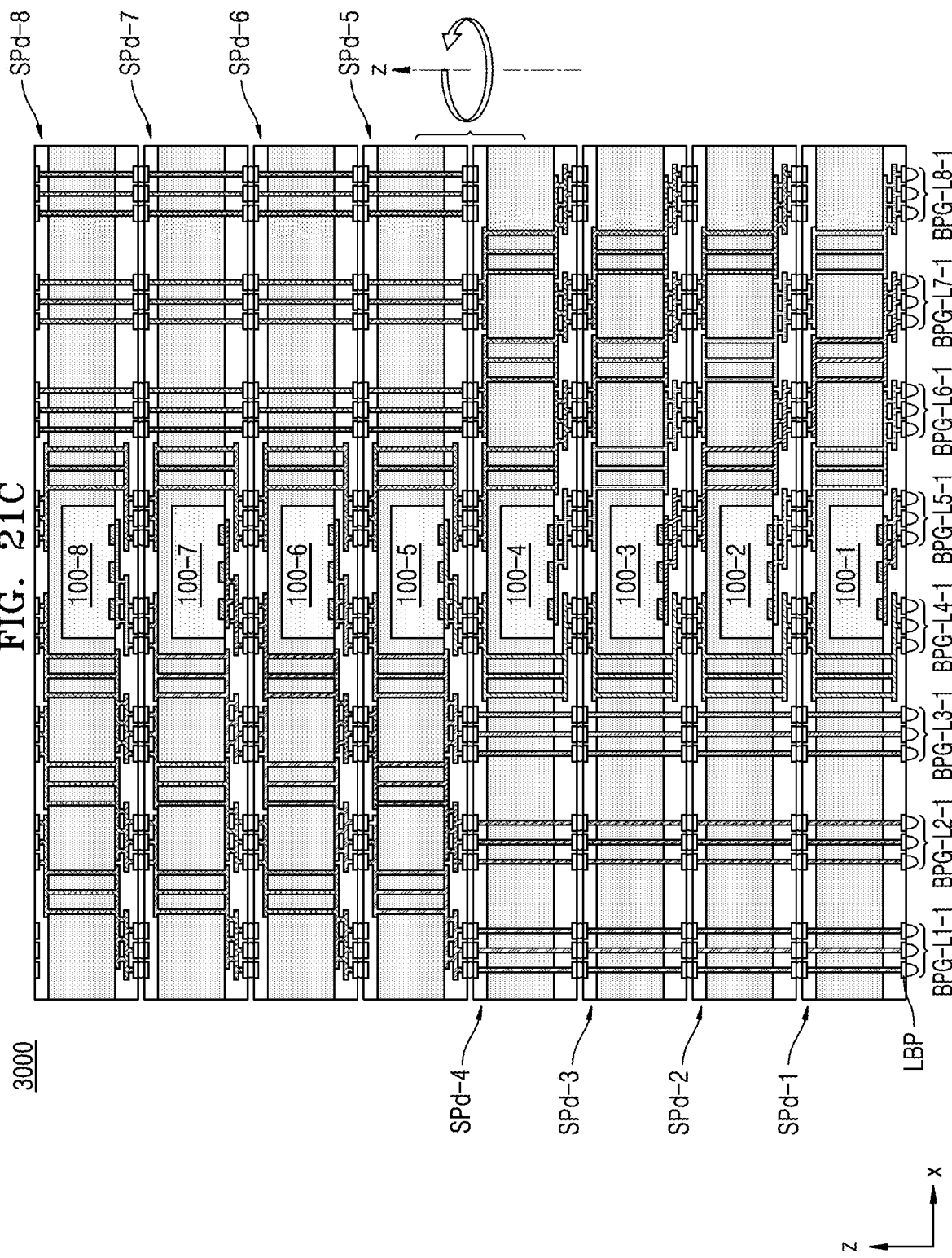

FIGS. 21A to 21C are cross-sectional views each illustrating a method of manufacturing a stacked package module having a semiconductor package and an electrical connection path in the stacked package module, according to an embodiment.

Referring to FIGS. 18 and 21A, a second semiconductor package SPd-2, a third semiconductor package SPd-3, and a fourth semiconductor package SPd-4 are sequentially stacked on a first semiconductor package SPd-1. Each of the first semiconductor package SPd-1, the second semiconductor package SPd-2, the third semiconductor package SPd-3, and the fourth semiconductor package SPd-4 may be the semiconductor package SPd shown in FIG. 18. The second semiconductor package SPd-2, the third semiconductor package SPd-3, and the fourth semiconductor package SPd-4 may be sequentially stacked on the first semiconductor package SPd-1 with being rotated in a horizontal direction based on the first semiconductor package SPd-1. That is, the second semiconductor package SPd-2, the third semiconductor package SPd-3, and the fourth semiconductor package SPd-4 may be sequentially stacked on the first semiconductor package SPd-1 with the same left sides and right sides as that of the first semiconductor package SPd-1.

Referring to FIGS. 18 and 21B, a fifth semiconductor package SPd-5 is stacked on the fourth semiconductor package SPd-4. The fifth semiconductor package SPd-5 may be the semiconductor package SPd shown in FIG. 18. The fifth semiconductor package SPd-5 may be stacked on the fourth semiconductor package SPd-4 by being rotated 180 degrees in a horizontal direction based on the first semiconductor package SPd-1, the second semiconductor package SPd-2, the third semiconductor package SPd-3, and the fourth semiconductor package SPd-4. That is, left and right sides of the fifth semiconductor package SPd-5 may be opposite to that of the first semiconductor package SPd-1, the second semiconductor package SPd-2, the third semiconductor package SPd-3, and the fourth semiconductor package SPd-4.

Referring to FIGS. 18 and 21C, a stacked package module 3000 is formed by sequentially stacking a sixth semiconductor package SPd-6, a seventh semiconductor package SPd-7, and an eighth semiconductor package SPd-8 on the fifth semiconductor package SPd-5. Each of the sixth semiconductor package SPd-6, the seventh semiconductor package SPd-7, and the eighth semiconductor package SPd-8 may be the semiconductor package SPd shown in FIG. 18. The sixth semiconductor package SPd-6, the seventh semiconductor package SPd-7, and the eighth semiconductor package SPd-8 may be stacked on the fifth semiconductor package SPd-5 without being rotated in a horizontal direction based on the fifth semiconductor package SPd-5. That is, in the stacked package module 3000, the left and right sides of the first semiconductor package SPd-1, the second semiconductor package SPd-2, the third semiconductor package SPd-3, and the fourth semiconductor package SPd-4 may be the same, left and right sides of the fifth semiconductor package SPd-5, the sixth semiconductor package SPd-6, the seventh semiconductor package SPd-7, and the eighth semiconductor package SPd-8 may be the same, and the left and right sides of the first semiconductor package SPd-1, the second semiconductor package SPd-2, the third semiconductor package SPd-3, and the fourth semiconductor package SPd-4 may be opposite to that of the fifth semiconductor package SPd-5, the sixth semiconductor package SPd-6, the seventh semiconductor package SPd-7, and the eighth semiconductor package SPd-8.

The lower ball pads LBP of a first lower ball pad group BPG-L1-1 of the first semiconductor package SPd-1 may function as an I/O terminal of an eighth semiconductor chip 100-8 of the eighth semiconductor package SPd-8, the lower ball pads LBP of a second lower ball pad group BPG-L2-1 of the first semiconductor package SPd-1 may function as an I/O terminal of a seventh semiconductor chip 100-7 of the seventh semiconductor package SPd-7, the lower ball pads LBP of a third lower ball pad group BPG-L3-1 of the first semiconductor package SPd-1 may function as an I/O terminal of a sixth semiconductor chip 100-6 of the sixth semiconductor package SPd-6, the lower ball pads LBP of a fourth lower ball pad group BPG-L4-1 of the first semiconductor package SPd-1 may function as an I/O terminal of a fifth semiconductor chip 100-5 of the fifth semiconductor package SPd-5, the lower ball pads LBP of a fifth lower ball pad group BPG-L5-1 of the first semiconductor package SPd-1 may function as an I/O terminal of a first semiconductor chip 100-1 of the first semiconductor package SPd-1, the lower ball pads LBP of a sixth lower ball pad group BPG-L6-1 of the first semiconductor package SPd-1 may function as an I/O terminal of a second semiconductor chip 100-2 of the second semiconductor package SPd-2, the lower ball pads LBP of a seventh lower ball pad group BPG-L7-1 of the first semiconductor package SPd-1 may function as an I/O terminal of a third semiconductor chip 100-3 of the third semiconductor package SPd-3, and the lower ball pads LBP of an eighth lower ball pad group BPG-L8-1 of the first semiconductor package SPd-1 may function as an I/O terminal of a fourth semiconductor chip 100-4 of the fourth semiconductor package SPd-4.

In the stacked package module 3000 according to inventive concepts, each of the first semiconductor package SPd-1, the second semiconductor package SPd-2, the third semiconductor package SPd-3, the fourth semiconductor package SPd-4, the fifth semiconductor package SPd-5, the sixth semiconductor package SPd-6, the seventh semiconductor package SPd-7, and the eighth semiconductor package SPd-8 may have a vertical electrical connection path and a step-type electrical connection path, the first semiconductor package SPd-1, the second semiconductor package SPd-2, the third semiconductor package SPd-3, and the fourth semiconductor package SPd-4 may be sequentially stacked with being rotated in a horizontal direction, and the fifth semiconductor package SPd-5, the sixth semiconductor package SPd-6, the seventh semiconductor package SPd-7, and the eighth semiconductor package SPd-8 may be sequentially stacked on the fourth semiconductor package SPd-4 by being rotated 180 degrees in a horizontal direction based on the first semiconductor package SPd-1, the second semiconductor package SPd-2, the third semiconductor package SPd-3, and the fourth semiconductor package SPd-4.

Figure 22A:
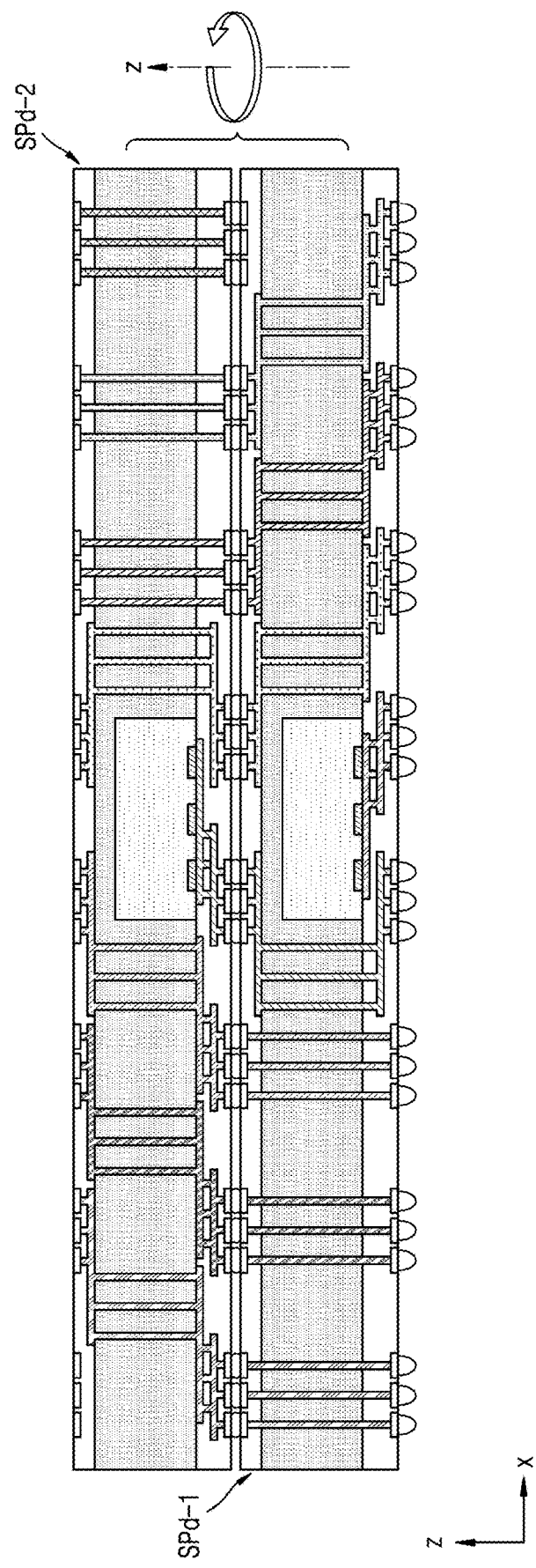

FIGS. 22A and 22B are cross-sectional views each illustrating a method of manufacturing a stacked package module having a semiconductor package and an electrical connection path in the stacked package module, according to an embodiment.

Referring to FIGS. 18 and 22A, a second semiconductor package SPd-2 is stacked on a first semiconductor package SPd-1. Each of the first semiconductor package SPd-1 and the second semiconductor package SPd-2 may be the semiconductor package SPd shown in FIG. 18. The second semiconductor package SPd-2 may be stacked on the first semiconductor package SPd-1 by being rotated 180 degrees in a horizontal direction based on the first semiconductor package SPd-1. That is, right and left sides of the first semiconductor package SPd-1 may be opposite to that of the second semiconductor package SPd-2.

Referring to FIGS. 18 and 22B, a semiconductor package module 3000a is formed by sequentially stacking the third semiconductor package SPd-3, the fourth semiconductor package SPd-4, the fifth semiconductor package SPd-5, the sixth semiconductor package SPd-6, the seventh semiconductor package SPd-7, and the eighth semiconductor package SPd-8 on the second semiconductor package SPd-2. Each of the third semiconductor package SPd-3, the fourth semiconductor package SPd-4, the fifth semiconductor package SPd-5, the sixth semiconductor package SPd-6, the seventh semiconductor package SPd-7, and the eighth semiconductor package SPd-8 may be the semiconductor package SPd shown in FIG. 18. The third semiconductor package SPd-3, the fourth semiconductor package SPd-4, and the fifth semiconductor package SPd-5, the sixth semiconductor package SPd-6, the seventh semiconductor package SPd-7, and the eighth semiconductor package SPd-8 may be respectively stacked on the second semiconductor package SPd-2, the third semiconductor package SPd-3, the fourth semiconductor package SPd-4, the fifth semiconductor package SPd-5, the sixth semiconductor package SPd-6, and the seventh semiconductor package SPd-7 by being respectively rotated 180 degrees in a horizontal direction based on the second semiconductor package SPd-2, the third semiconductor package SPd-3, the fourth semiconductor package SPd-4, the fifth semiconductor package SPd-5, the sixth semiconductor package SPd-6, and the seventh semiconductor package SPd-7. That is, in the semiconductor package module 3000a, left and right sides of the first semiconductor package SPd-1, the third semiconductor package SPd-3, the fifth semiconductor package SPd-5, and the seventh semiconductor package SPd-7 may be the same, left and right sides of the second semiconductor package SPd-2, the fourth semiconductor package SPd-4, the sixth semiconductor package SPd-6, and the eighth semiconductor package SPd-8 may be the same, and left and right sides of the first semiconductor package SPd-1, the third semiconductor package SPd-3, the fifth semiconductor package SPd-5, and the seventh semiconductor package SPd-7 may be opposite to that of the second semiconductor package SPd-2, the fourth semiconductor package SPd-4, the sixth semiconductor package SPd-6, and the eighth semiconductor package SPd-8.

The lower ball pads LBP of a first lower ball pad group BPG-L1-1 of the first semiconductor package SPd-1 may function as an I/O terminal of an eighth semiconductor chip 100-8 of the eighth semiconductor package SPd-8, the lower ball pads LBP of a second lower ball pad group BPG-L2-1 of the first semiconductor package SPd-1 may function as an I/O terminal of a sixth semiconductor chip 100-6 of the sixth semiconductor package SPd-6, the lower ball pads LBP of a third lower ball pad group BPG-L3-1 of the first semiconductor package SPd-1 may function as an I/O terminal of a fourth semiconductor chip 100-4 of the fourth semiconductor package SPd-4, the lower ball pads LBP of the fourth lower ball pad group BPG-L4-1 of the first semiconductor package SPd-1 may function as an I/O terminal of a second semiconductor chip 100-2 of the second semiconductor package SPd-2, the lower ball pads of a fifth lower ball pad group BPG-L5-1 of the first semiconductor package SPd-1 may function as an I/O terminal of a first semiconductor chip 100-1 of the first semiconductor package SPd-1, the lower ball pads LBP of a sixth lower ball pad group BPG-L6-1 of the first semiconductor package SPd-1 may function as an I/O terminal of a third semiconductor chip 100-3 of the third semiconductor package SPd-3, the lower ball pads LBP of a seventh lower ball pad group BPG-L7-1 of the first semiconductor package SPd-1 may function as an I/O terminal of a fifth semiconductor chip 100-5 of the fifth semiconductor package SPd-5, and the lower ball pads LBP if ab eighth lower ball pad group BPG-L8-1 of the first semiconductor package SPd-1 may function as an I/O terminal of a seventh semiconductor chip 100-7 of the seventh semiconductor package SPd-7.

In the semiconductor package module 3000a according to inventive concepts, each of the first semiconductor package SPd-1, the second semiconductor package SPd-2, the third semiconductor package SPd-3, the fourth semiconductor package SPd-4, the fifth semiconductor package SPd-5, the sixth semiconductor package SPd-6, the seventh semiconductor package SPd-7, and the eighth semiconductor package SPd-8 may have a vertical connection path and a step-type connection path, and the second semiconductor package SPd-2, the third semiconductor package SPd-3, the fourth semiconductor package SPd-4, the fifth semiconductor package SPd-5, the sixth semiconductor package SPd-6, the seventh semiconductor package SPd-7, and the eighth semiconductor package SPd-8 may be sequentially stacked on the first semiconductor package SPd-1 by being alternatively rotated 180 degrees in a horizontal direction.

Figure 23:
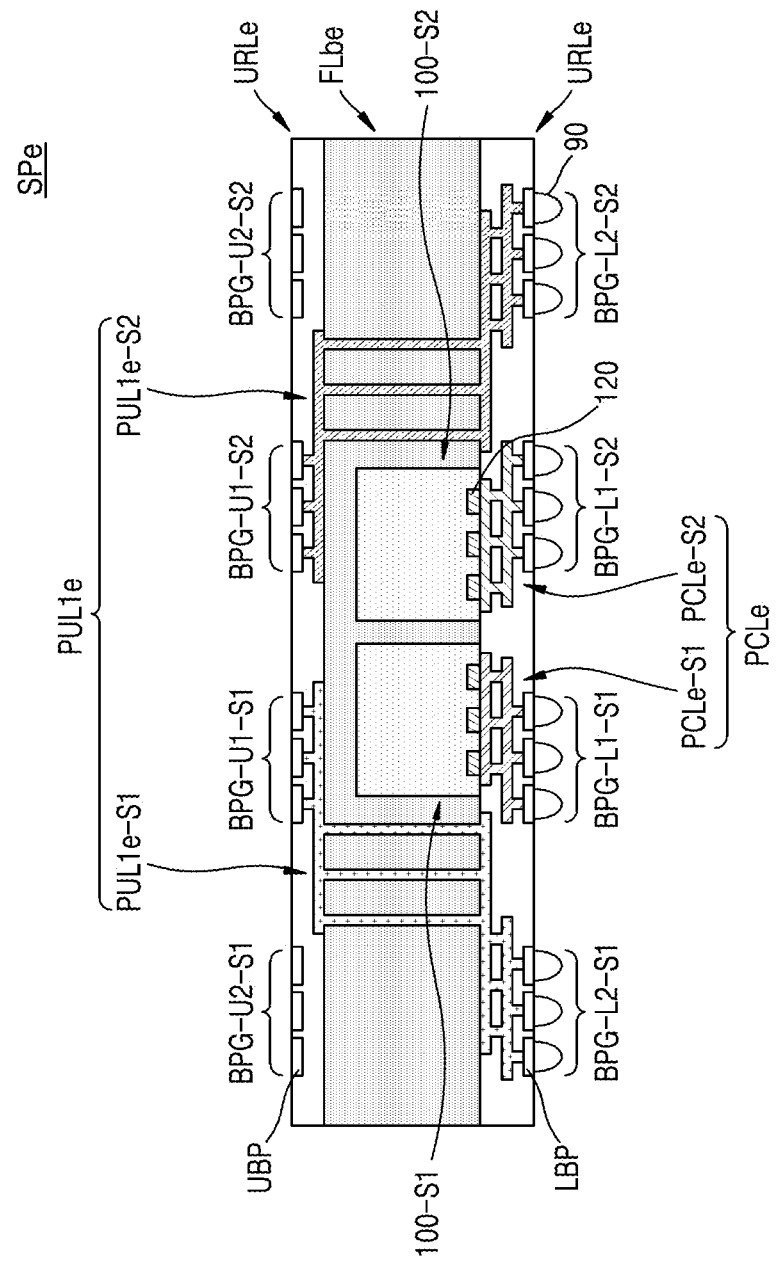
FIG. 23 is a cross-sectional view illustrating an electrical connection path in a semiconductor package according to an embodiment.
Figure 24A:
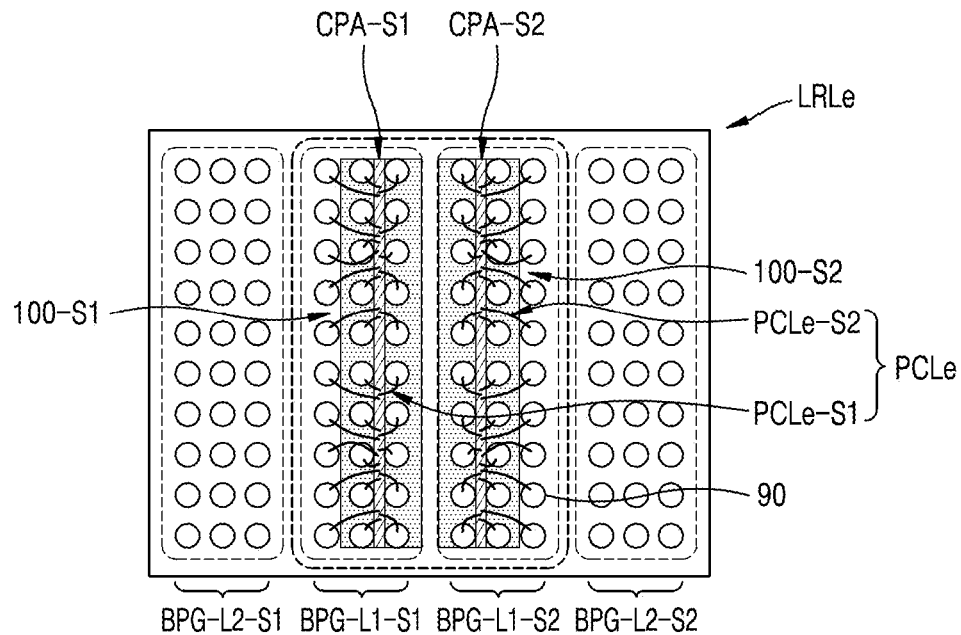
FIGS. 24A and 24B are plane views each illustrating an electrical connection path between a semiconductor chip (sub-semiconductor chips) and a lower redistribution layer of a semiconductor package according to embodiments.
Figure 24B:
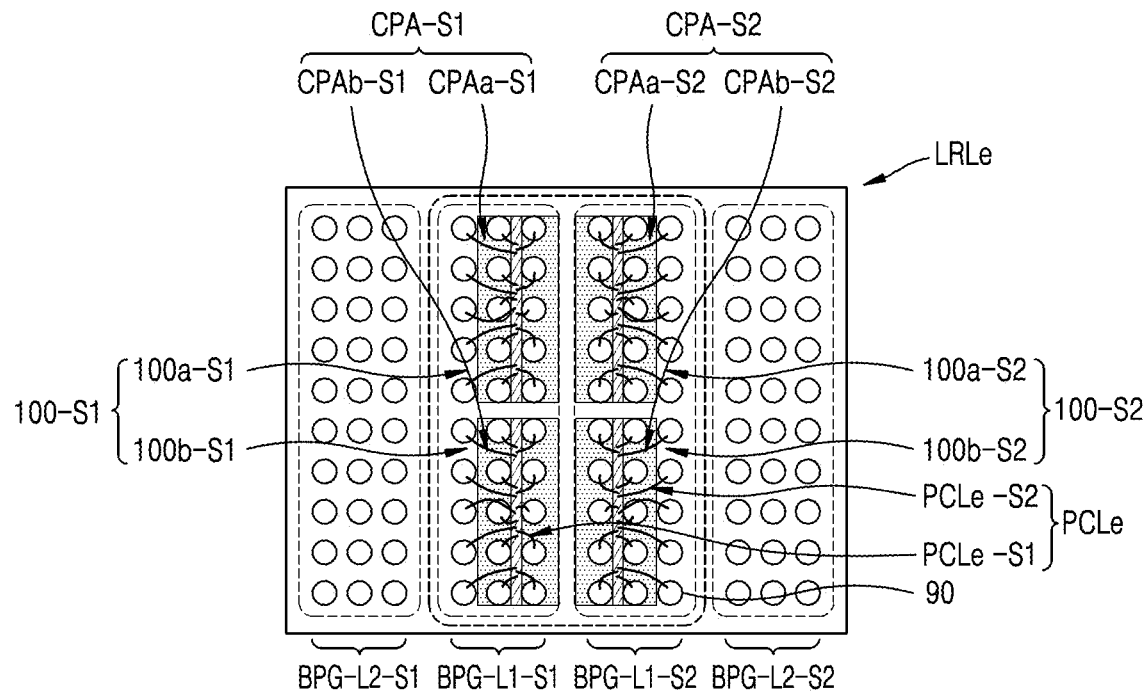
Figure 25:
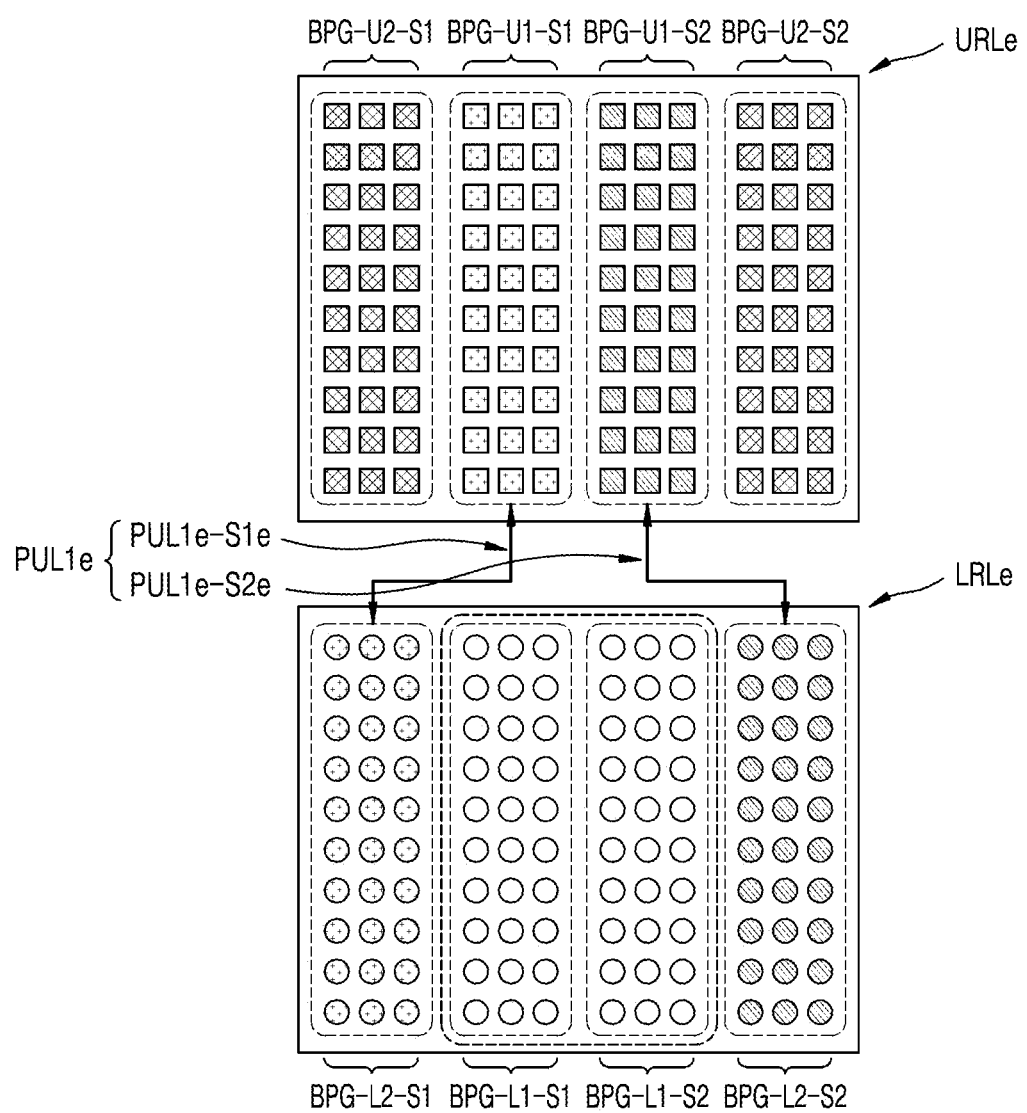
FIG. 25 is a plane view illustrating an electrical connection path between an upper redistribution layer and a lower redistribution layer of a semiconductor package according to an embodiment.

FIG. 23 is a cross-sectional view illustrating an electrical connection path in a semiconductor package SPe according to an embodiment, FIGS. 24A and 24B are plane views each illustrating an electrical connection path between a semiconductor chip (sub-semiconductor chips) and a lower redistribution layer LRLe of a semiconductor package according to embodiments, and FIG. 25 is a plane view illustrating an electrical connection path between an upper redistribution layer URLe and the lower redistribution layer LRLe of a semiconductor package according to an embodiment.

Referring to FIG. 23, the semiconductor package SPe may include a lower redistribution layer LRLe, an expanded layer FLe on the lower redistribution layer LRLe, a semiconductor chip in the expanded layer FLe, and an upper redistribution layer URLe on the expanded layer FLe and the semiconductor chip. The semiconductor chip may include an odd semiconductor chip 100-S1 and an even semiconductor chip 100-S2. The expanded layer FLe may surround the odd semiconductor chip 100-S1 and the even semiconductor chip 100-S2.

The lower redistribution layer LRLe may include a first lower ball pad group and a second lower ball pad group, and the upper redistribution layer URLe may include a first upper ball pad group and a second upper ball pad group. The first lower ball pad group may include a first odd lower ball pad group BPG-L1-S1 and a second even lower ball pad group BPG-L1-S2, and the second lower ball pad group may include a second odd lower ball pad group BPG-L2-S1 and a second even lower ball pad group BPG-L2-S2. The first upper ball pad group may include a first odd upper ball pad group BPG-U1-S1 and a first even upper ball pad group BPG-U1-S2, and the second upper ball pad group may include a second odd upper ball pad group BPG-U2-S1 and a second even upper ball pad group BPG-U2-S2.

The first upper ball pad group and the second lower ball pad group may be electrically connected through a first upper portion-lower portion electrical connection path PUL1e. The first upper portion-lower portion electrical connection path PUL1e may include a first odd upper portion-lower portion electrical connection path PUL1e-S1 electrically connecting the first odd upper ball pad group BPG-U1-S1 to the second odd lower ball pad group BPG-L2-S1, and a first even upper portion-lower portion electrical connection path PUL1e-S2 electrically connecting the first even upper ball pad group BPG-U1-S2 to the second even lower ball pad group BPG-L2-S2.

The semiconductor chip and the first lower ball pad group may be electrically connected through a chip-lower portion electrical connection path PCLe. The chip-lower portion electrical connection path PCLe may include an odd chip-lower portion electrical connection path PCLe-S1 electrically connecting the odd semiconductor chip 100-S1 to the first odd lower ball pad group BPG-L1-S1, and an even chip-lower portion electrical connection path PCLe-S2 electrically connecting the even semiconductor chip 100-S2 to the first even lower ball pad group BPG-L1-S2. The second upper ball pad group including the second odd upper ball pad group BPG-U2-S1 and the second even upper ball pad group BPG-U2-S2 may be formed by dummy ball pads that are not electrically connected to the odd semiconductor chip 100-S1, the even semiconductor chip 100-S2, and the lower redistribution layer LRLe.

The first odd upper portion-lower portion electrical connection path PUL1e-S1 and the first even upper portion-lower portion electrical connection path PUL1e-S2 may be a step-type electrical connection path.

Referring to FIGS. 23 and 24A together, the semiconductor package SPe may include the odd semiconductor chip 100-S1 and the even semiconductor chip 100-S2. A plurality of chip connection pads 120 of the odd semiconductor chip 100-S1 may form an odd chip pad array CPA-S1, and a plurality of chip connection pads 120 of the even semiconductor chip 100-S2 may form an even chip pad array CPA-S2. The odd chip pad array CPA-S1 may be electrically connected to the first odd lower ball pad group BPG-L1-S1, and the even chip pad array CPA-S2 may be electrically connected to the first even lower ball pad group BPG-L1-S2.

The plurality of chip connection pads 120 of the odd semiconductor chip 100-S1 and the lower ball pads LBP of the first odd lower ball pad group BPG-L1-S1 may be electrically connected through the odd chip-lower portion electrical connection path PCLe-S1, and the plurality of chip connection pads 120 of the even semiconductor chip 100-S2 and the lower ball pads LBP of the first even lower ball pad group BPG-L1-S2 may be electrically connected through the even chip-lower portion electrical connection path PCLe-S2.

Referring to FIGS. 23 and 24B together, the odd semiconductor chip 100-S1 included in the semiconductor package SPe may include a first odd sub-semiconductor chip 100a-S1 and a second odd sub-semiconductor chip 100b-S1, and the even semiconductor chip 100-S2 may include a first even sub-semiconductor chip 100a-S2 and a second even sub-semiconductor chip 100b-S2. A plurality of chip connection pads 120 of the first odd sub-semiconductor chip 100a-S1 may form a first odd chip pad array CPAa-S1, a plurality of chip connection pads 120 of the second odd sub-semiconductor chip 100b-S1 may form a second odd chip pad array CPAb-S1, a plurality of chip connection pads 120 of the first even sub-semiconductor chip 100a-S2 may form a first even chip pad array CPAa-S2, and a plurality of chip connection pads 120 of the second even sub-semiconductor chip 100b-S2 may form a second even chip pad array CPAb-S2.

Referring to FIGS. 23 to 25 together, the upper ball pads UBP of the first odd upper ball pad group BPG-U1-S1 and the lower ball pads LBP of the second odd lower ball pad group BPG-L2-S1 may be electrically connected through the first odd upper portion-lower portion electrical connection path PUL1e-S1. The upper ball pads UBP of the first even upper ball pad group BPG-U1-S2 and the lower ball pads LBP of the second even lower ball pad group BPG-L2-S2 may be electrically connected through the first even upper portion-lower portion electrical connection path PUL1e-S2.

The odd semiconductor chip 100-S1 and the first odd lower ball pad group BPG-L1-S1 may be electrically connected through the odd chip-lower portion electrical connection path PCLe-S1, and the even semiconductor chip 100-S2 and the first even lower ball pad group BPG-L1-S2 may be electrically connected through the even chip-lower portion electrical connection path PCLe-S2.

Each of upper ball pads UBP of the second odd upper ball pad group BPG-U2-S1 and the second even upper ball pad group BPG-U2-S2 may be a dummy ball pad.

Figure 26:
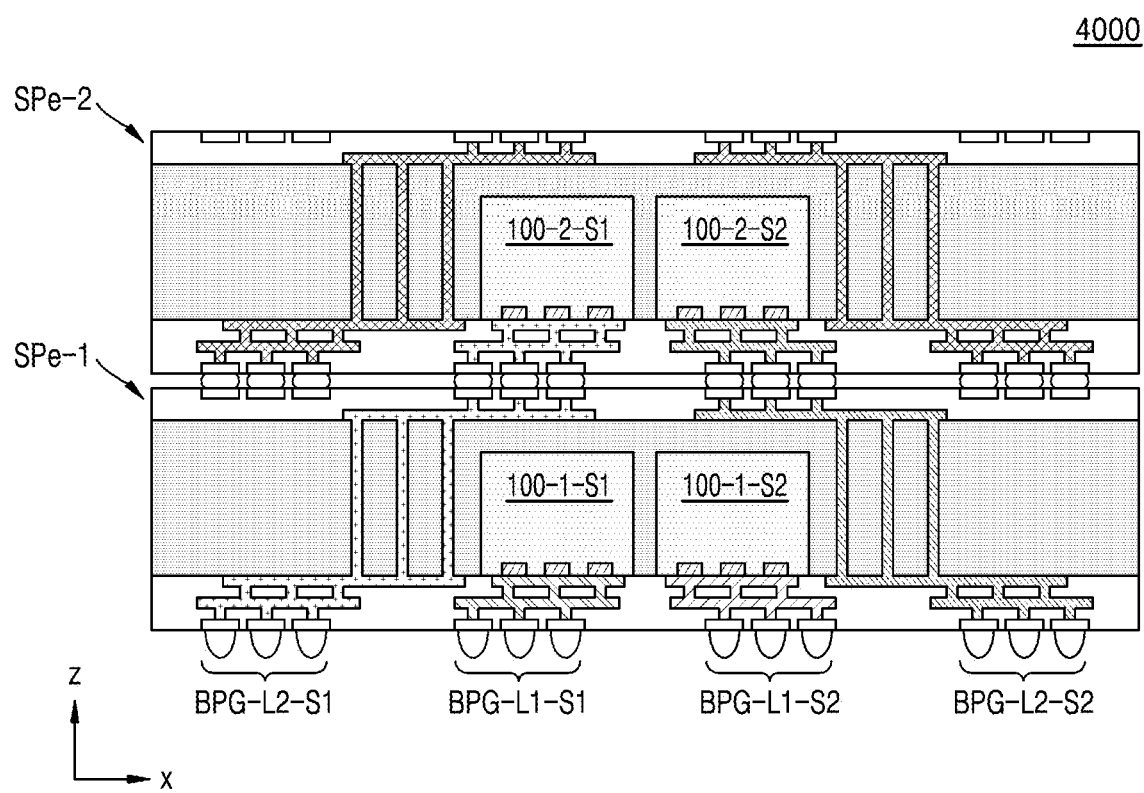
FIG. 26 is a cross-sectional view illustrating a method of manufacturing a stacked package module having a semiconductor package and an electrical connection path in the stacked package module, according to an embodiment.

FIG. 26 is a cross-sectional view illustrating a method of manufacturing a stacked package module 4000 having a semiconductor package and an electrical connection path in the stacked package module 4000, according to an embodiment.

Referring to FIGS. 23 to 26, the stacked package module 4000 is formed by stacking a second semiconductor package SPe-2 on a first semiconductor package SPe-1. Each of the first semiconductor package SPe-1 and the second semiconductor package SPe-2 may be the semiconductor package SPe shown in FIG. 23. In some embodiments, the second semiconductor package SPe-2 may be stacked on the first semiconductor package SPe-1 without being rotated in a horizontal direction based on the first semiconductor package SPe-1. In some other embodiments, the second semiconductor package SPe-2 may be stacked on the first semiconductor package SPe-1 by being rotated 180 degrees in a horizontal direction based on the first semiconductor package SPe-1.

The lower ball pads LBP of each of the first odd lower ball pad group BPG-L1-S1 and the first even lower ball pad group BPG-L1-S2 of the first semiconductor package SPe-1 may function as an I/O terminal of each of a first odd semiconductor chip 100-1-S1 and a first even semiconductor chip 100-1-S2 included in the first semiconductor package SPe-1.

In some embodiments, the lower ball pads LBP of each of the second odd lower ball pad group BPG-L2-S1 and the second even lower ball pad group BPG-L2-S2 of the first semiconductor package SPe-1 may function as an I/O terminal of each of a second odd semiconductor chip 100-2-S1 and a second even semiconductor chip 100-2-S2 included in the second semiconductor package SPe-2. In some other embodiments, the lower ball pads LBP of each of the second odd lower ball pad group BPG-L2-S1 and the second even lower ball pad group BPG-L2-S2 of the first semiconductor package SPe-1 may function as an I/O terminal of each of the second even semiconductor chip 100-2-S2 and the second odd semiconductor chip 100-2-S1 included in the second semiconductor package SPe-2.

Figure 27:
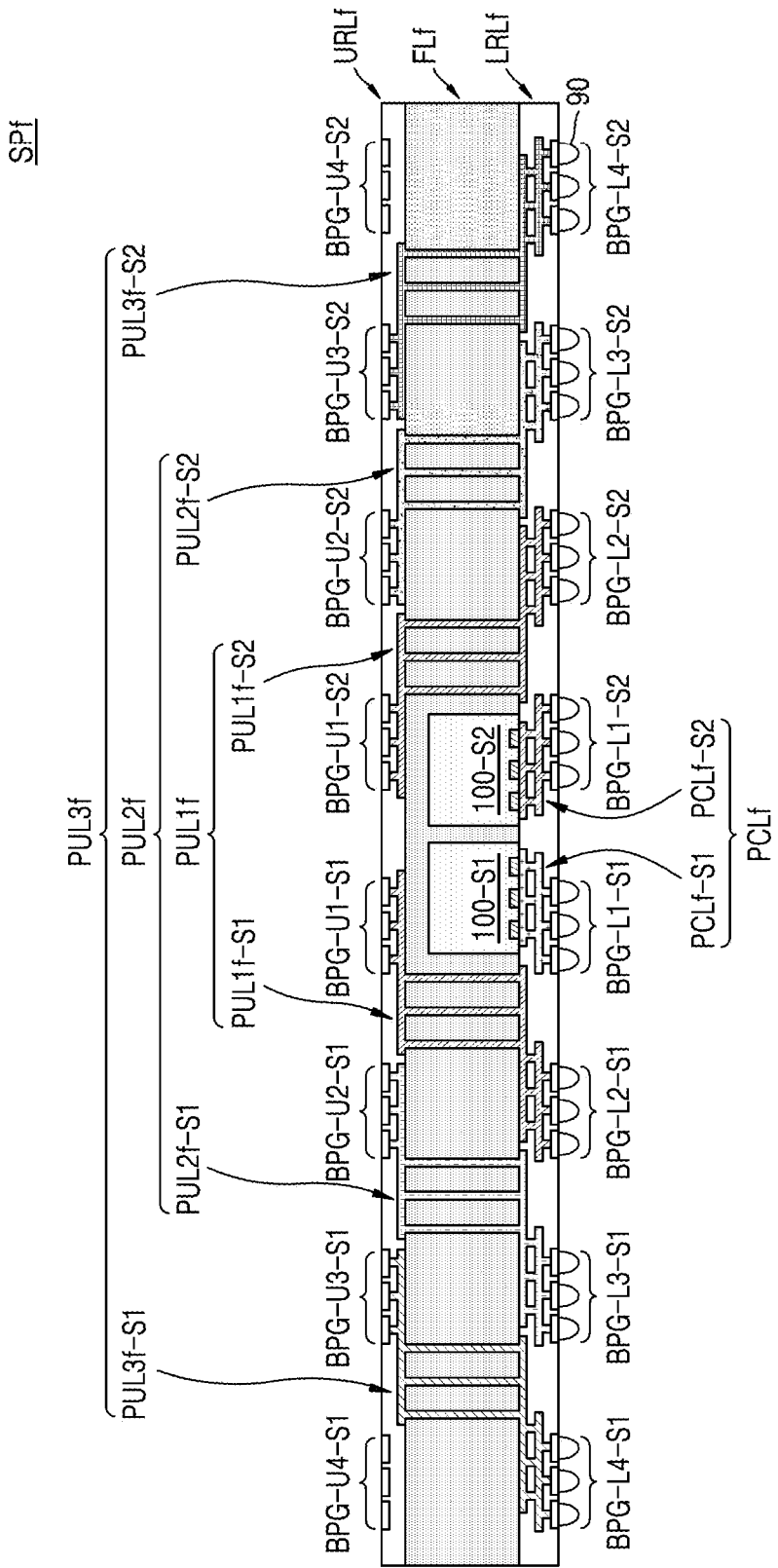
FIG. 27 is a cross-sectional view illustrating an electrical connection path in a semiconductor package according to an embodiment.
Figure 28:
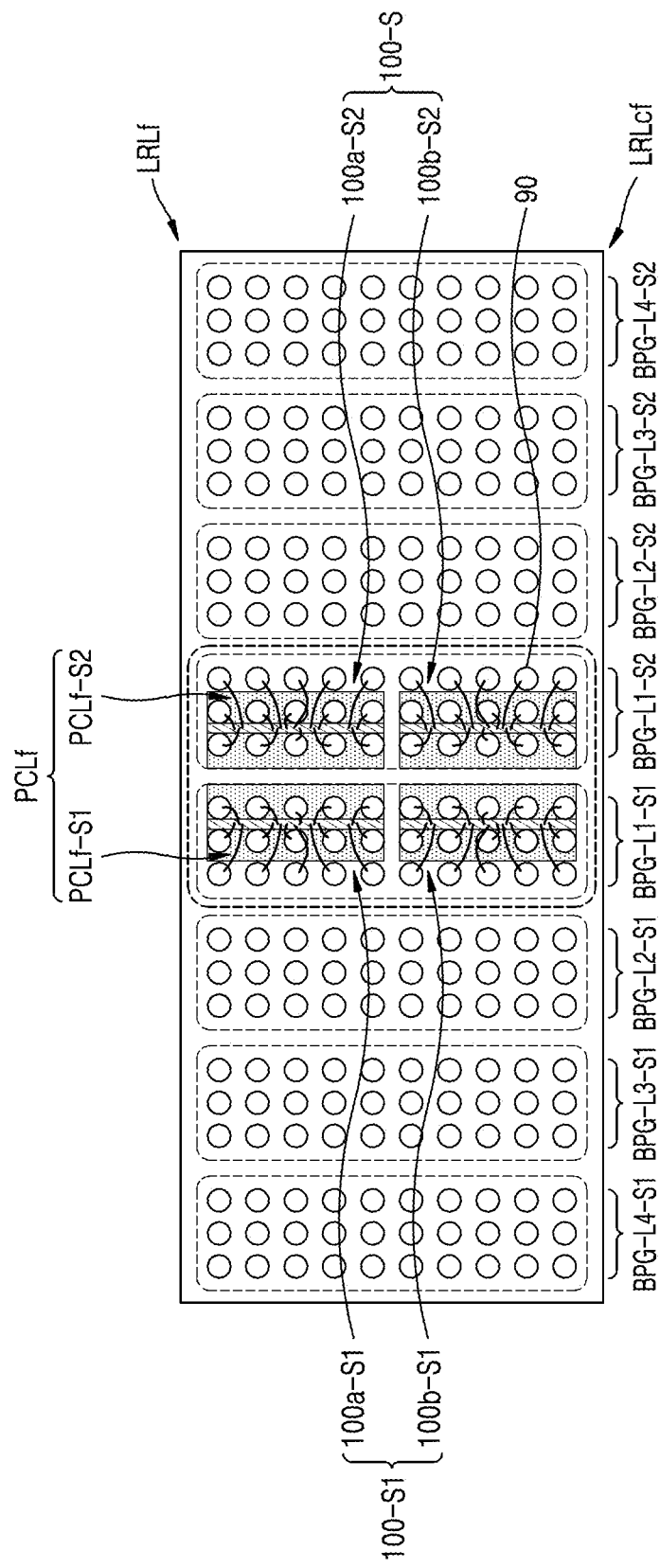
FIG. 28 is a plane view illustrating an electrical connection path between a semiconductor chip and a lower redistribution layer of a semiconductor package according to an embodiment.
Figure 29:
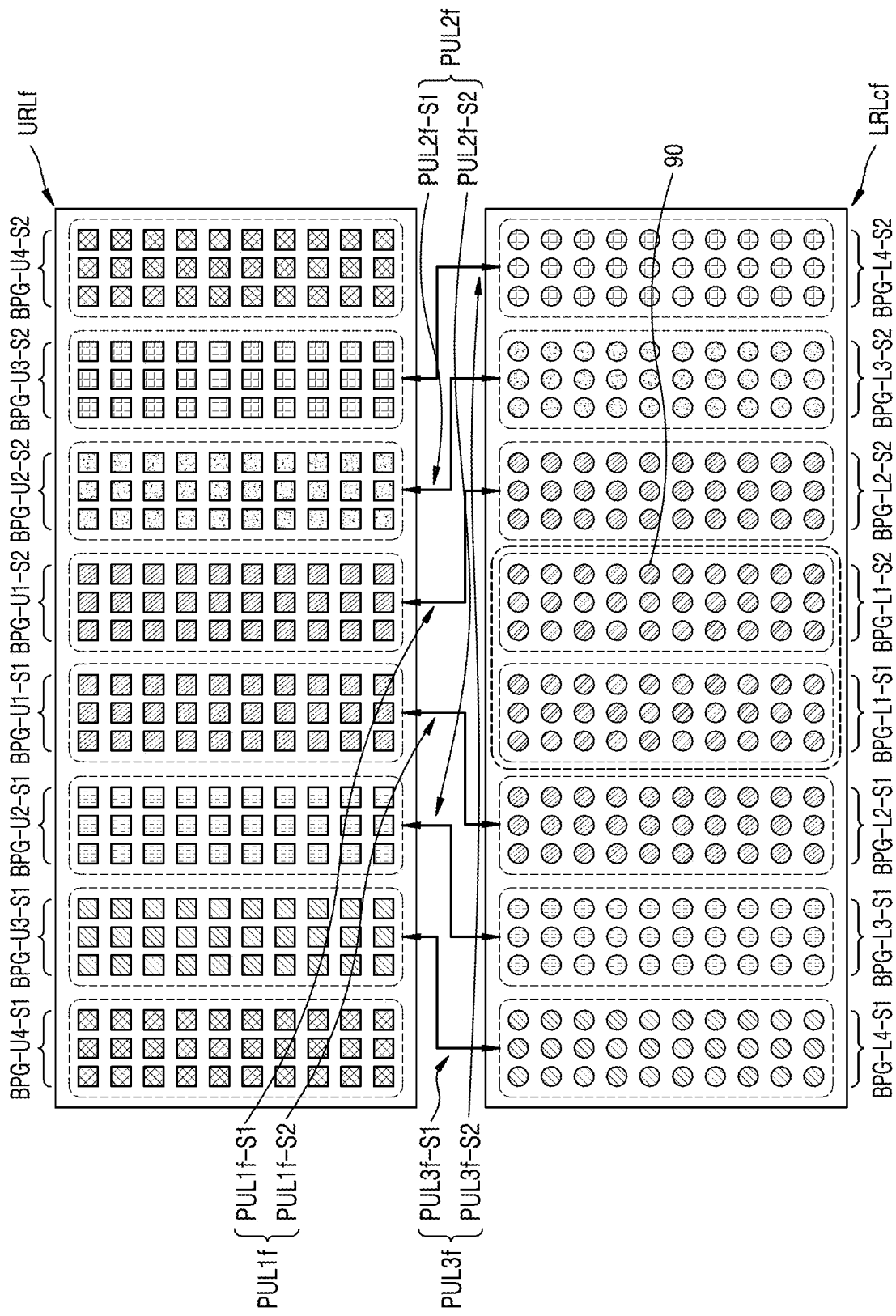
FIG. 29 is a plane view illustrating an electrical connection path between an upper redistribution layer and a lower redistribution layer of a semiconductor package according to an embodiment.

FIG. 27 is a cross-sectional view illustrating an electrical connection path in a semiconductor package SPf according to an embodiment, FIG. 28 is a plane view illustrating an electrical connection path between a semiconductor chip and a lower redistribution layer LRLf of a semiconductor package according to an embodiment, and FIG. 29 is a plane view illustrating an electrical connection path between an upper redistribution layer URLf and the lower redistribution layer LRLf of a semiconductor package according to an embodiment.

Referring to FIG. 27, the semiconductor package SPf may include a lower redistribution layer LRLf, an expanded layer FLf on the lower redistribution layer LRLf, a semiconductor chip in the expanded layer FLf, and an upper redistribution layer URLf on the expanded layer FLf and the semiconductor chip. The semiconductor chip may include an odd semiconductor chip 100-S1 and an even semiconductor chip 100-S2. The expanded layer FLf may surround the odd semiconductor chip 100-S1 and the even semiconductor chip 100-S2.

The lower redistribution layer LRLf may include a first lower ball pad group, a second lower ball pad group, a third lower ball pad group, and a fourth lower ball pad group, and the upper redistribution layer URLf may include a first upper ball pad group, a second upper ball pad group, a third upper ball pad group, and a fourth upper ball pad group. The first lower ball pad group, the second lower ball pad group, the third lower ball pad group, and the fourth lower ball pad group may respectively include a first odd lower ball pad group BPG-L1-S1 and a first even lower ball pad group BPG-L1-S2, a second odd lower ball pad group BPG-L2-S1 and a second even lower ball pad group BPG-L2-S2, a third odd lower ball pad group BPG-L3-S1 and a third even lower ball pad group BPG-L3-S2, and a fourth odd lower ball pad group BPG-L4-S1 and a fourth even lower ball pad group BPG-L4-S2. The first upper ball pad group, the second upper ball pad group, the third upper ball pad group, and the fourth upper ball pad group may respectively include a first odd upper ball pad group BPG-U1-S1 and a first even upper ball pad group BPG-U1-S2, a second odd upper ball pad group BPG-U2-S1 and a second even upper ball pad group BPG-U2-S2, a third odd upper ball pad group BPG-U3-S1 and a third even upper ball pad group BPG-U3-S2, and a fourth odd upper ball pad group BPG-U4-S1 and a fourth even upper ball pad group BPG-U4-S2.

The first upper ball pad group and the second lower ball pad group may be electrically connected through a first upper portion-lower portion electrical connection path PUL1f, the second upper ball pad group and the third lower ball pad group may be electrically connected through a second upper portion-lower portion electrical connection path PUL2f, and the third upper ball pad group and the fourth lower ball pad group may be electrically connected through a third upper portion-lower portion electrical connection path PUL3f. The first upper portion-lower portion electrical connection path PUL1f may include a first odd upper portion-lower portion electrical connection path PUL1f-S1 and a first even upper portion-lower portion electrical connection path PUL1f-S2, the second upper portion-lower portion electrical connection path PUL2f may include a second odd upper portion-lower portion electrical connection path PUL2f-S1 and a second even upper portion-lower portion electrical connection path PUL2f-S2, and the third upper portion-lower portion electrical connection path PUL3f may include a third odd upper portion-lower portion electrical connection path PUL3f-S1 and a third even upper portion-lower portion electrical connection path PUL3f-S2.

The fourth upper ball pad group including the fourth odd upper ball pad group BPG-U4-S1 and the fourth even upper ball pad group BPG-U4-S2 may be formed by dummy ball pads that are not electrically connected to the odd semiconductor chip 100-S1, the even semiconductor chip 100-S2, and the lower redistribution layer LRLf.

The first odd upper portion-lower portion electrical connection path PUL1f-S1, the first even upper portion-lower portion electrical connection path PUL1f-S2, the second odd upper portion-lower portion electrical connection path PUL2f-S1, the second even upper portion-lower portion electrical connection path PUL2f-S2, the third odd upper portion-lower portion electrical connection path PUL3f-S1, and the third even upper portion-lower portion electrical connection path PUL3f-S2 may be a step-type electrical connection path.

Referring to FIGS. 27 and 28, the odd semiconductor chip 100-S1 included in the semiconductor package SPf may include a first odd sub-semiconductor chip 100a-S1 and a second odd sub-semiconductor chip 100b-S1, and the even semiconductor chip 100-S2 may include a first even sub-semiconductor chip 100a-S2 and a second even sub-semiconductor chip 100b-S2.

The semiconductor chip and the first lower ball pad group may be electrically connected through a chip-lower portion electrical connection path PCLf. The chip-lower portion electrical connection path PCLf may include an odd chip-lower portion electrical connection path PCLf-S1 electrically connecting the odd semiconductor chip 100-S1 to the first odd lower ball pad group BPG-L1-S1, and an even chip-lower portion electrical connection path PCLf-S2 electrically connecting the even semiconductor chip 100-S2 to the first even lower ball pad group BPG-L1-S2.

Referring to FIGS. 28 and 29, the first lower ball pad group, the second lower ball pad group, the third lower ball pad group, and the fourth lower ball pad group may respectively include a first odd lower ball pad group BPG-L1-S1 and a first even lower ball pad group BPG-L1-S2, a second odd lower ball pad group BPG-L2-S1 and a second even lower ball pad group BPG-L2-S2, a third odd lower ball pad group BPG-L3-S1 and a third even lower ball pad group BPG-L3-S2, and a fourth odd lower ball pad group BPG-L4-S1 and a fourth even lower ball pad group BPG-L4-S2. The first upper ball pad group, the second upper ball pad group, the third upper ball pad group, and the fourth upper ball pad group may respectively include a first odd upper ball pad group BPG-U1-S1 and a first even upper ball pad group BPG-U1-S2, a second odd upper ball pad group BPG-U2-S1 and a second even upper ball pad group BPG-U2-S2, a third odd upper ball pad group BPG-U3-S1 and a third even upper ball pad group BPG-U3-S2, and a fourth odd upper ball pad group BPG-U4-S1 and a fourth even upper ball pad group BPG-U4-S2.

The first odd upper ball pad group BPG-U1-S1 and the first even upper ball pad group BPG-U1-S2 may be respectively electrically connected to the second odd lower ball pad group BPG-L2-S1 and the second even lower ball pad group BPG-L2-S2 through the first odd upper portion-lower portion electrical connection path PUL1f-S1 and the first even upper portion-lower portion electrical connection path PUL1f-S2, the second odd upper ball pad group BPG-U2-S1 and the second even upper ball pad group BPG-U2-S2 may be respectively electrically connected to the third odd lower ball pad group BPG-L3-S1 and the third even lower ball pad group BPG-L3-S2 through the second odd upper portion-lower portion electrical connection path PUL2f-S1 and the second even upper portion-lower portion electrical connection path PUL2f-S2, and the third odd upper ball pad group BPG-U3-S1 and the third even upper ball pad group BPG-U3-S2 may be respectively electrically connected to the fourth odd lower ball pad group BPG-L4-S1 and the fourth even lower ball pad group BPG-L4-S2 through the third odd upper portion-lower portion electrical connection path PUL3f-S1 and the third even upper portion-lower portion electrical connection path PUL3f-S2.

The fourth odd upper ball pad group BPG-U4-S1 and the fourth even upper ball pad group BPG-U4-S2 may be formed by dummy ball pads that are not electrically connected to the odd semiconductor chip 100-S1, the even semiconductor chip 100-S2, and the lower redistribution layer LRLf.

Figure 30:
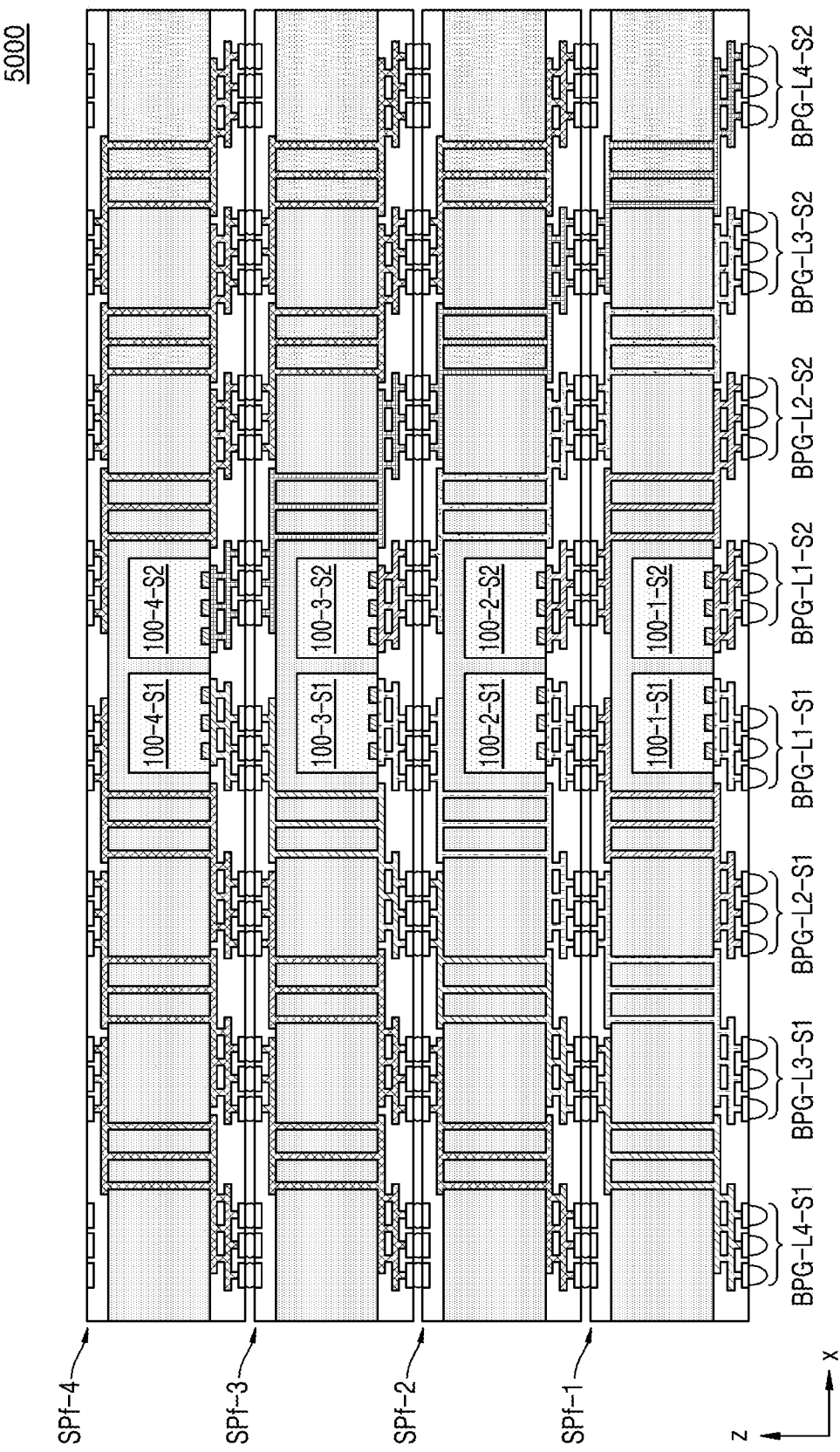
FIG. 30 is a cross-sectional view illustrating a method of manufacturing a stacked package module having a semiconductor package and an electrical connection path in the stacked package module, according to an embodiment.

FIG. 30 is a cross-sectional view illustrating a method of manufacturing a stacked package module 5000 having a semiconductor package and an electrical connection path in the stacked package module 5000, according to an embodiment.

Referring to FIGS. 27 to 30, the stacked package module 5000 is formed by sequentially stacking a second semiconductor package SPf-2, a third semiconductor package SPf-3, and a fourth semiconductor package SPf-4 on a first semiconductor package SPf-1. Each of the first semiconductor package SPf-1, the second semiconductor package SPf-2, the third semiconductor package SPf-3, and the fourth semiconductor package SPf-4 may be the semiconductor package SPf shown in FIG. 27. In some embodiments the second semiconductor package SPf-2 may be stacked on the first semiconductor package SPf-1 by being rotated 180 degrees in a horizontal direction based of the first semiconductor package SPf-1. In some other embodiments, the second semiconductor package SPf-2 may be stacked on the first semiconductor package SPf-1 without being rotated in a horizontal direction based on the first semiconductor package SPf-1.

The lower ball pads LBP of each of a first odd lower ball pad group BPG-L1-S1 and a first even lower ball pad group BPG-L1-S2 of the first semiconductor package SPf-1 may function as an I/O terminal of each of a first odd semiconductor chip 100-1-S1 and a first even semiconductor chip 100-1-S2 included in the first semiconductor package SPf-1. The lower ball pads LBP of each of a second odd lower ball pad group BPG-L2-S1 and a second even lower ball pad group BPG-L2-S2 of the first semiconductor package SPf-1 may function as n I/O terminal of each of a second odd semiconductor chip 100-2-S1 and a second even semiconductor chip 100-2-S2 of the second semiconductor package SPb-2. The lower ball pads LBP pf each of a third odd lower ball pad group BPG-L3-S1 and a third even lower ball pad group BPG-L3-S2 of the first semiconductor package SPf-1 may function as an I/O terminal of each of a third odd semiconductor chip 100-3-S1 and a third even semiconductor chip 100-3-S2 of the third semiconductor package SPf-3. The lower ball pads LBP of each of a fourth odd lower ball pad group BPG-L4-S1 and a fourth even lower ball pad group BPG-L4-S2 of the first semiconductor package SPf-1 may function as an I/O terminal of each of a fourth odd semiconductor chip 100-4-S1 and a fourth even semiconductor chip 100-4-S2 of the fourth semiconductor package SPf-4.

Although not illustrated in drawings, as the semiconductor package SP, and the lower redistribution layer LRL, the expanded layer FL, and the upper redistribution layer URL of the stacked package module 1000 including the semiconductor package SP described with reference to FIGS. 1 to 5 may be formed similar to the lower redistribution layers 200 and 200a, the expanded layers 150 and 160, and the upper redistribution layers 300 and 300a described with reference to FIGS. 4A to 4D, the semiconductor packages SPa, SPb, SPc, SPd, SPe, and SPf, and the lower redistribution layers LRLa, LRLb, LRLc, LRLd, LRLe, and LRLf, the expanded layers FLa, FLb, FLc, FLd, FLe, and FLf, and the upper redistribution layers URLa, URLb, URLc, URLd, URLe, and URLf of the stacked package modules 1000a, 2000, 2000a, 3000, 3000a, 4000, 5000 including the semiconductor packages SPa, SPb, SPc, SPd, SPe, and SPf may also be formed similar to the lower redistribution layers 200 and 200a, the expanded layers 150 and 160, and the upper redistribution layers 300 and 300a described with reference to FIGS. 4A to 4D.

FIG. 31 is a plane layout diagram illustrating a system 10000 having a stacked package module according to an embodiment.

Referring to FIG. 31, the system 10000 may include a main semiconductor chip 10 attached on a system board 50 and at least one stacked package module 20. The main semiconductor chip 10 may include, for example, a central processing unit (CPU) chip, a graphic processing unit (GPU) chip, or an application processor (AP) chip. The at least one semiconductor package module 20 may be at least one of the stacked package modules 1000, 1000a, 2000, 2000a, 3000, and 3000a described with reference to FIGS. 1 to 30. The system board 50 may be, for example, a printed circuit board (PCB).

The main semiconductor chip 10 may have a plurality of physical layers (PHY) 12. The main semiconductor chip 10 may have a plurality of PHY 12 corresponding to each of a plurality of semiconductor packages 22 included in the at least one stacked packaged module 20. Each of the plurality of semiconductor packages 22 may be one of the semiconductor packages SP, SPa, SPb, SPc, SPd, SPe, and SPf described with reference to FIGS. 1 to 30. Each of the plurality of PHY 12 of the main semiconductor chip 10 and each of the plurality of semiconductor packages 22 included in the at least one stacked package module 20 may perform input and output (I/O) through an independent communication path 30.

Accordingly, in the system 10000, the main semiconductor chip 10 may have a bandwidth increased in proportional to the number of the plurality of semiconductor packages 22 included in the at least one stacked package module 20.

Although a stacked package module according to inventive concepts is shown to include two, four, or eight semiconductor packages with reference to FIGS. 1 to 31, inventive concept are not limited thereto. For example, it is also apparent to one of ordinary skill in the art that a stacked package module is formed to include three, five, six, seven, nine or more semiconductor packages, wherein in the semiconductor packages, one of a plurality of upper ball pad groups of an upper redistribution layer includes dummy ball pads, one of a plurality of lower ball pad groups of a lower redistribution layer is electrically connected to a semiconductor chip, and the remaining upper ball pad groups among the plurality of upper ball pad groups are electrically connected to the remaining lower ball pad groups among the plurality of lower ball pad groups.

While embodiments of inventive concepts have been particularly shown and described with reference to embodiments thereof, it will be understood that various changes in form and details may be made therein without departing from the spirit and scope of the following claims.

What is claimed is:

1. A semiconductor package comprising:
    a lower redistribution layer including a plurality of lower ball pads forming N lower ball pad groups, N being an integer greater than or equal to two, the plurality of lower ball pads including first lower ball pads forming a first lower ball pad group of the N lower ball pad groups and second lower ball pads forming the remaining lower ball pad groups;
    a semiconductor chip on the lower redistribution layer;
    an expanded layer surrounding the semiconductor chip on the lower redistribution layer;
    an upper redistribution layer on the semiconductor chip and the expanded layer, the upper redistribution layer including a plurality of upper ball pads forming M upper ball pad groups, M being an integer equal to N, the plurality of upper ball pads including first upper ball pads forming a first upper ball pad group of the M upper ball pad groups and second upper ball pads forming the remaining upper ball pad groups,
    chip-lower portion electrical connection paths electrically connecting the first lower ball pads to the semiconductor chip; and
    upper portion-lower portion electrical connection paths electrically connecting the second lower ball pads and second upper ball pads,
    wherein each of the first upper ball pads is a dummy ball pad, and
    wherein the upper portion-lower portion electrical connection paths are disposed asymmetrically with respect to a horizontal direction about the semiconductor chip as a center.

2. The semiconductor package of claim 1, wherein each of the upper portion-lower portion electrical connection paths is a vertical electrical connection path for electrically connecting a corresponding second upper ball pads to a corresponding second lower ball pads that overlap each other in a vertical direction.

3. The semiconductor package of claim 1, wherein each of the upper portion-lower portion electrical connection paths is a step-type electrical connection path for electrically connecting a corresponding second upper ball pads to a corresponding second lower ball pads that do not overlap each other in a vertical direction.

4. The semiconductor package of claim 3, wherein the first upper ball pads and the second lower ball pads overlap each other in a vertical direction, and
wherein the second upper ball pads and the first lower ball pads overlap each other in the vertical direction.

5. The semiconductor package of claim 1, wherein the upper portion-lower portion electrical connection paths are all arranged on one side in the horizontal direction with the semiconductor chip as the center.

6. The semiconductor package of claim 1, wherein the upper portion-lower portion electrical connection paths include first paths arranged on one side and second paths arranged on an other side in the horizontal direction with respect to the semiconductor chip, and
wherein a number of the first paths is greater than a number of the second paths.

7. The semiconductor package of claim 1, wherein
the N lower ball pad groups comprise the first lower ball pad group, a second lower ball pad group, a third lower ball pad group, and a fourth lower ball pad group,
the M upper ball pad groups comprise the first upper ball pad group, a second upper ball pad group, a third upper ball pad group, and a fourth upper ball pad group respectively overlapping the fourth lower ball pad group, the second lower ball pad group, the third lower ball pad group, and the first lower ball pad group in a vertical direction, and
the upper portion-lower portion electrical connection paths comprises first upper portion-lower portion electrical connection paths electrically connecting a corresponding second lower ball pads of the second lower ball pad group to a corresponding second upper ball pads of the second upper ball pad group, second upper portion-lower portion electrical connection paths electrically connecting a corresponding second lower ball pads of the third lower ball pad group to a corresponding second upper ball pads of the third upper ball pad group, and third upper portion-lower portion electrical connection path electrically connecting a corresponding second lower ball pads of the fourth lower ball pad group to a corresponding second upper ball pads of the fourth upper ball pad group.

8. The semiconductor package of claim 1, wherein
the N lower ball pad groups comprise the first lower ball pad group, a second lower ball pad group, a third lower ball pad group, and a fourth lower ball pad group,
the M upper ball pad groups comprise the first upper ball pad group, a second upper ball pad group, a third upper ball pad group, and a fourth upper ball pad group respectively overlapping the second lower ball pad group, the third lower ball pad group, the fourth lower ball pad group, and the first lower ball pad group in a vertical direction, and
the upper portion-lower portion electrical connection paths comprises first upper portion-lower portion electrical connection paths electrically connecting a corresponding second lower ball pads of the second lower ball pad group to a corresponding second upper ball pads of the second upper ball pad group, second upper portion-lower portion electrical connection paths electrically connecting a corresponding second lower ball pads of the third lower ball pad group to a corresponding second upper ball pads of the third upper ball pad group, and third upper portion-lower portion electrical connection path electrically connecting a corresponding second lower ball pads of the fourth lower ball pad group to a corresponding second upper ball pads of the fourth upper ball pad group.

9. The semiconductor package of claim 1, wherein
the N lower ball pad groups comprise the first lower ball pad group, a second lower ball pad group, a third lower ball pad group, a fourth lower ball pad group, a fifth lower ball pad group, a sixth lower ball pad group, a seventh lower ball pad group, and an eighth lower ball pad group,
the M upper ball pad groups comprise the first upper ball pad group, a second upper ball pad group, a third upper ball pad group, a fourth upper ball pad group, a fifth upper ball pad group, a sixth upper ball pad group, a seventh upper ball pad group, and an eighth upper ball pad group respectively overlapping the eighth lower ball pad group, the second lower ball pad group, the third lower ball pad group, the fourth lower ball pad group, the fifth lower ball pad group, the first lower ball pad group, the sixth lower ball pad group, and the seventh lower ball pad group in a vertical direction, and
the upper portion-lower portion electrical connection paths comprises,
first upper portion-lower portion electrical connection paths electrically connecting a corresponding second lower ball pads of the second lower ball pad group to a corresponding second upper ball pads the second upper ball pad group,
second upper portion-lower portion electrical connection path electrically connecting a corresponding second lower ball pads of the third lower ball pad group to a corresponding second upper ball pads the third upper ball pad group,
third upper portion-lower portion electrical connection path electrically connecting a corresponding second lower ball pads of the fourth lower ball pad group to a corresponding second upper ball pads the fourth upper ball pad group,
fourth upper portion-lower portion electrical connection path electrically connecting a corresponding second lower ball pads of the fifth lower ball pad group to a corresponding second upper ball pads the fifth upper ball pad group,
fifth upper portion-lower portion electrical connection path electrically connecting a corresponding second lower ball pads of the sixth lower ball pad group to a corresponding second upper ball pads the sixth upper ball pad group,
sixth upper portion-lower portion electrical connection path electrically connecting a corresponding second lower ball pads of the seventh lower ball pad group to a corresponding second upper ball pads the seventh upper ball pad group, and
seventh upper portion-lower portion electrical connection path electrically connecting a corresponding second lower ball pads of the eighth lower ball pad group to a corresponding second upper ball pads the eighth upper ball pad group.

10. The semiconductor package of claim 1, wherein each of upper portion-lower portion electrical connection paths includes a through mold via, a conductive solder, a conductive pillar, or at least one conductive bump.

11. A semiconductor package comprising:
a lower redistribution layer including a plurality of lower ball pads forming N lower ball pad groups, N being an integer greater than or equal to two, the plurality of lower ball pads including first lower ball pads forming a first lower ball pad group of the N lower ball pad groups and second lower ball pads forming the remaining lower ball pad groups;
a semiconductor chip on the lower redistribution layer;
an expanded layer surrounding the semiconductor chip on the lower redistribution layer;
an upper redistribution layer on the semiconductor chip and the expanded layer, the upper redistribution layer including a plurality of upper ball pads forming M upper ball pad groups, M being an integer equal to N, the plurality of upper ball pads including first upper ball pads forming a first upper ball pad group of the M upper ball pad groups and second upper ball pads forming the remaining upper ball pad groups,
chip-lower portion electrical connection paths electrically connecting the first lower ball pads to the semiconductor chip; and
upper portion-lower portion electrical connection paths electrically connecting the second lower ball pads and second upper ball pads,
wherein each of the first upper ball pads is a dummy ball pad,
wherein the upper portion-lower portion electrical connection paths are disposed asymmetrically with respect to a horizontal direction about the semiconductor chip as a center, and
wherein the expanded layer is a printed circuit board, and each of upper portion-lower portion electrical connection paths includes at least one connection line pattern and at least one connection conductive vias.

12. The semiconductor package of claim 1, wherein the lower redistribution layer includes a plurality of lower redistribution insulating layers and a lower redistribution conductive structure,
wherein the semiconductor chip includes a semiconductor substrate and a plurality of chip connection pads on an active surface of the semiconductor substrate, and
wherein the lower redistribution conductive structure are electrically connected to the plurality of chip connection pads through a plurality of chip connection terminals.

13. The semiconductor package of claim 1, wherein the lower redistribution layer includes a plurality of lower redistribution insulating layers and a lower redistribution conductive structure,
wherein the semiconductor chip includes a semiconductor substrate and a plurality of chip connection pads on an active surface of the semiconductor substrate, and
wherein the lower redistribution conductive structure directly contacts the plurality of chip connection pads.

14. A semiconductor package comprising:
a lower redistribution layer including a plurality of lower ball pads forming N lower ball pad groups, N being an integer greater than or equal to four, the N lower ball pad groups including a first odd lower ball pad group, a first even lower ball pad group, a second odd lower ball pad group and a second even lower ball pad group;
a semiconductor chip including an odd semiconductor chip and an even semiconductor chip on the lower redistribution layer;
an expanded layer surrounding the odd semiconductor chip and the even semiconductor chip on the lower redistribution layer;
an upper redistribution layer on the semiconductor chip and the expanded layer, the upper redistribution layer including a plurality of upper ball pads forming M upper ball pad groups, M being an integer equal to N, the M upper ball pad groups including a first odd upper ball pad group, a first even upper ball pad group, a second odd upper ball pad group and a second even upper ball pad group;
chip-lower portion electrical connection paths including an odd chip-lower portion electrical connection path electrically connecting the first odd lower ball pad group to the odd semiconductor chip and an even chip-lower portion electrical connection path electrically connecting the first even lower ball pad group to the even semiconductor chip; and
upper portion-lower portion electrical connection paths including an odd upper portion-lower portion electrical connection path connecting the second odd lower ball pad group to the first odd upper ball pad group and an even upper portion-lower portion electrical connection path connecting the second even lower ball pad group to the first even upper ball pad group,
wherein each of upper ball pads forming the second odd upper ball pad group and the second even upper ball pad group is a dummy ball pad.

15. The semiconductor package of claim 14, wherein each of the odd upper portion-lower portion electrical connection path and the even upper portion-lower portion electrical connection path is a step-type electrical connection path.

16. The semiconductor package of claim 14, wherein a corresponding lower ball pads of the second odd lower ball pad group and a corresponding upper ball pads of the first odd upper ball pad group do not overlap each other in a vertical direction, and
wherein a corresponding lower ball pads of the second even lower ball pad group and a corresponding upper ball pads of the first even upper ball pad group do not overlap each other in the vertical direction.

17. The semiconductor package of claim 14, wherein a corresponding lower ball pads of the first odd lower ball pad group and a corresponding upper ball pads of the first odd upper ball pad group overlap each other in a vertical direction, and
wherein a corresponding lower ball pads of the first even lower ball pad group and a corresponding upper ball pads of the first even upper ball pad group overlap each other in a vertical direction.

18. The semiconductor package of claim 14, wherein a corresponding lower ball pads of the second odd lower ball pad group and a corresponding upper ball pads of the second odd upper ball pad group overlap each other in a vertical direction, and
wherein a corresponding lower ball pads of the second even lower ball pad group and a corresponding upper ball pads of the second even upper ball pad group overlap each other in a vertical direction.

19. The semiconductor package of claim 14, wherein the upper portion-lower portion electrical connection paths are disposed symmetrically with respect to a horizontal direction about the semiconductor chip as a center.

20. The semiconductor package of claim 14, wherein the upper portion-lower portion electrical connection paths include first paths arranged on one side and second paths arranged on an other side in a horizontal direction with respect to the semiconductor chip, and
wherein a number of the first paths and a number of the second paths are the same.

* * * * *